United States Patent

Ogawa et al.

(10) Patent No.: US 12,164,228 B2
(45) Date of Patent: *Dec. 10, 2024

(54) ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND RESIN

(71) Applicant: FUJIFILM Corporation, Tokyo (JP)

(72) Inventors: Michihiro Ogawa, Shizuoka (JP); Takashi Kawashima, Shizuoka (JP); Akihiro Kaneko, Shizuoka (JP); Akiyoshi Goto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1030 days.

This patent is subject to a terminal disclaimer.

(21) Appl. No.: 17/003,500

(22) Filed: Aug. 26, 2020

(65) Prior Publication Data

US 2020/0393762 A1 Dec. 17, 2020

Related U.S. Application Data

(63) Continuation of application No. PCT/JP2019/006121, filed on Feb. 19, 2019.

(30) Foreign Application Priority Data

Feb. 28, 2018 (JP) ................ 2018-035896

(51) Int. Cl.
| | |
|---|---|
| G03F 7/039 | (2006.01) |
| C08F 212/14 | (2006.01) |
| C08F 220/18 | (2006.01) |
| C08F 220/24 | (2006.01) |
| C08F 226/06 | (2006.01) |
| G03F 7/004 | (2006.01) |
| G03F 7/038 | (2006.01) |

(52) U.S. Cl.
CPC ............ *G03F 7/039* (2013.01); *C08F 212/24* (2020.02); *C08F 220/1806* (2020.02); *C08F 220/24* (2013.01); *C08F 226/06* (2013.01); *G03F 7/0045* (2013.01); *G03F 7/038* (2013.01)

(58) Field of Classification Search
None
See application file for complete search history.

(56) References Cited

U.S. PATENT DOCUMENTS

| | | | |
|---|---|---|---|
| 3,637,603 A | 1/1972 | Hoyt et al. | |
| 3,706,716 A | 12/1972 | Hoyt et al. | |
| 5,059,513 A * | 10/1991 | Hopf | G03F 7/0233 |
| | | | 430/326 |
| 5,981,142 A * | 11/1999 | Jung | G03F 7/0045 |
| | | | 430/910 |
| 2013/0216951 A1 | 8/2013 | Ikeda et al. | |
| 2015/0004545 A1* | 1/2015 | Namai | G03F 7/027 |
| | | | 549/399 |
| 2016/0011517 A1 | 1/2016 | Takizawa et al. | |
| 2018/0107118 A1 | 4/2018 | Goto et al. | |
| 2021/0011380 A1* | 1/2021 | Nihashi | G03F 7/325 |
| 2021/0072642 A1* | 3/2021 | Asakawa | C08F 26/06 |
| 2021/0286264 A1* | 9/2021 | Kaneko | G03F 7/0392 |
| 2022/0179307 A1* | 6/2022 | Takada | G03F 7/11 |
| 2022/0334476 A1* | 10/2022 | Kojima | G03F 7/0397 |
| 2023/0004086 A1* | 1/2023 | Yoshimura | C08F 220/1812 |
| 2023/0133710 A1* | 5/2023 | Ushiyama | G03F 7/0397 |
| | | | 430/270.1 |

(Continued)

FOREIGN PATENT DOCUMENTS

| | | |
|---|---|---|
| CN | 103102440 A | 5/2013 |
| CN | 103140551 A | 6/2013 |

(Continued)

OTHER PUBLICATIONS

Ueda et al., "Polymerization of -Methylene-N-methylpyrrolidone", J. Polym. Sci., Polyn. Phys., vol. 20 pp. 1139-1149 (1983).*

(Continued)

*Primary Examiner* — Martin J Angebranndt

(74) *Attorney, Agent, or Firm* — Sughrue Mion, PLLC

(57) ABSTRACT

An object of the present invention is to provide an actinic ray-sensitive or radiation-sensitive resin composition with which a pattern thus formed has excellent LER and collapse suppressing ability. The actinic ray-sensitive or radiation-sensitive resin composition of the present invention includes a compound that generates an acid upon irradiation with actinic rays or radiation, and a resin whose polarity increases by the action of an acid, in which the resin includes a repeating unit represented by General Formula (B-1), and a content of the repeating unit represented by General Formula (B-1) is 5% to 70% by mass with respect to all the repeating units in the resin. In General Formula (B-1), Ri represents a hydrogen atom or an organic group, the Ring W1 represents a ring which includes at least one carbon atom and one nitrogen atom, and may have a substituent

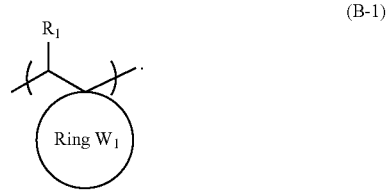

(B-1)

12 Claims, No Drawings

(56) References Cited

U.S. PATENT DOCUMENTS

| | | | | |
|---|---|---|---|---|
| 2023/0139009 A1* | 5/2023 | Yoshimura | ........ | C08F 220/1809 430/270.1 |
| 2023/0139891 A1* | 5/2023 | Kojima | ................ | C07C 309/07 430/270.1 |
| 2023/0221640 A1* | 7/2023 | Yoshimura | ............ | C08F 220/36 430/270.1 |
| 2023/0236502 A1* | 7/2023 | Kojima | ................ | C08F 220/54 430/270.1 |
| 2023/0236506 A2* | 7/2023 | Nishikori | .............. | G03F 7/0392 430/270.1 |

FOREIGN PATENT DOCUMENTS

| | | | | |
|---|---|---|---|---|
| CN | 105103051 A | | 11/2015 | |
| EP | 3 614 206 A1 | | 2/2020 | |
| JP | 2007051196 A | * | 3/2007 | |
| JP | 2007-093909 A | | 4/2007 | |
| JP | 2013025149 A | * | 2/2013 | |
| JP | 2015-180950 A | | 10/2015 | |
| KR | 10-2013-0115233 A | | 10/2013 | |
| TW | 201405249 A | | 2/2014 | |
| WO | 2015/129355 A1 | | 9/2010 | |
| WO | 2012043685 A1 | | 4/2012 | |
| WO | WO-2014017144 A1 | * | 1/2014 | ........... G03F 7/0397 |
| WO | WO-2014171144 A1 | * | 10/2014 | ............. G10L 15/08 |
| WO | 2016181722 A1 | | 11/2016 | |
| WO | WO-2018193954 A1 | * | 10/2018 | ............. B65H 3/122 |
| WO | WO-2019187803 A1 | * | 10/2019 | |

OTHER PUBLICATIONS

Office Action issued Feb. 6, 2023 in Chinese Application No. 201980015829.X.

Yuanxian Wang et al., "Poly($\alpha$-Methyleneglutarimide)s from Radical Polymerization of $\alpha$-Methyleneglutarimides", Journal of Polymer Science, Part A: Polymer Chemistry, 2018, pp. 1-7 (7 pages total).

Martin J. Wanner et al., "New Phosphonium Ylides by Functionalization of Triphenylphosphoranylideneacetamide", Tetrahedron Letters, 1992, vol. 33, No. 11, pp. 1513-1516 (4 pages total).

J. M. G. Cowie et al., "Effect of Side Chain Length on the Glass Transition of Copolymers from Styrene with N-Alkyl Citraconimides and with W-Alkyl Itaconimides", British Polymer Journal, 1990, vol. 23, pp. 353-357 (5 pages total).

Office Action issued Oct. 19, 2021 in Japanese Application No. 2020-503420.

Office Action dated May 10, 2022 issued by the Korean Patent Office in Korean Application No. 10-2020-7024729.

International Search Report dated Apr. 23, 2019 from the International Searching Authority in International Application No. PCT/JP2019/006121.

Written Opinion dated Apr. 23, 2019 from the International Bureau in International Application No. PCT/JP2019/006121.

International Preliminary Report on Patentability dated Sep. 1, 2020 from the International Bureau in International Application No. PCT/JP2019/006121.

Office action dated Apr. 25, 2023 issued in Taiwanese Application No. 108106539.

Communication dated Oct. 31, 2022, issued in Taiwanese Application No. 108106539.

Extended European Search Report issued Mar. 9, 2021 in European Application No. 19760681.7.

Office Action issued Jun. 28, 2024 in European Application No. 19 760 681.7.

Office Action issued Jul. 26, 2024 in Taiwanese Application No. 108106539.

* cited by examiner

ACTINIC RAY-SENSITIVE OR RADIATION-SENSITIVE RESIN COMPOSITION, RESIST FILM, PATTERN FORMING METHOD, METHOD FOR MANUFACTURING ELECTRONIC DEVICE, AND RESIN

CROSS-REFERENCE TO RELATED APPLICATIONS

This application is a Continuation of PCT International Application No. PCT/JP2019/006121 filed on Feb. 19, 2019, which claims priority under 35 U.S.C. § 119(a) to Japanese Patent Application No. 2018-035896 filed on Feb. 28, 2018. The above application is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, a method for manufacturing an electronic device, and a resin.

2. Description of the Related Art

In processes for manufacturing semiconductor devices such as an integrated circuit (IC) and a large scale integrated circuit (LSI) in the related art, microfabrication by lithography using a photoresist composition (hereinafter also referred to as an "actinic ray-sensitive or radiation-sensitive resin composition") has been performed. In recent years, formation of an ultrafine pattern in a submicron region or a quarter-micron region has been demanded in accordance with realization of a high degree of integration for integrated circuits. With such a demand, a tendency that an exposure wavelength has been shifted from g-rays to i-rays, and further, as with KrF excimer laser light, the exposure wavelength becomes shorter is observed. Moreover, developments in lithography with electron beams, X-rays, or extreme ultraviolet (EUV) rays, in addition to the excimer laser light, have also been currently proceeding.

As an actinic ray-sensitive or radiation-sensitive resin composition, for example, a photoresist composition for forming a negative tone pattern, which is applicable to ArF exposure or the like and uses a developer containing an organic solvent, is disclosed in WO2014/017144A. In addition, a resin whose a polarity increases by an acid, the resin including a repeating unit derived from a monomer including an exomethylene group (specifically a repeating unit derived from itaconic anhydride), is specifically disclosed in the section of Examples of WO2014/017144A.

SUMMARY OF THE INVENTION

With reference to the related art, the present inventors have prepared an actinic ray-sensitive or radiation-sensitive resin composition which includes a repeating unit having a cyclic structure including a nitrogen atom and also includes a resin whose polarity increases by an acid, and have examined the composition, and they have thus found that a pattern thus formed may have deteriorated line edge roughness (LER) and collapse suppressing ability in some cases. That is, the present inventors have revealed that it was necessary to further improve the line edge roughness (LER) and the collapse suppressing ability of the pattern thus formed.

Therefore, an object of the present invention is to provide an actinic ray-sensitive or radiation-sensitive resin composition with which a pattern thus formed has excellent LER and collapse suppressing ability.

Furthermore, another object of the present invention is to provide a resist film, a pattern forming method, a method for manufacturing an electronic device, each using the actinic ray-sensitive or radiation-sensitive resin composition.

In addition, still another object of the present invention is to provide a resin which can be used in the actinic ray-sensitive or radiation-sensitive resin composition.

The present inventors have conducted intensive studies to accomplish the objects, and as a result, they have found that the problems can be solved by incorporating a resin having a specific structure, whose polarity increases by the action of an acid, into an actinic ray-sensitive or radiation-sensitive resin composition, thereby completing the present invention.

That is, the present inventors have found that the objects can be accomplished by the following constitution.

[1] An actinic ray-sensitive or radiation-sensitive resin composition comprising:
a compound that generates an acid upon irradiation with actinic rays or radiation; and
a resin whose polarity increases by the action of an acid,
in which the resin includes a repeating unit represented by General Formula (B-1) which will be described later, and
a content of the repeating unit represented by General Formula (B-1) is 5% to 70% by mass with respect to all the repeating units in the resin.

[2] The actinic ray-sensitive or radiation-sensitive resin composition as described in [1],
in which the resin does not substantially include a repeating unit including a lactone structure but includes a repeating unit having an acid-decomposable group and the repeating unit represented by General Formula (B-1), and
the content of the repeating unit represented by General Formula (B-1) is 30% by mass or less with respect to all the repeating units in the resin.

[3] The actinic ray-sensitive or radiation-sensitive resin composition as described in [1] or [2],
in which the repeating unit represented by General Formula (B-1) is a repeating unit represented by General Formula (B-2) which will be described later.

[4] The actinic ray-sensitive or radiation-sensitive resin composition as described in any one of [1] to [3],
in which the resin includes a fluorine atom or an iodine atom.

[5] The actinic ray-sensitive or radiation-sensitive resin composition as described in any one of [1] to [4],
in which the resin has a weight-average molecular weight of 3,500 to 25,000.

[6] A resist film formed from the actinic ray-sensitive or radiation-sensitive resin composition as described in any one of [1] to [5].

[7] A pattern forming method comprising:
a resist film forming step of forming a resist film using the actinic ray-sensitive or radiation-sensitive resin composition as described in any one of [1] to [5];
an exposing step of exposing the resist film; and
a developing step of developing the exposed resist film using a developer.

[8] A method for manufacturing an electronic device, comprising the pattern forming method as described in [7].

[9] A resin whose polarity increases by the action of an acid,
in which the resin includes a repeating unit represented by General Formula (B-1) which will be described later, and
a content of the repeating unit represented by General Formula (B-1) is 5% to 70% by mass with respect to all the repeating units in the resin.

[10] The resin as described in [9],
in which the resin does not substantially include a repeating unit including a lactone structure but includes a repeating unit having the acid-decomposable group and the repeating unit represented by General Formula (B-1), and
the content of the repeating unit represented by General Formula (B-1) is 30% by mass or less with respect to all the repeating units in the resin.

[11] The resin as described in [9] or [10],
in which the repeating unit represented by General Formula (B-1) is a repeating unit represented by General Formula (B-2) which will be described later.

[12] The resin as described in any one of [9] to [11],
in which the resin includes a fluorine atom or an iodine atom.

[13] The resin as described in any one of [9] to [12],
in which the resin has a weight-average molecular weight of 3,500 to 25,000.

According to the present invention, it is possible to provide an actinic ray-sensitive or radiation-sensitive resin composition with which a pattern thus formed has excellent LER and collapse suppressing ability.

Moreover, according to the present invention, it is possible to provide a resist film, a pattern forming method, and a method for manufacturing an electronic device, each using the actinic ray-sensitive or radiation-sensitive resin composition.

In addition, according to the present invention, it is possible to provide a resin which can be used for the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays, X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays, X-rays, EUV light, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following substituent group T, for example.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

Furthermore, in the present specification, the weight-average molecular weight (Mw), the number-average molecular weight (Mn), and the dispersity (also referred to as a molecular weight distribution) (Mw/Mn) of a resin are each defined as a value converted in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

[Actinic Ray-Sensitive or Radiation-Sensitive Resin Composition]

The actinic ray-sensitive or radiation-sensitive resin composition of an embodiment of the present invention (hereinafter also referred to as "the composition of the embodiment of the present invention") may include a resin whose polarity increases by the action of an acid, in which the resin includes a repeating unit represented by General Formula (B-1) which will be described later in an amount of 5% to 70% by mass with respect to all the repeating units in the resin.

In a case where the content of the repeating unit represented by General Formula (B-1) in the resin is 5% by mass or more with respect to all the repeating units, the resin has an excellent glass transition temperature (Tg) due to the immobilization of a molecular motion of the main chain, whereby the collapse suppressing performance of a pattern thus formed is excellent. On the other hand, in a case where the content of the repeating unit represented by General Formula (B-1) in the resin is more than 70% by mass with respect to all the repeating units, the LER of a pattern thus formed tends to be deteriorated. That is, in a case where the content of the repeating unit represented by General Formula (B-1) in the resin is 5% to 70% by mass with respect to all the repeating units, the LER and the collapse suppressing ability are excellent.

Meanwhile, since EUV light (wavelength: 13.5 nm) has a shorter wavelength than, for example, ArF excimer laser light (wavelength: 193 nm), the number of incident photons may be small in a case where the same sensitivity is used upon exposure of a resist film. As a result, in lithography with EUV light, a "photon shot noise" in which the number of photons varies probabilistically gives a significant influence, which is a major cause of the deterioration in LER.

In order to reduce the photon shot noise, it is effective to increase an exposure dose (in other words, to reduce a sensitivity) to increase the number of incident photons, but this is a trade-off with a recent demand for a higher sensitivity. Furthermore, it is also effective to increase the film thickness of the resist film to increase the number of absorbed photons, but the aspect ratio of a pattern thus formed becomes large, and thus, the collapse suppressing ability is easily deteriorated in a line/space (L/S) pattern.

Therefore, in particular, in lithography with EUV light, there is a demand for an actinic ray-sensitive or radiation-sensitive resin composition capable of forming a pattern having a high sensitivity and excellent LER and collapse suppressing ability.

Under these circumstances, the present inventors have recently confirmed that by a method of introducing a large number of elements having a high EUV light absorption efficiency, such as a fluorine atom and an iodine atom, into a resist film (a coating film of an actinic ray-sensitive or radiation-sensitive resin composition), the EUV light absorption efficiency is improved (in other words, the sensitivity is excellent) even in a case where the film thickness of the resist film is small. On the other hand, the present inventors have also confirmed that as a larger amount of the elements is included in the resin, there is a tendency that a pattern thus formed is deteriorated in a collapse suppressing ability.

In contrast, it has been confirmed that in a case where the composition of the embodiment of the present invention includes a resin whose polarity increases by the action of an acid, in which the resin includes a repeating unit represented by General Formula (B-1) which will be described later in the amount of 5% to 70% by mass with respect to all the repeating units in the resin, and includes a fluorine atom and an iodine atom, a resist film thus obtained has an excellent sensitivity, and the LER and the collapse suppressing performance of a pattern thus formed by exposure and development are excellent. That is, in a case where the composition of the embodiment of the present invention has such configuration, it can be suitably used for lithography with EUV light.

Hereinafter, the components included in the composition of the embodiment of the present invention will be described in detail. Furthermore, the composition of the embodiment of the present invention is a so-called resist composition, and may be either a positive tone resist composition or a negative tone resist composition. In addition, the composition of the embodiment of the present invention may be either a resist composition for alkali development or a resist composition for organic solvent development.

The composition of the embodiment of the present invention is typically a chemically amplified resist composition.

<Resin>

(Resin (X))

The composition of the embodiment of the present invention includes a resin which satisfies the following Condition [1] and the polarity increases by the action of an acid (hereinafter also referred to as a "resin (X)").

Condition [1]: The resin includes a repeating unit represented by General Formula (B-1) which will be described later, and a content of the repeating unit represented by General Formula (B-1) is 5% to 70% by mass with respect to all the repeating units in the resin.

Incidentally, the resin (X) is a resin whose polarity increases by the action of an acid as described above. Therefore, in the pattern forming method of an embodiment of the present invention which will be described later, typically, in a case where an alkali developer is adopted as the developer, a positive tone pattern is suitably formed, and in a case where an organic developer is adopted as the developer, a negative tone pattern is suitably formed.

In addition, the resin (X) preferably has a group whose polarity increases through decomposition by the action of an acid (hereinafter also referred to as an "acid-decomposable group"), as described later.

Furthermore, in a case where the composition of the embodiment of the present invention is applied to lithography with EUV light, it is preferable that the resin (X) further satisfies the following Condition [2].

Condition [2]: The resin includes at least one halogen atom (hereinafter also referred to as a "specific halogen atom") selected from the group consisting of a fluorine atom and an iodine atom.

In a case where the resin (X) satisfies Condition [2], a position at which a specific halogen atom is introduced in the resin (X) is not particularly limited.

A content of the specific halogen atom in the resin (X) is not particularly limited, but is preferably 2% by mass or more, more preferably 10% by mass or more, and still more preferably 20% by mass or more, with respect to the total mass of the resin (X). An upper limit thereof is not particularly limited, but is, for example, 70% by mass, and preferably 50% by mass or less.

Hereinafter, the repeating unit represented by General Formula (B-1) included in the resin (X) and other repeating units which may be optionally included will be described in detail.

<<Repeating Unit Represented by General Formula (B-1)>>

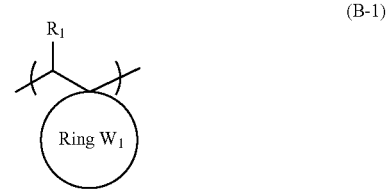

In General Formula (B-1), $R_1$ represents a hydrogen atom or an organic group.

The organic group represented by $R_1$ is not particularly limited, but examples thereof include the groups exemplified in the above-mentioned substituent group T, and the alkyl group, the aryl group, the aralkyl group, or the alkenyl group is preferable.

The alkyl group represented by $R_1$ is not particularly limited, but from the viewpoint that the LER and the collapse suppressing ability of a pattern thus formed are more excellent, an alkyl group having 1 to 8 carbon atoms (which may be in any of linear, branched, and cyclic forms) is preferable, and examples thereof include a methyl group, an ethyl group, a propyl group, an n-butyl group, a sec-butyl group, a hexyl group, and an octyl group. Among those, a linear or branched alkyl group having 1 to 4 carbon atoms is more preferable. Incidentally, the alkyl group represented by $R_1$ may have a substituent. The substituent is not particularly limited, and examples thereof include the groups exemplified in the above-mentioned substituent group T.

The aryl group represented by $R_1$ is not particularly limited, but from the viewpoint that the LER and the collapse suppressing ability of a pattern thus formed are more excellent, an aryl group having 6 to 10 carbon atoms is preferable. Examples of the aryl group include a phenyl group, a naphthyl group, and an anthryl group, and the phenyl group is preferable. Incidentally, the aryl group represented by $R_1$ may have a substituent. The substituent is not particularly limited, and examples thereof include the groups exemplified in the above-mentioned substituent group T.

The aralkyl group represented by $R_1$ is not particularly limited, but for example, the alkyl group in the aralkyl group preferably has 1 to 6 carbon atoms, and more preferably has 1 to 3 carbon atoms. Examples of the aralkyl group include a benzyl group and a phenethyl group. The aralkyl group represented by $R_1$ may have a substituent. The substituent is not particularly limited, and examples thereof include the groups exemplified in the above-mentioned substituent group T.

The alkenyl group represented by $R_1$ is not particularly limited, but from the viewpoint that the LER and the collapse suppressing ability of a pattern thus formed are more excellent, an alkenyl group having 2 to 8 carbon atoms (which may be in any of linear, branched, and cyclic forms) is preferable, and a linear or branched alkenyl group having 2 to 4 carbon atoms is more preferable. Examples of the alkenyl group include a vinyl group, an allyl group, a butenyl group, and a cyclohexenyl group. The alkenyl group represented by $R_1$ may have a substituent. The substituent is not particularly limited, and examples thereof include the groups exemplified in the above-mentioned substituent group T.

Among those, a hydrogen atom is preferable as $R_1$ from the viewpoint that the LER and the collapse suppressing ability of a pattern thus formed are more excellent.

In General Formula (B-1), the Ring W1 represents a ring which includes at least one carbon atom and one nitrogen atom, and may have a substituent.

The above-mentioned one carbon atom is a carbon atom specified in General Formula (B-1) and is intended to mean a carbon atom at the position where it is bonded to the main chain.

Furthermore, the form of the nitrogen atom included in the Ring W1 is not particularly limited, examples thereof include forms of —N= and —N($R_3$)—, and the form of —N($R_3$)— is preferable.

$R_3$ represents a hydrogen atom or an organic group. The organic group represented by $R_3$ is not particularly limited, but an alkyl group, an aralkyl group, an alkenyl group, or an aryl group, each of which may include a heteroatom, is preferable.

Examples of the heteroatom include a nitrogen atom, an oxygen atom, and a sulfur atom, and specifically include —CO—, —O—, —S—, —NH—, —SO—, —SO$_2$—, or a divalent linking group obtained by combination of two or more thereof.

From the viewpoint that the LER and the collapse suppressing ability of a pattern thus formed are more excellent, examples of the alkyl group represented by $R_3$, which may include a heteroatom, include an alkyl group having 1 to 12 carbon atoms, which may include a heteroatom (which may be in any of linear, branched, and cyclic forms), is preferable, and examples thereof include a methyl group, an ethyl group, a propyl group, an n-butyl group, a sec-butyl group, a hexyl group, an octyl group, and an alkyl group represented by General Formula (X).

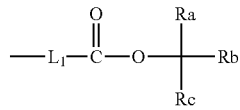

(X)

In General Formula (X), $L_1$ represents a linear or branched alkylene group having 1 to 4 carbon atoms. Ra, Rb, and Rc each independently represent an (linear or branched) alkyl group or a (monocyclic or polycyclic) cycloalkyl group. It should be noted that in a case where Ra, Rb, and Rc are (linear or branched) alkyl groups, it is preferable that at least two of Ra, Rb, or Rc are methyl groups.

Two of Ra, Rb, and Rc may be bonded to each other to form a (monocyclic or polycyclic) cycloalkyl group.

Incidentally, the number of carbon atoms in General Formula (X) is preferably 1 to 12.

The alkyl group which may include a heteroatom represented by $R_3$ may have a substituent.

The substituent is not particularly limited, and examples thereof include the groups exemplified in the above-mentioned substituent group T. More specifically, examples thereof include a halogen atom (for example, a fluorine atom, a chlorine atom, a bromine atom, and an iodine atom) and a carboxyl group. Among those, the fluorine atom or the iodine atom is preferable.

The aralkyl group which may include a heteroatom represented by $R_3$ is not particularly limited but, for example, the alkyl group in the aralkyl group preferably has 1 to 6 carbon atoms, and more preferably has 1 to 3 carbon atoms. Incidentally, the alkyl group in the aralkyl group may include a heteroatom. Examples of the aralkyl group which may include a heteroatom include a benzyl group and a phenethyl group.

The aralkyl group which may include a heteroatom represented by $R_3$ may have a substituent.

The substituent is not particularly limited, and examples thereof include the same as the substituents of the alkyl group which may include a heteroatom represented by $R_3$.

The alkenyl group which may include a heteroatom represented by $R_3$ is not particularly limited, but from the viewpoint that the LER and the collapse suppressing ability of a pattern thus formed are more excellent, an alkenyl group having 2 to 8 carbon atoms (which may be in any of linear, branched, and cyclic forms), which may include a heteroatom, is preferable, and a linear or branched alkenyl group having 2 to 4 carbon atoms, which may include a heteroatom, is more preferable. Examples of the alkenyl group which may include a heteroatom include a vinyl group, an allyl group, a butenyl group, and a cyclohexenyl group.

The alkenyl group which may include a heteroatom represented by $R_3$ may have a substituent.

The substituent is not particularly limited, and examples thereof include the same as the substituents of the alkyl group which may include a heteroatom represented by $R_3$.

The aryl group represented by $R_3$ has the same definition as the aryl group represented by $R_1$ and a suitable aspect thereof is re also the same.

The aryl group represented by $R_3$ may have a substituent.

The substituent is not particularly limited, and examples thereof include the groups exemplified in the above-mentioned substituent group T. More specific examples thereof include a halogen atom (for example, a fluorine atom, a chlorine atom, a bromine atom, and an iodine atom), an alkyl group substituted with at least one fluorine atom (the alkyl group substituted with at least one fluorine atom is intended to mean an alkyl group in which a hydrogen atom is substituted with at least one fluorine atom; the alkyl group preferably has 1 to 10 carbon atoms, and more preferably has 1 to 6 carbon atoms; and the alkyl may be substituted with at least one or more fluorine atoms, but the alkyl group is preferably a perfluoroalkyl group), a hydroxyl group, and a fluorinated alcohol group (for example, a hexafluoroisopropanol group).

Among those, the fluorine atom, the iodine atom, the alkyl group substituted with at least one fluorine atom (preferably a perfluoroalkyl group having 1 to 6 carbon atoms), or the fluorinated alcohol group (for example, a hexafluoroisopropanol group) is preferable.

As the organic group represented by $R_3$, from the viewpoint that the LER and the collapse suppressing ability of a pattern thus formed are more excellent, an alkyl group or aryl group which may include a heteroatom is preferable, and from the viewpoint that a resist film thus formed has an excellent sensitivity, an aryl group having a substituent including a fluorine atom or an iodine atom is more preferable.

The number of member rings of the Ring W1 is not particularly limited, but is, for example, 5 to 10, and preferably 5 or 6 from the viewpoint that the LER and the collapse suppressing ability of a pattern thus formed are more excellent.

As the repeating unit represented by General Formula (B-1), in particular, a repeating unit represented by General Formula (B-2) is preferable among those from the viewpoint that the sensitivity of a resist film thus formed is more excellent and the LER and the collapse suppressing ability of a pattern thus formed are more excellent.

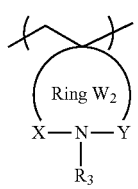

(B-2)

In General Formula (B-2), X and Y each independently represent a divalent linking group selected from the group consisting of —CO—, —SO—, —SO$_2$—, and —C(R$_4$)(R$_5$)—.

From the viewpoint that the LER and the collapse suppressing ability of a pattern thus formed are more excellent, as the divalent linking group represented by each of X and Y, —SO—, —CO—, or —C(R$_4$)(R$_5$)— is preferable, —CO— or —C(R$_4$)(R$_5$)— is preferable, and —CO— is more preferable.

Incidentally, it is preferable that neither X nor Y is —C(R$_4$)(R$_5$)—. In other words, in a case where one of X and Y is —C(R$_4$)(R$_5$)—, the other is preferably a divalent linking group other than —C(R$_4$)(R$_5$)—, and more preferably —CO—.

$R_4$ and $R_5$ each independently represent a hydrogen atom or an organic group.

Examples of the organic group represented by each of $R_4$ and $R_5$ include those exemplified as the organic group represented by $R_1$ and a hydroxyl group.

Furthermore, $R_4$ and $R_5$ may be bonded to each other to form a ring. As the ring formed by mutual bonding of $R_4$ and $R_5$, cycloalkane is preferable. The cycloalkane may be either a monocycle or a polycycle, and among these, cyclopentane, cyclohexane, norbornane, tetracyclodecane, tetracyclododecane, or adamantane is preferable, and cyclopentane or cyclohexane is more preferable.

The Ring W2 represents a ring which includes at least one carbon atom, one nitrogen atom, X, and Y, and may have a substituent.

The one carbon atom as mentioned above is a carbon atom specified in General Formula (B-2), and is intended to mean a carbon atom at the position where it is bonded to the main chain.

The one nitrogen atom as mentioned above means a nitrogen atom specified in General Formula (B-2).

The number of ring members of the Ring W2 is not particularly limited, but is, for example, 5 to 10, and is preferably 5 or 6 from the viewpoint that the LER and the collapse suppressing ability of a pattern thus formed are more excellent.

Furthermore, the Ring W2 may have a substituent, examples of the substituent include the groups exemplified in the above-mentioned substituent group T, and a halogen atom (for example, a fluorine atom, a chlorine atom, a bromine atom, and an iodine atom), an alkyl group substituted with at least one fluorine atom (the alkyl group substituted with at least one fluorine atom is intended to mean an alkyl group in which a hydrogen atom is substituted with at least one fluorine atom; the alkyl group preferably has 1 to 10 carbon atoms, and more preferably has 1 to 6 carbon atoms; and the alkyl may be substituted with at least one or more fluorine atoms, but the alkyl group is preferably a perfluoroalkyl group) is preferable.

In General Formula (B-2), $R_3$ represents a hydrogen atom or an organic group.

The organic group represented by $R_3$ has the same meaning as $R_3$ in General Formula (B-1), and a suitable aspect thereof is also the same.

As the repeating unit represented by General Formula (B-2), a repeating unit represented by General Formula (B-3) or a repeating unit represented by General Formula (B-4) is preferable among those from the viewpoint that the sensitivity of a resist film thus formed is more excellent, and the LER and the collapse suppressing ability of a pattern thus formed are more excellent.

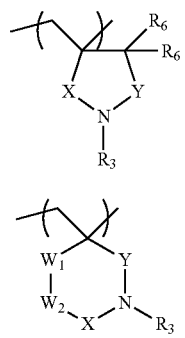

(B-3)

(B-4)

In General Formula (B-3) and General Formula (B-4), X, Y, and $R_3$ have the same meanings as X, Y, and $R_3$, respectively, in General Formula (B-2) and a suitable aspect thereof is also the same.

In General Formula (B-3), $R_6$'s each independently represent a hydrogen atom or a substituent.

In General Formula (B-4), $W_1$ and $W_2$ each independently represent —C($R_7$)($R_{10}$)— or a group represented by General Formula (B-5). In addition, $R_7$, $R_8$, $R_9$, and $R_{10}$ each independently represent a hydrogen atom or a substituent.

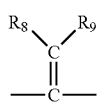

(B-5)

In General Formula (B-3) and General Formula (B-4), the substituent represented by each of $R_6$, $R_7$, $R_8$, $R_9$, and $R_{10}$ is not particularly limited, but examples thereof include the groups exemplified as the above-mentioned substituent group T, and a halogen atom (for example, a fluorine atom, a chlorine atom, a bromine atom, and an iodine atom) or an alkyl group substituted with at least one fluorine atom (an alkyl group substituted with at least one fluorine atom is intended an alkyl group in which a hydrogen atom is substituted with at least one fluorine atom; the alkyl group preferably has 1 to 10 carbon atoms, and more preferably has 1 to 6 carbon atoms; and at least one or more of the fluorine atoms may be substituted, but the alkyl group is preferably a perfluoroalkyl group) is preferable.

Specific examples of the repeating unit represented by General Formula (B-1) are shown below, but the present invention is not limited to these specific examples.

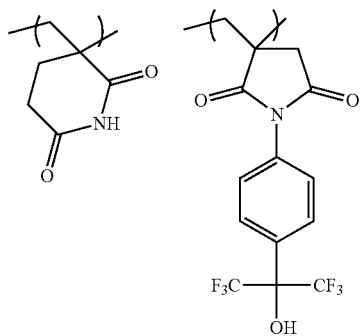

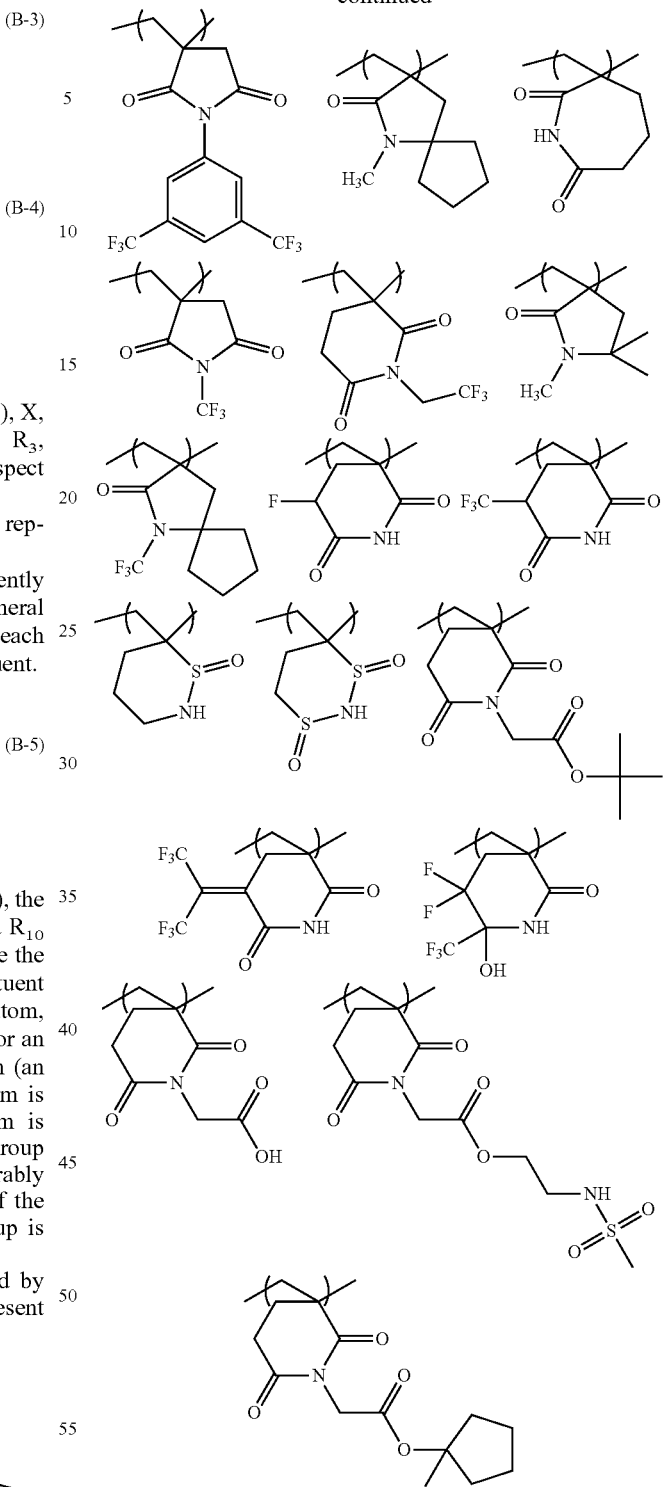

Among others, the repeating unit represented by General Formula (B-1) preferably includes a specific halogen atom from the viewpoint that a resist film formed has a more excellent sensitivity, and the LER and collapse suppressing ability of a pattern thus formed are more excellent. In a case where the repeating unit represented by General Formula (B-1) includes the specific halogen atom, a content of the specific halogen atom (hereinafter also referred to as a "specific halogen atom content") is preferably 10% by mass or more, and more preferably 20% by mass or more, with respect to a total mass of the repeating unit. In addition, an upper limit value thereof is not particularly limited, but is, for example, 60% by mass or less.

<<Other Repeating Units>>

The resin (X) may further include other repeating units, in addition to the repeating unit represented by General Formula (B-1). In the resin (X), the content of the repeating unit represented by General Formula (B-1) in the resin (X) is not particularly limited, but is preferably 5% to 70% by mass, and 10% to 60% by mass, with respect to all the repeating units.

Specific aspects of the resin (X) include the following Aspects (W1) and (W2).

Aspect (W1): The resin (X) includes a repeating unit Y1 which will be described below, a repeating unit including a lactone structure (for example, a repeating unit Y2 which will be described below), and the repeating unit represented by General Formula (B-1).

Aspect (W2): The resin (X) does not substantially include a repeating unit including a lactone structure (for example, the repeating unit Y2 which will be described below), but include a repeating unit represented by the repeating unit Y1 which will be described below and the repeating unit represented by General Formula (B-1).

Furthermore, a term "substantially" used herein is intended to mean that a content of the repeating unit including a lactone structure is 2% by mass or less (preferably 1% by mass or less, and more preferably 0% by mass) with respect to all the repeating units in the resin (X).

In particular, in a case of Aspect (W2), the content of the repeating unit represented by General Formula (B-1) is preferably 30% by mass or less in all the repeating units in the resin (X) is higher from the viewpoint that the LER of a pattern thus formed is more excellent. In addition, a lower limit thereof is 5% by mass or more.

Moreover, among others, Aspect (W2) is preferably an aspect in which the resin (X) does not substantially include a repeating unit including a lactone structure (for example, the repeating unit Y2 which will be described below), and includes the repeating unit Y1 which will be described below, a repeating unit Y3 which will be described below or a repeating unit Y4 which will be described below, and the repeating unit represented by General Formula (B-1).

In addition, in a case where the resin (X) has Aspect (W2), it is preferable that the repeating unit represented by General Formula (B-1) is the repeating unit represented by General Formula (B-2), and $R_3$ is an alkyl group which may be substituted with a halogen atom or $R_3$ represents an aryl group having a halogen atom (for example, a fluorine atom, a chlorine atom, a bromine atom, and an iodine atom) or an alkyl group substituted with at least one fluorine atom (an alkyl group substituted with at least one fluorine atom means an alkyl group in which a hydrogen atom is substituted with at least one fluorine atom; the alkyl group preferably has 1 to 10 carbon atoms, more preferably has 1 to 6 carbon atoms, and still more preferably has 1 to 3 carbon atoms, and at least one or more of the fluorine atoms may be substituted, but a perfluoroalkyl group is preferable) as a substituent.

Hereinafter, such other repeating units which can be included in the resin (X) will be described in detail.

Repeating Unit Having Acid-Decomposable Group

The resin (X) preferably includes a repeating unit having an acid-decomposable group (hereinafter also referred to as a "repeating unit Y1").

The acid-decomposable group preferably has a structure in which a polar group is protected with a group that leaves through decomposition by the action of an acid (leaving group).

Examples of the polar group include an acidic group (a group which dissociates in a 2.38%-by-mass aqueous tetramethylammonium hydroxide solution), such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, a fluorinated alcohol group (preferably a hexafluoroisopropanol group), and a sulfonic acid group.

The group which is preferable as the acid-decomposable group is a group in which a hydrogen atom is substituted with a group that leaves by the action of an acid (leaving group).

Examples of the group (leaving group) that leaves by the action of an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

As the aryl group represented by each of $R_{36}$ to $R_{39}$, $R_{01}$, and $R_{02}$, an aryl group having 6 to 10 carbon atoms is preferable, and examples thereof include a phenyl group, a naphthyl group, and an anthryl group.

As the aralkyl group represented by each of $R_{36}$ to $R_{39}$, $R_{01}$, and $R_{02}$, an aralkyl group having 7 to 12 carbon atoms is preferable, and examples thereof include a benzyl group, a phenethyl group, and a naphthylmethyl group.

As the alkenyl group represented by each of $R_{36}$ to $R_{39}$, $R_{01}$, and $R_{02}$, an alkenyl group having 2 to 8 carbon atoms is preferable, and examples thereof include a vinyl group, an allyl group, a butenyl group, and a cyclohexenyl group.

The ring formed by the bonding of $R_{36}$ and $R_{37}$ is preferably a (monocyclic or polycyclic) cycloalkyl group. As the cycloalkyl group, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the acid-decomposable group, a cumyl ester group, an enol ester group, an acetal ester group, a tertiary alkyl ester group, or the like is preferable, and the acetal ester group or the tertiary alkyl ester group is more preferable.

As the repeating unit Y1, a repeating unit represented by General Formula (AI) is preferable.

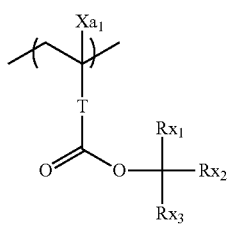

(AI)

In General Formula (AI), $Xa_1$ represents a hydrogen atom, a halogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, . . . , or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group or a group represented by —$CH_2$—$R_{11}$. $R_{11}$ represents a halogen atom (a fluorine atom and the like), a hydroxyl group, or a monovalent organic group, for example, an alkyl group having 5 or less carbon atoms and an acyl group having 5 or less carbon atoms; the alkyl group having 3 or less carbon atoms is preferable; and the methyl group is more preferable.

Examples of the halogen atom represented by $Xa_1$ include a fluorine atom, a chlorine atom, a bromine atom, and an iodine atom, and the fluorine atom or the iodine atom is preferable.

As $Xa_1$, a hydrogen atom, a fluorine atom, an iodine atom, a methyl group, a trifluoromethyl group, or a hydroxymethyl group is preferable.

Examples of the divalent linking group represented by T include an alkylene group, an arylene group, a —COO—Rt- group, and an —O-Rt- group. In the formulae, Rt represents an alkylene group or a cycloalkylene group.

T is preferably a single bond or a —COO—Rt- group. In a case where T represents a —COO—Rt-group, Rt is preferably an alkylene group having 1 to 5 carbon atoms, and more preferably a —$CH_2$— group, a —$(CH_2)_2$— group, or a —$(CH_2)_3$— group.

As the alkyl group represented by each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group represented by each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a hetero atom, such as a carbonyl group.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

Specific examples of the repeating unit Y1 are shown below, but the present invention is not particularly limited to these specific examples.

In the specific examples, Rx represents a hydrogen atom, a fluorine atom, an iodine atom, $CH_3$, $CF_3$, or $CH_2OH$. Rxa and Rxb each independently represent an alkyl group having 1 to 4 carbon atoms. Z represents a substituent including a polar group, and in a case where Z's are present in a plural number, they may be the same as or different from each other. p represents 0 or a positive integer. Examples of the substituent including a polar group represented by Z include a linear or branched alkyl group or alicyclic group, which has a hydroxyl group, a cyano group, an amino group, an alkylamido group, or a sulfonamido group, and an alkyl group having a hydroxyl group is preferable. As the branched alkyl group, an isopropyl group is preferable.

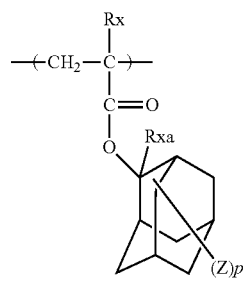

1

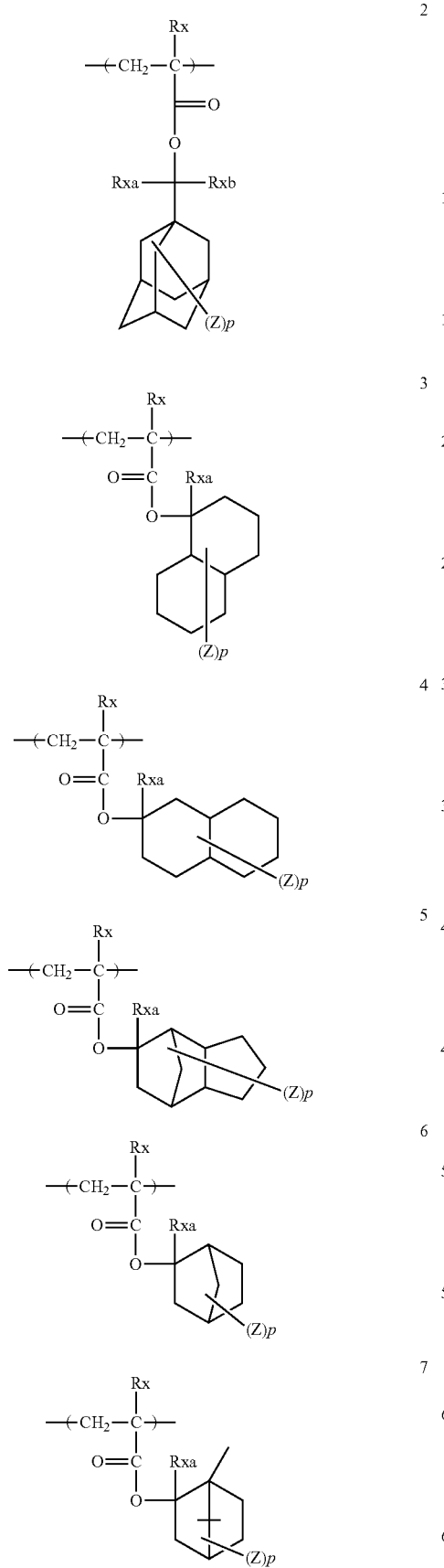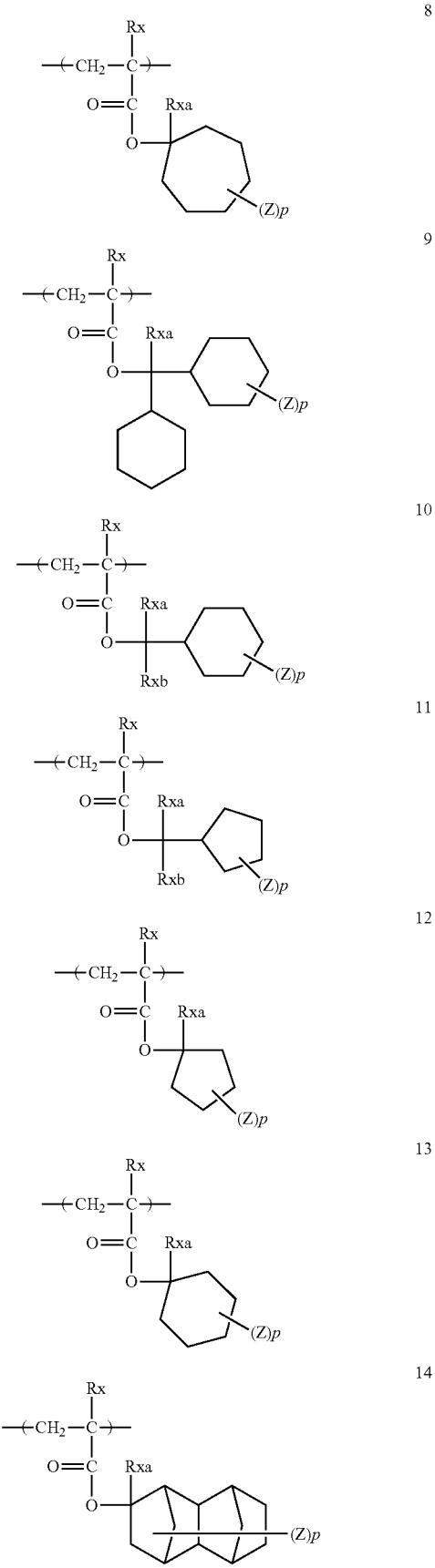

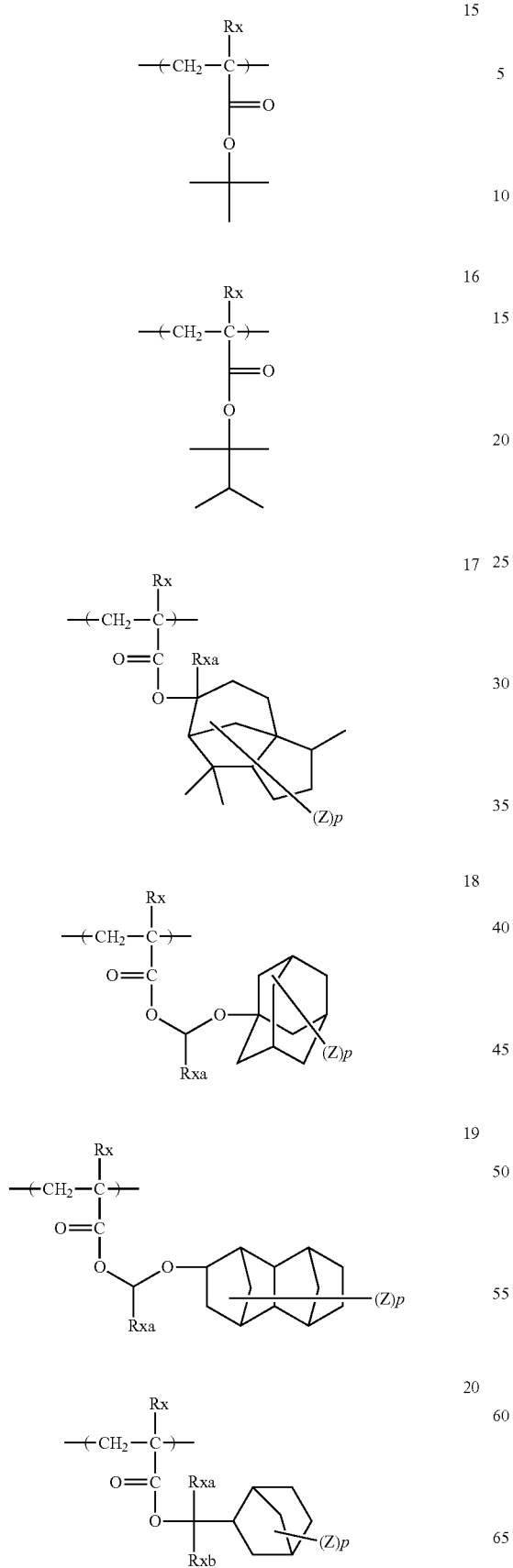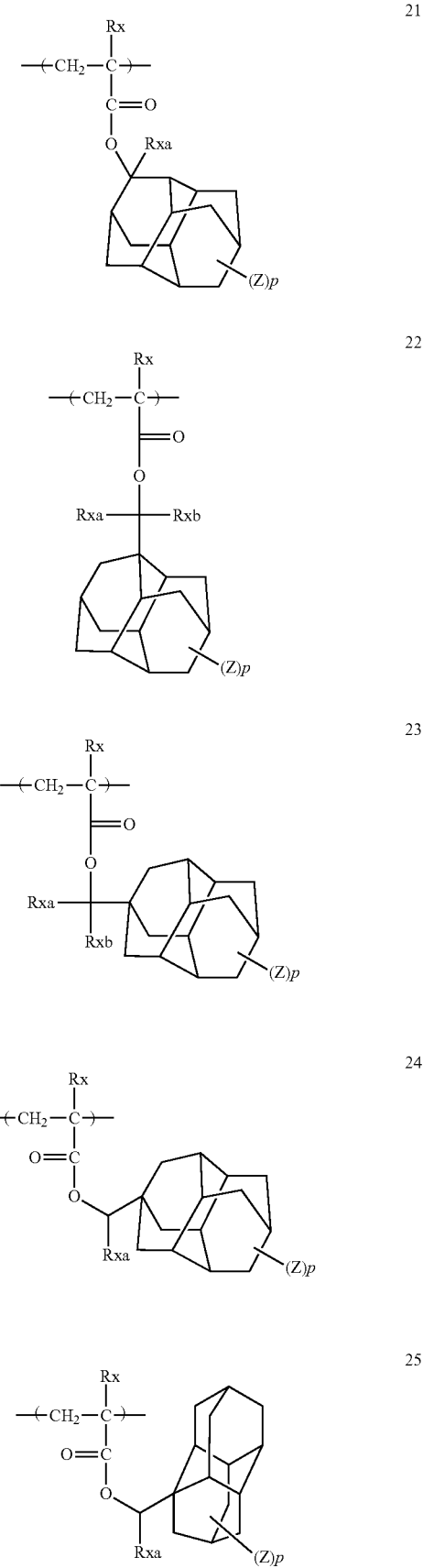

-continued

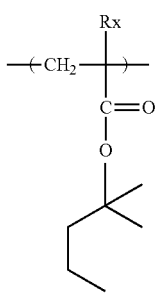

26

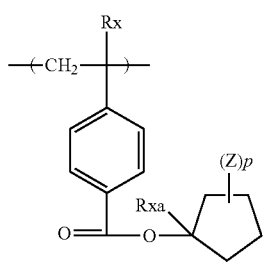

27

In a case where the resin (X) includes the repeating unit Y1, a content of the repeating unit Y1 is preferably 5% to 80% by mass, more preferably 5% to 70% by mass, and still more preferably 10% to 60% by mass, with respect to all the repeating units in the resin (X).

Other Repeating Unit Having Lactone Structure

The resin (X) may include another repeating unit having a lactone structure (hereinafter also referred to as a "repeating unit Y2").

Examples of the repeating unit Y2 include a repeating unit represented by General Formula (AII).

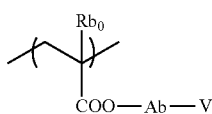

(AII)

In General Formula (AII), $Rb_0$ represents a hydrogen atom, a halogen atom, or an alkyl group having 1 to 4 carbon atoms.

The alkyl group of $Rb_0$ may have a substituent, and examples of the substituent include a hydroxyl group and a halogen atom (a fluorine atom, a chlorine atom, a bromine atom, and an iodine atom). Among those, $Rb_0$ is preferably a hydrogen atom or a methyl group.

In General Formula (AII), Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or a linking group represented by -$Ab_1$—COO— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

In General Formula (AII), V represents a group including a lactone structure.

The group including a lactone structure is not particularly limited as long as it includes a lactone structure.

As the lactone structure, a 5- to 7-membered ring lactone structure is preferable, and a 5- to 7-membered ring lactone structure to which another ring structure is fused so as to form a bicyclo structure or Spiro structure is more preferable.

As the lactone structure, lactone structures represented by General Formulae (LC1-1) to (LC1-17) are preferable, and among these, the group represented by General Formula (LC1-1), General Formula (LC1-4), General Formula (LC1-5), General Formula (LC1-6), General Formula (LC1-13), or General Formula (LC1-14) is more preferable. A lactone structure from which any one of hydrogen atoms is removed is derived into a group including the lactone structure.

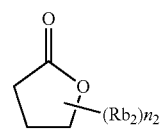

LC1-1

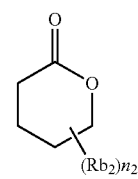

LC1-2

LC1-3

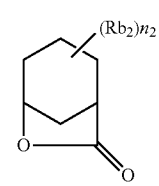

LC1-4

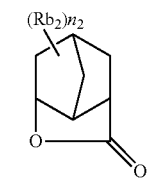

LC1-5

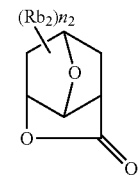

LC1-6

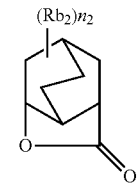

LC1-7

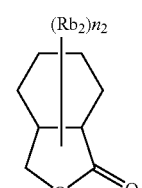

-continued

LC1-8 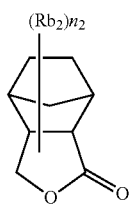

LC1-9 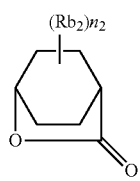

LC1-10 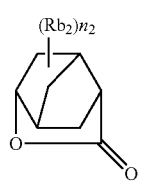

LC1-11 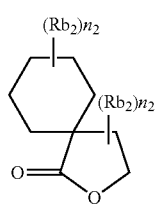

LC1-12 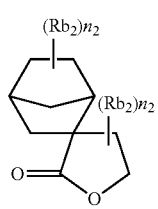

LC1-13 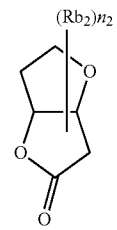

LC1-14 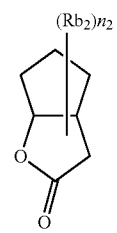

-continued

LC1-15 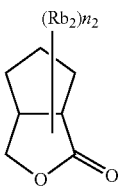

LC1-16 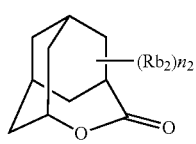

LC1-17 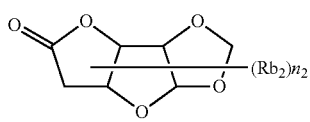

The lactone structural portion may have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, and a cyano group, an alkyl group having 1 to 4 carbon atoms or the cyano group is preferable, and the cyano group is more preferable. $n_2$ represents an integer of 0 to 4. In a case where $n_2$ is 2 or more, the substituents ($Rb_2$) which are present in a plural number may be the same as or different from each other. Further, the substituents ($Rb_2$) which are present in a plural number may be bonded to each other to form a ring.

Optical isomers of the repeating unit Y2 are typically present, but any of the optical isomers may be used. In addition, one kind of optical isomers may be used singly or a mixture of a plurality of the optical isomers may be used. In a case where one kind of optical isomers are mainly used, the optical purity (ee) thereof is preferably 90 or more, and more preferably 95 or more.

Specific examples of the repeating unit Y2 are shown below, but the present invention is not particularly limited to these specific examples. Further, the following specific examples may further have a substituent (examples thereof include the above-mentioned substituent ($Rb_2$)).

(In the formulae, Rx is H, $CH_3$, $CH_2OH$, or $CF_3$.)

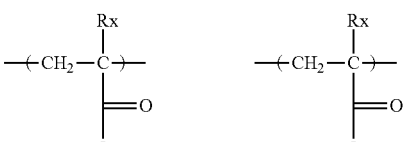

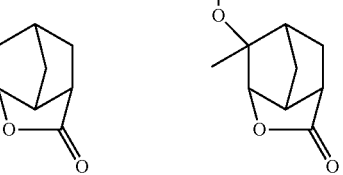

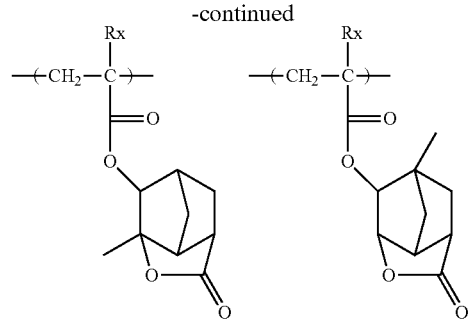
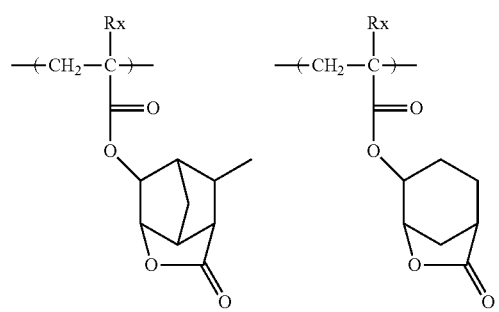
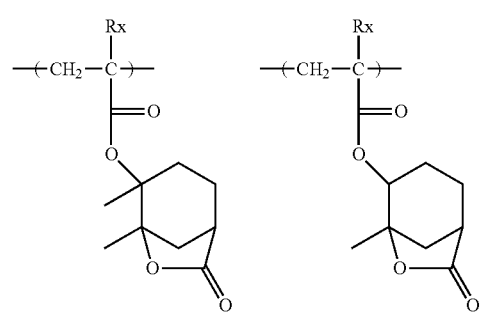
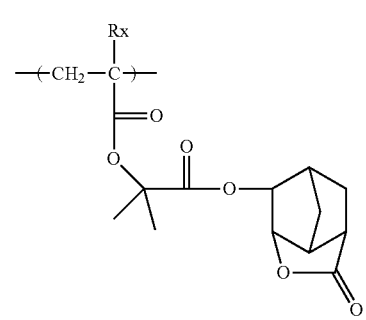
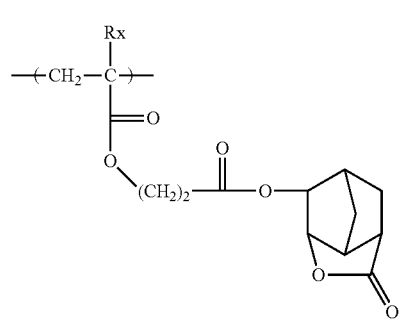
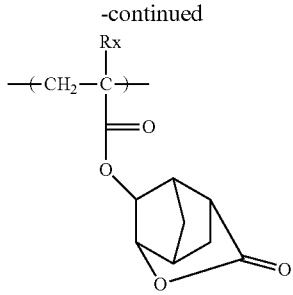
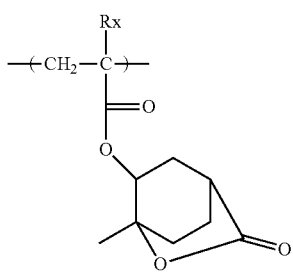
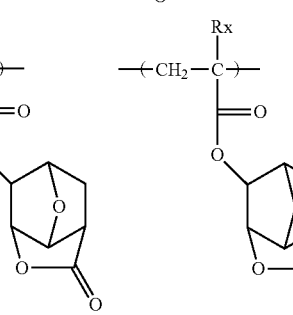
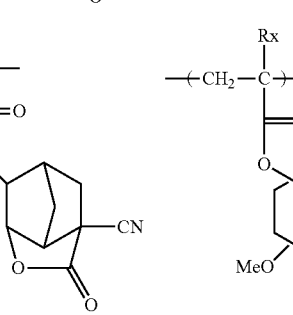
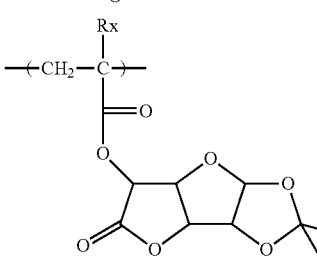
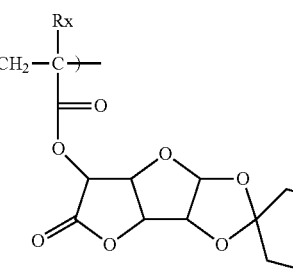

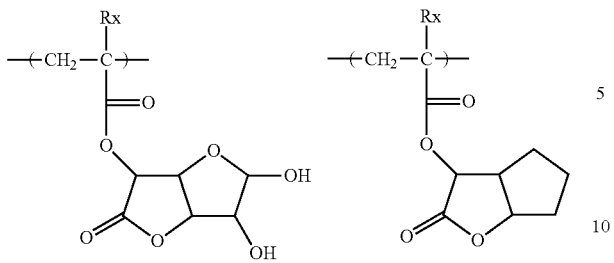
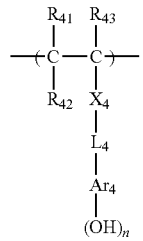
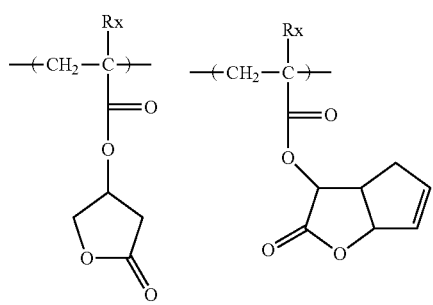
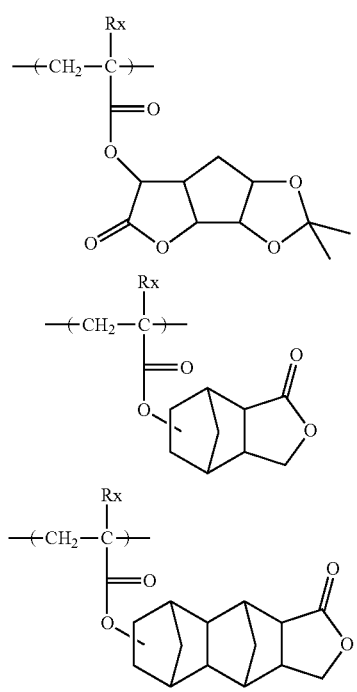

In a case where the resin (X) includes a repeating unit Y2, a content of the repeating unit Y2 is preferably 5% to 60% by mass, more preferably 10% to 60% by mass, and still more preferably 10% to 40% by mass, with respect to all the repeating units in the resin (X).

Repeating Unit Having Phenolic Hydroxyl Group

The resin (X) may include a repeating unit having a phenolic hydroxyl group (hereinafter also referred to as a "repeating unit Y3").

Examples of the repeating unit Y3 include a repeating unit represented by General Formula (I).

$$\begin{array}{c} R_{41} \ R_{43} \\ | \ | \\ -(C-C)- \\ | \ | \\ R_{42} \ X_4 \\ | \\ L_4 \\ | \\ Ar_4 \\ | \\ (OH)_n \end{array} \quad (I)$$

In Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or a divalent linking group.

$Ar_4$ represents an (n+1)-valent aromatic group, and in a case where $Ar_4$ is bonded to $R_{42}$ to form a ring, $Ar_4$ represents an (n+2)-valent aromatic group.

n represents an integer of 1 to 5.

For the purpose of increasing the polarity of the repeating unit represented by General Formula (I), it is preferable that n is an integer of 2 or more, or $X_4$ is —COO— or —CONR$_{64}$—.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle. A monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group represented by each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

$Ar_4$ represents an (n+1)-valent aromatic group. The divalent aromatic hydrocarbon group in a case where n is 1 may have a substituent, and for example, an arylene group having 6 to 18 carbon atoms, such as a phenylene group, a tolylene group, a naphthylene group, and an anthracenylene group, or an aromatic hydrocarbon group including a heterocycle such as thiophene, furan, pyrrole, benzothiophene, benzofuran, benzopyrrole, triazine, imidazole, benzimidazole, triazole, thiadiazole, and thiazole is preferable.

Specific suitable examples of the (n+1)-valent aromatic group in a case where n is an integer of 2 or more include groups formed by excluding any (n−1) hydrogen atoms from the above-described specific examples of the divalent aromatic group.

The (n+1)-valent aromatic group may further have a substituent.

Examples of the preferred substituent in the (n+1)-valent aromatic group include a halogen atom, and a fluorine atom or an iodine atom is preferable.

Preferred examples of the alkyl group of $R_{64}$ in —$CONR_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and the alkyl group is more preferably an alkyl group having 8 or less carbon atoms.

As X4, a single bond, —COO—, or —CONH— is preferable, the single bond or —COO— is more preferable, and the single bond ins still more preferable.

As the divalent linking group as $L_4$, an alkylene group is preferable, and as the alkylene group, an alkylene group having 1 to 8 carbon atoms, such as a methylene group, an ethylene group, a propylene group, a butylene group, a hexylene group, and an octylene group, each of which may have a substituent, is preferable.

Among those, $L_4$ is preferably a single bond.

As $Ar_4$, an aromatic hydrocarbon group having 6 to 18 carbon atoms, which may have a substituent, is preferable, a benzene ring group, a naphthalene ring group, or a biphenylene ring group is more preferable, and the benzene ring group is still more preferable.

n is preferably 1 or 2.

Among those, the repeating unit represented by General Formula (I) is preferably a repeating unit derived from hydroxystyrene or a hydroxystyrene derivative. That is, Ara represents a benzene ring group, and $X_4$ and $L_4$ each preferably represent a single bond.

Specific examples of the repeating unit $Y_3$ are shown below, but the present invention is not limited to these specific examples. In the formulae, a represents 1 or 2.

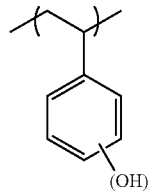
(B-1)

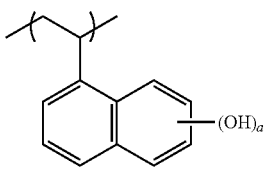
(B-2)

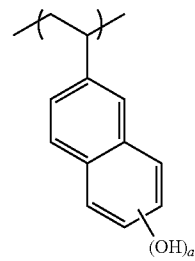
(B-3)

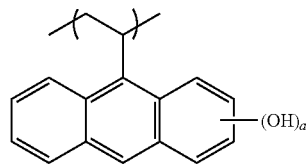
(B-4)

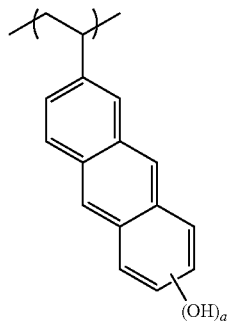
(B-5)

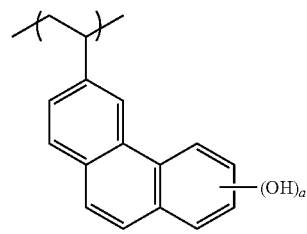
(B-6)

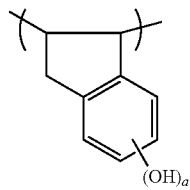
(B-7)

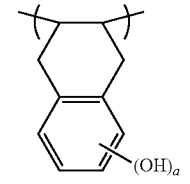
(B-8)

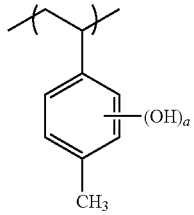
(B-9)

-continued
(B-10) 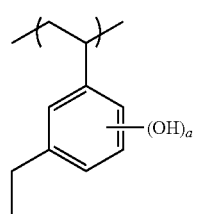
(B-11) 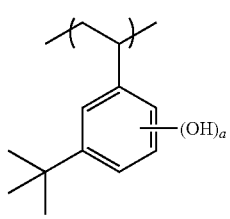
(B-12) 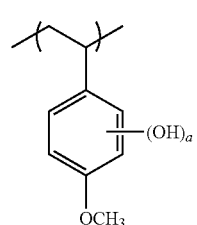
(B-13) 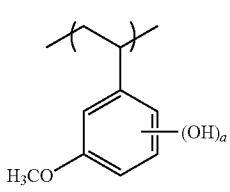
(B-14) 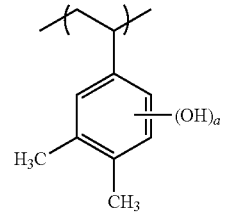
(B-15) 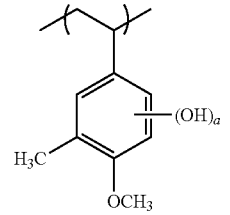
(B-16) 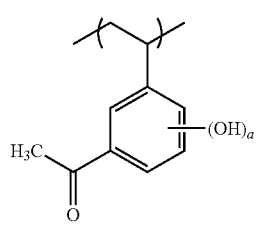
-continued
(B-17) 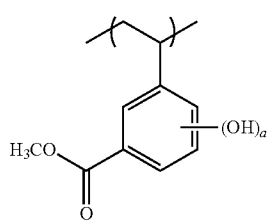
(B-18) 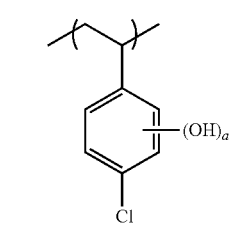
(B-19) 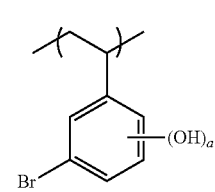
(B-20) 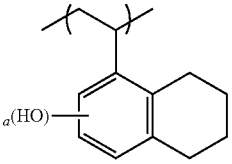
(B-21) 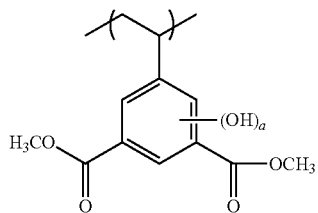
(B-22) 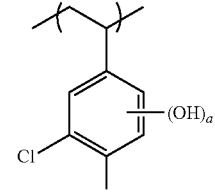
(B-23) 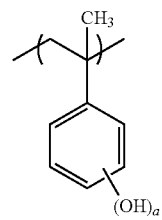

(B-24) 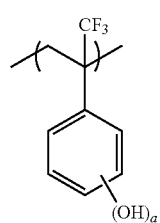

(B-25) 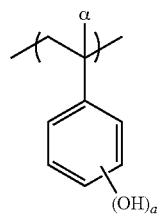

(B-26) 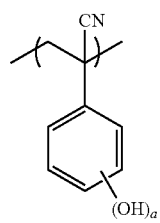

(B-27) 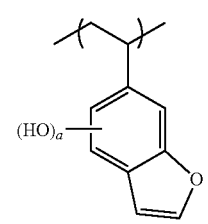

(B-28) 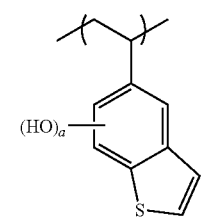

(B-29) 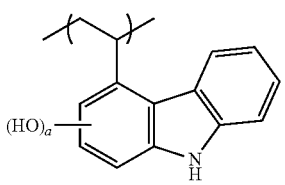

(B-30) 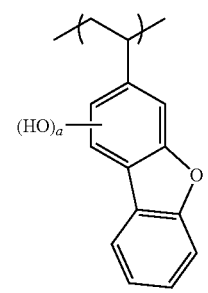

(B-31) 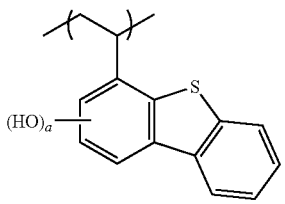

(B-32) 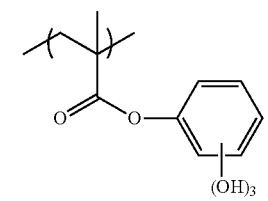

(B-33) 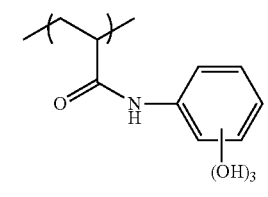

(B-34) 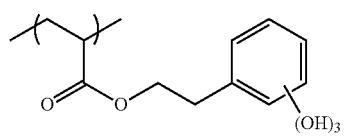

In a case where the resin (X) includes the repeating unit Y3, a content of the repeating unit Y3 is preferably 5% to 60% by mass, and more preferably 10% to 50% by mass, with respect to all the repeating units in the resin (X).

Repeating Unit Having Acid Group Other than Phenolic Hydroxyl Group

The resin (X) may include another repeating unit having an acid group (hereinafter also referred to as a "repeating unit Y4"). The repeating unit Y4 does not correspond to the repeating unit represented by General Formula (B-1), the repeating unit Y1, the repeating unit Y2, and the repeating unit Y3.

Examples of the acid group included in the repeating unit Y4 include a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol), the sulfonimido group, or the bis(alkylcarbonyl)methylene group is preferable.

The skeleton of the repeating unit Y4 is not particularly limited, but the repeating unit Y4 is preferably a (meth)acrylate-based repeating unit or a styrene-based repeating unit.

Specific examples of the repeating unit Y4 are shown below, but the present invention is not limited to these specific examples. In the formulae, Rx represents a hydrogen atom, $CH_3$, $CF_3$, or $CH_2OH$.

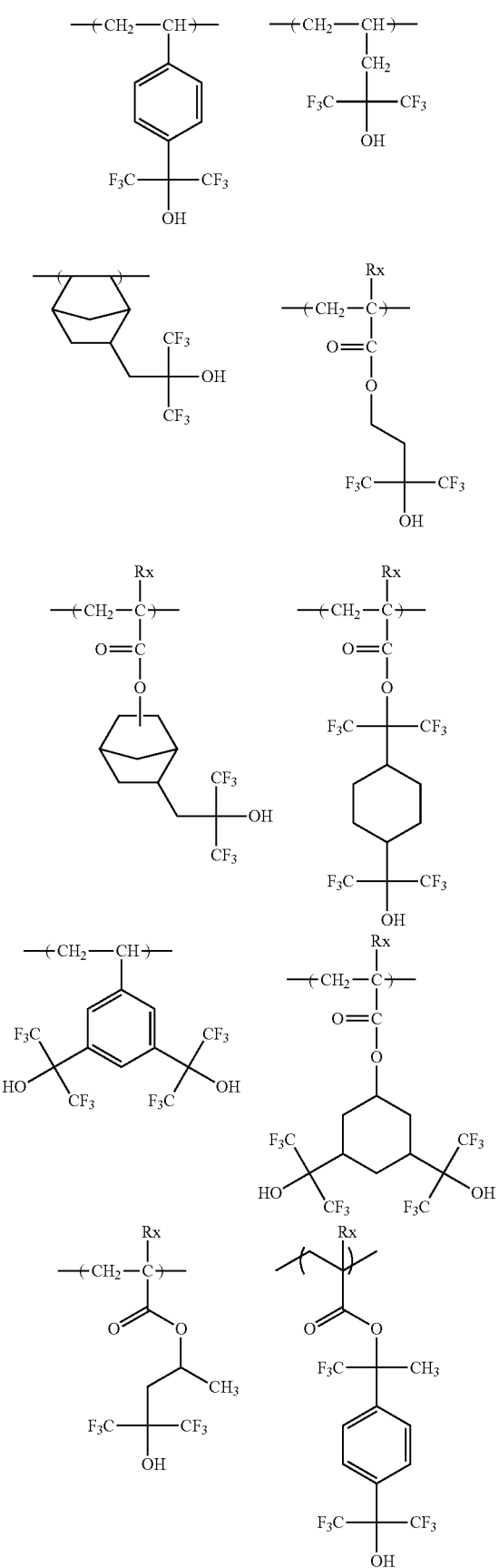

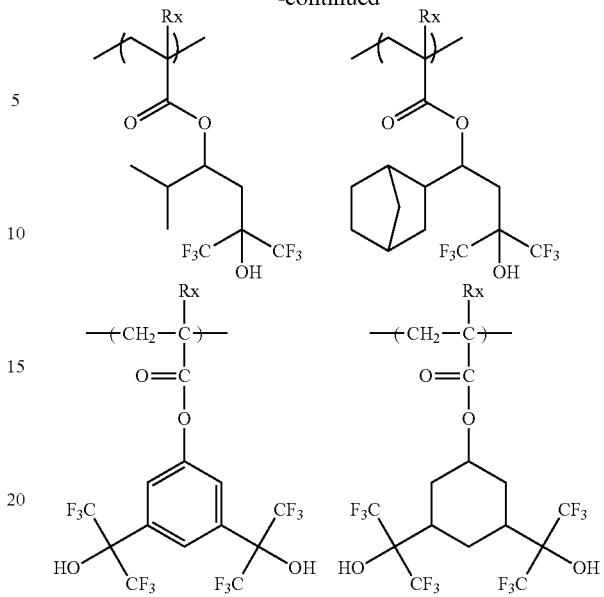

In a case where the resin (X) includes a repeating unit Y4, the content of the repeating unit Y4 is preferably 5% to 60% by mass, and more preferably 10% to 60% by mass, with respect to all the repeating units in the resin (X).

The resin (X) may have another repeating unit, in addition to the repeating units Y1 to Y4.

In a case where the composition of the embodiment of the present invention is for ArF exposure, it is preferable that the resin (X) does not substantially have an aromatic group from the viewpoint of transparency of ArF light. More specifically, the repeating unit having an aromatic group is preferably 5% by mole or less, more preferably 3% by mole or less, and ideally 0% by mole, with respect to all the repeating units in the resin (X), that is, it is still more preferable that the repeating unit having an aromatic group is not included. In addition, the resin (X) preferably has a monocyclic or polycyclic alicyclic hydrocarbon structure.

The resin (X) can be synthesized in accordance with an ordinary method (for example, radical polymerization).

The weight-average molecular weight of the resin (X) is preferably 3,500 to 25,000, more preferably 4,000 to 10,000, and still preferably 4,000 to 8,000. The dispersity (Mw/Mn) is usually 1.0 to 3.0, preferably 1.0 to 2.6, more preferably 1.0 to 2.0, and still more preferably 1.1 to 2.0.

The resin (X) may be used singly or in combination of two or more kinds thereof.

A content of the resin (X) in the composition of the embodiment of the present invention (in a case where the resins (X) are present in a plural number, a total content thereof) is generally 20.0% by mass or more in many cases, and is preferably 40.0% by mass or more, more preferably 50.0% by mass or more, and still more preferably 60.0% by mass or more, with respect to the total solid content of the composition. An upper limit thereof is not particularly limited, but is preferably 99.9% by mass or less, more preferably 99.5% by mass or less, and still more preferably 99.0% by mass or less.

<Compound that Generates Acid Upon Irradiation with Actinic Rays or Radiation>

The composition of the embodiment of the present invention includes a compound that generates an acid upon irradiation with actinic rays or radiation (hereinafter also referred to as a "photoacid generator").

The photoacid generator may be in a form of a low-molecular-weight compound or a form incorporated into a part of a polymer. Further, a combination of the form of a low-molecular-weight compound and the form incorporated into a part of a polymer may also be used.

In a case where the photoacid generator is in the form of a low-molecular-weight compound, the molecular weight is preferably 3,000 or less, more preferably 2,000 or less, and still more preferably 1,000 or less.

In a case where the photoacid generator is incorporated into a part of a polymer, it may be incorporated into a part of the resin (X) or in a resin different from the resin (X).

Among those, the photoacid generator is preferably in the form of a low-molecular-weight compound.

The photoacid generator is not particularly limited as long as it is a known one, but is preferably a compound that generates an organic acid upon irradiation with actinic rays or radiation (preferably electron beams or extreme ultraviolet rays).

As the organic acid, for example, at least any one of sulfonic acid, bis(alkylsulfonyl)imide, or tris(alkylsulfonyl)methide is preferable.

The photoacid generator is preferably a compound represented by General Formula (ZI), General Formula (ZII), or General Formula (ZIII).

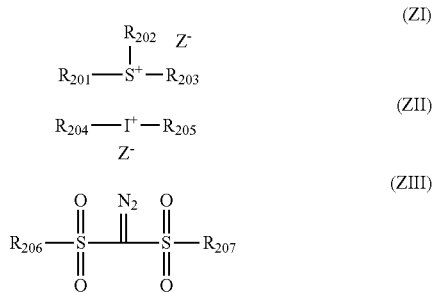

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

$Z^-$ represents a non-nucleophilic anion (anion having an extremely low ability to cause a nucleophilic reaction).

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, and $R_{203}$ represent an aryl group. As the aryl group, not only a phenyl group, a naphthyl group, or the like but also a heteroaryl group such as an indole residue and a pyrrole residue is also available.

As the alkyl group of each of $R_{201}$ to $R_{203}$, a linear or branched alkyl group having 1 to 10 carbon atoms is preferable, and a methyl group, an ethyl group, an n-propyl group, an i-propyl group, or an n-butyl group is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in these groups include a nitro group, a halogen atom such as a fluorine atom, a carboxyl group, a hydroxyl group, an amino group, a cyano group, an alkoxy group (preferably having 1 to 15 carbon atoms), an alkyl group (preferably having 1 to 15 carbon atoms), a fluoroalkyl group substituted with a fluorine atom (preferably having 1 to 15 carbon atoms, with a perfluoroalkyl group being preferable), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Examples of the non-nucleophilic anion include a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and has a linear or branched alkyl group having 1 to 30 carbon atoms, or is preferably a cycloalkyl group having 3 to 30 carbon atoms.

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group exemplified above may have a substituent. The substituent is not particularly limited, but specific examples of the substituent include a nitro group, a halogen atom such as fluorine atom, a carboxyl group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

The aralkyl group in the aralkylcarboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group include a halogen atom, an alkyl group substituted with the halogen atom, an alkoxy group, an alkylthio group, an alkyloxysulfonyl group, an aryloxysulfonyl group, and a cycloalkylaryloxysulfonyl group, and a fluorine atom or an alkyl group substituted with the fluorine atom is preferable.

Furthermore, the alkyl group in the bis(alkylsulfonyl) imide anion may be bonded to each other to form a ring structure. As a result, the acid strength increases.

Examples of the other non-nucleophilic anions include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion in which at least α-position of sulfonic acid is substituted with a fluorine atom, an aromatic sulfonate anion substituted with a fluorine atom or a group having a fluorine atom, a bis(alkylsulfonyl)imide anion in which an alkyl group is substituted with a fluorine atom, or a tris (alkylsulfonyl)methide anion in which an alkyl group is substituted with a fluorine atom is preferable. Among those, a perfluoroaliphatic sulfonate anion (preferably having 4 to 8 carbon atoms) or a benzene sulfonate anion having a fluorine atom is more preferable, and a nonafluorobutane sulfonate anion, a perfluorooctane sulfonate anion, a pentafluorobenzene sulfonate anion, or a 3,5-bis(trifluoromethyl) benzenesulfonate anion is more preferable.

From the viewpoint of the acid strength, it is preferable that a pKa of the generated acid is −1 or less to improve the sensitivity.

Furthermore, as the non-nucleophilic anion, an anion represented by General Formula (AN1) is also preferable.

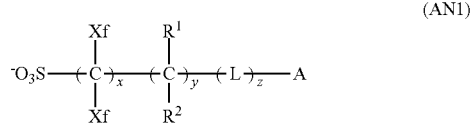

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are each present in a plural number, they may each be the same as or different from each other.

L represents a divalent linking group, and in a case where L's are present in a plural number, they may be the same as or different from each other.

A represents a cyclic organic group.

x represents an integer of 1 to 20, y represents an integer of 0 to 10, and z represents an integer of 0 to 10.

General Formula (AN1) will be described in more detail.

The alkyl group in the alkyl group substituted with a fluorine atom for Xf preferably has 1 to 10 carbon atoms, and more preferably has 1 to 4 carbon atoms. In addition, a perfluoroalkyl group is preferable as the alkyl group substituted with at least one fluorine atom.

As Xf, a fluorine atom or a perfluoroalkyl group having 1 to 4 carbon atoms is preferable. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F9$, and among these, the fluorine atom or $CF_3$ is preferable. In particular, it is preferable that both Xf's are fluorine atoms.

The alkyl group of each of $R^1$ and $R^2$ may have a substituent (preferably a fluorine atom), and the substituent preferably has 1 to 4 carbon atoms. As the substituent, a perfluoroalkyl group having 1 to 4 carbon atoms is preferable. Specific examples of each of $R^1$ and $R^2$ include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As each of $R^1$ and $R^2$, the fluorine atom or $CF_3$ is preferable.

x is preferably 1 to 10, and more preferably 1 to 5.

y is preferably 0 to 4, and more preferably 0.

z is preferably 0 to 5, and more preferably 0 to 3.

The divalent linking group of L is not particularly limited, and examples thereof include —COO—, —OCO—, —CO—, —O—, —S—, —SO—, —SO$_2$—, an alkylene group, a cycloalkylene group, an alkenylene group, and a linking group in which a plurality of these groups are linked, and a linking group having a total number of carbon atoms of 12 or less is preferable. Among those, —COO—, —OCO—, —CO—, or —O— is preferable, and —COO— or —OCO— is more preferable.

The cyclic organic group of A is not particularly limited as long as it has a cyclic structure, and examples thereof include an alicyclic group, an aromatic ring group, and a heterocyclic group (also including a group having aromaticity as well as a group not having aromaticity).

The alicyclic group may be either a monocycle or a polycycle, a monocyclic cycloalkyl group such as a cyclopentyl group, a cyclohexyl group, and a cyclooctyl group is preferable, and in addition, a polycyclic cycloalkyl group such as a norbornyl group, a tricyclodecanyl group, a tetracyclodecanyl group, a tetracyclododecanyl group, and an adamantyl group is also preferable. Among those, an alicyclic group having a bulky structure having 7 or more carbon atoms, such as a norbornyl group, a tricyclodecanyl group, a tetracyclodecanyl group, a tetracyclododecanyl group, and an adamantyl group, can be used in the post-exposure baking step is preferable from the viewpoint that it can suppress the in-plane diffusivity and improve a mask error enhancement factor (MEEF).

Examples of the aromatic ring group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among those, those derived from the furan ring, the thiophene ring, or the pyridine ring are preferable.

Moreover, examples of the cyclic organic group also include a lactone structure, and specifically include lactone structures represented by General Formulae (LC1-1) to (LC1-17).

The cyclic organic group may have a substituent. Examples of the substituent include an alkyl group (which may be in any of linear, branched, and cyclic forms, and preferably has 1 to 12 carbon atoms), a cycloalkyl group (which may be either a monocycle or a polycycle; may be a Spiro ring in a case where the cycloalkyl group is polycyclic; and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (carbon contributing to ring formation) may be carbonyl carbon.

In General Formula (ZII) and General Formula (ZIII), $R_{204}$ to $R_{207}$ each independently represent an aryl group, an alkyl group, or a cycloalkyl group.

As the aryl group, the alkyl group, and the cycloalkyl group of each of $R_{204}$ to $R_{207}$ have the same definitions as the aryl group, the alkyl group, and the cycloalkyl group, respectively, of each of $R_{201}$ to $R_{203}$ in General Formula (ZI) as described above.

The substituent which may be contained in each of the aryl group, the alkyl group, and the cycloalkyl group of each of $R_{204}$ to $R_{207}$ is the same as the substituent which may be contained in each of the aryl group, the alkyl group, and the cycloalkyl group of each of $R_{201}$ to $R_{203}$ in the compound (ZI) as described above, and suitable aspects are also the same.

$Z^-$ represents a non-nucleophilic anion, has the same meaning as the non-nucleophilic anion of $Z^-$ in General Formula (ZI), and a suitable aspect thereof is also the same.

Furthermore, from the viewpoint of suppressing an acid generated upon exposure from diffusing to an unexposed portion and further improving the resolution, the photoacid generator is preferably a compound that generates an acid in size with a volume of 130 Å$^3$ or more upon irradiation with electron beams or extreme ultraviolet rays. As the photoacid generator, a compound that generates an acid (more preferably a sulfonic acid) in size with a volume of 190 Å$^3$ or more is more preferable, a compound that generates an acid (more preferably sulfonic acid) in size with a volume of 270 Å$^3$ or more is still more preferable, and a compound that generates an acid (more preferably sulfonic acid) in size with a volume of 400 Å$^3$ or more is particularly preferable. It should be noted that from the viewpoint of the sensitivity or the solubility in the coating solvent, the volume is preferably 2,000 Å$^3$ or less, and more preferably 1,500 Å$^3$ or less. In addition, the value of the volume can be determined using "WinMOPAC" manufactured by Fujitsu Limited.

In the calculation of the volume value, first, the chemical structure of an acid according to each example is input, next, using this structure as an initial structure, the most stable steric conformation of each acid is determined by molecular force field calculation using a molecular mechanics (MM) 3 method, and then, molecular orbital calculation using a PM3 method is performed with respect to the most stable steric conformation, whereby an "accessible volume" of each acid can be calculated.

Specific examples of an acid (an acid in which a proton is bonded to an anionic moiety) generated by the photoacid generator and a volume thereof are shown below, but the present invention is not limited thereto. Incidentally, the volumes shown in the following examples are calculated values (unit: Å$^3$). In addition, 1 Å is $1 \times 10^{-10}$ m.

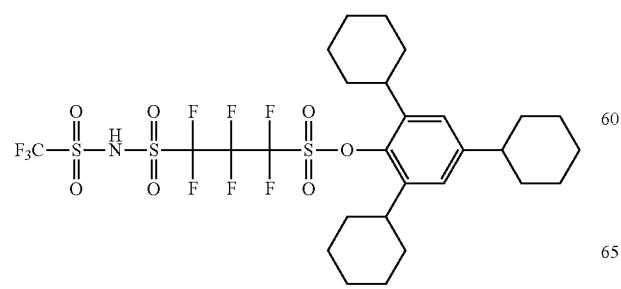
585Å$^3$

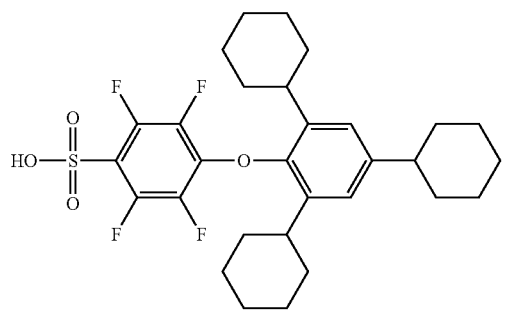
585Å$^3$

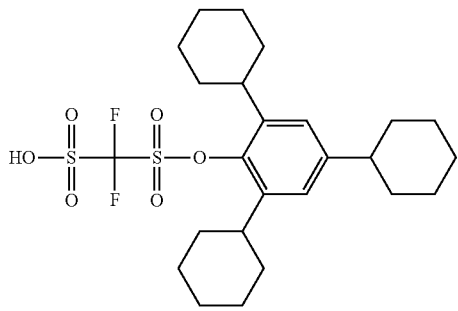
525Å$^3$

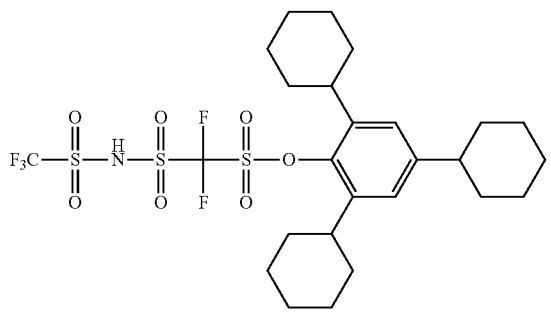
554Å$^3$

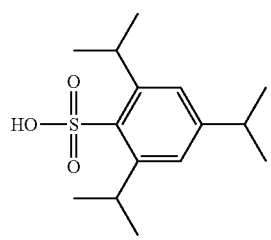
303Å$^3$

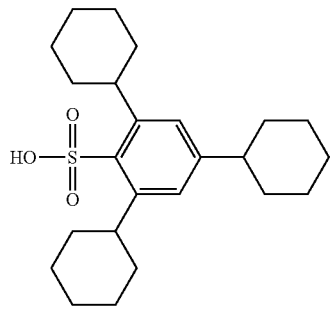
437Å$^3$

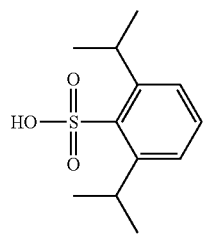 244Å³
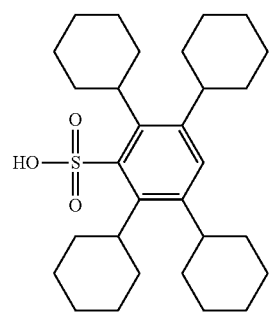 529Å³
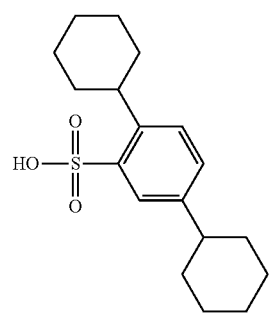 336Å³
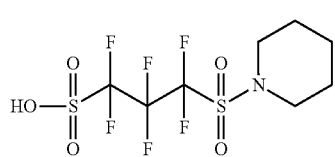 244Å³
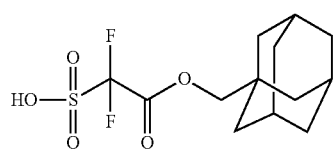 271Å³
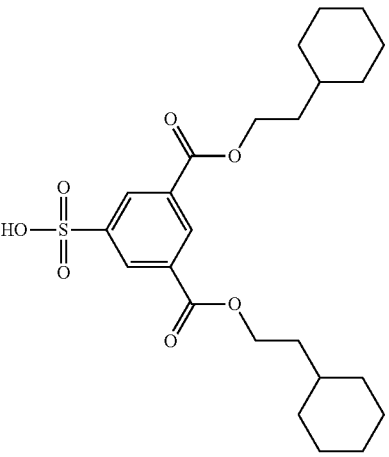 457Å³
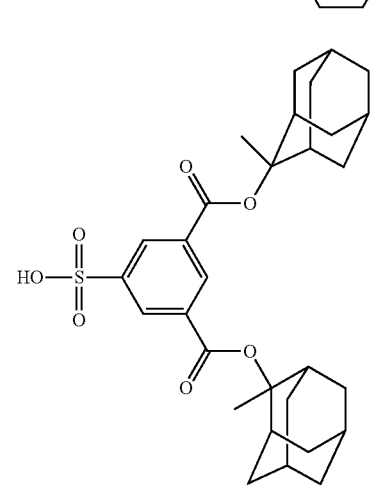 511Å³
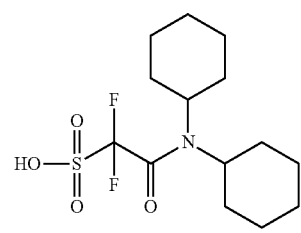 311Å³
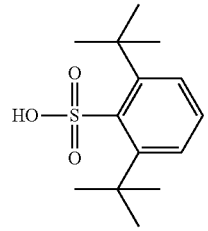 280Å³
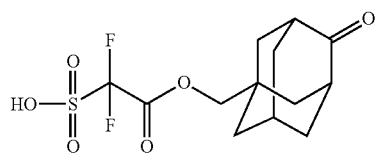 266Å³

-continued
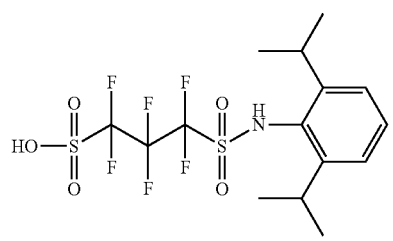
339Å³
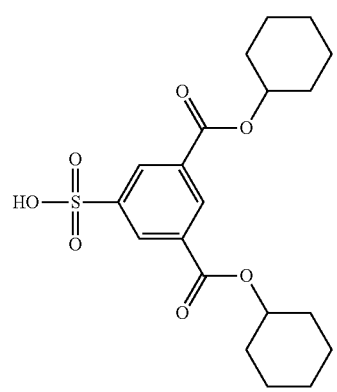
380Å³
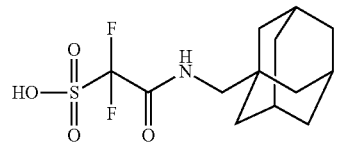
277Å³
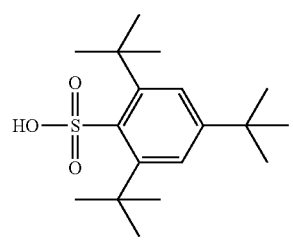
357Å³
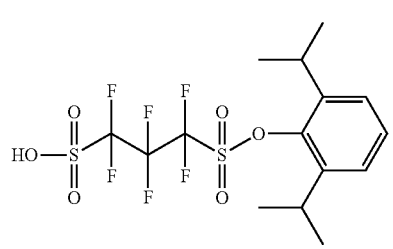
347Å³
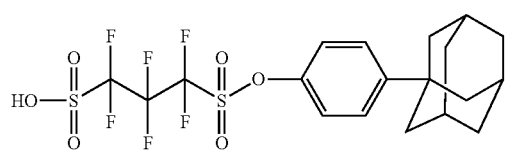
380Å³
-continued
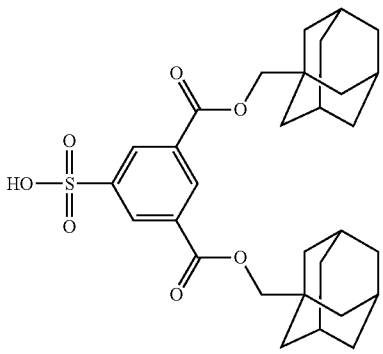
519Å³
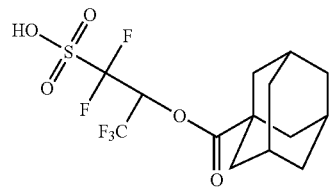
291Å³
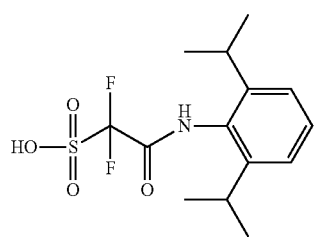
297Å³
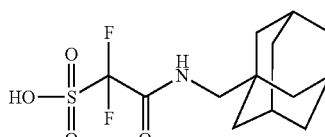
277Å³
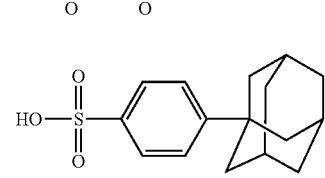
261Å³
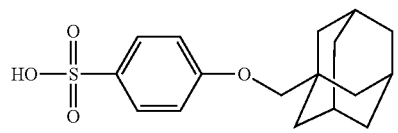
310Å³
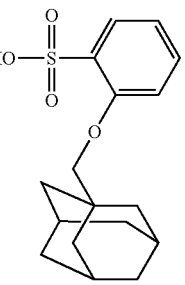
319Å³

270Å³

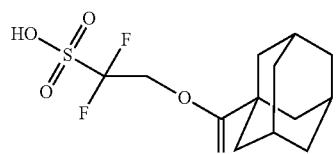

393Å³

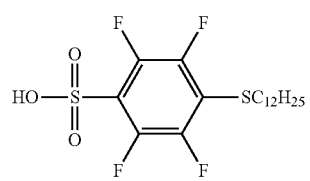

350Å³

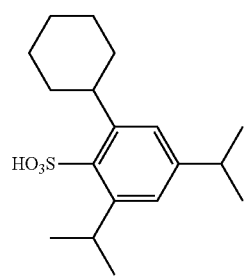

311Å³

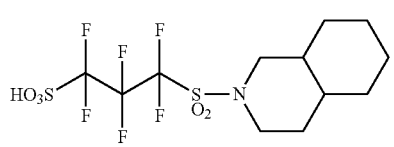

250Å³

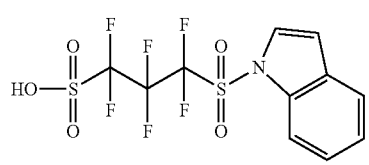

353Å³

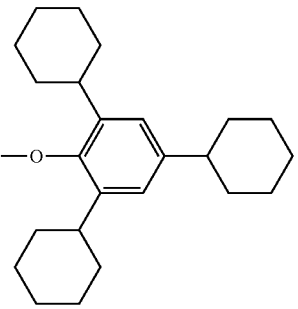

290Å³

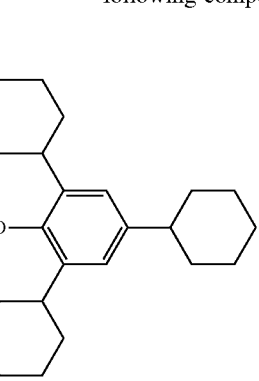

315Å³

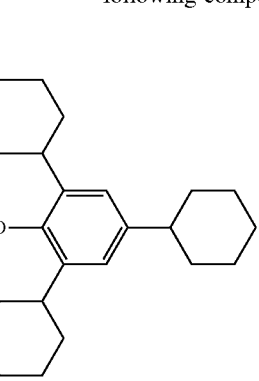

With regard to the photoacid generator, reference can be made to paragraphs [0368] to [0377] of JP2014-041328A and paragraphs [0240] to [0262] of JP2013-228681A (corresponding to paragraph [0339] of the specification of US2015/0004533A), the contents of which are incorporated herein by reference. In addition, specific preferred examples of the photoacid generator include, but are not limited to, the following compounds.

(z1)

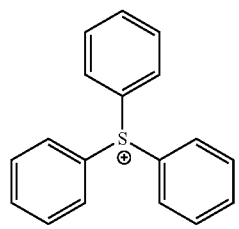 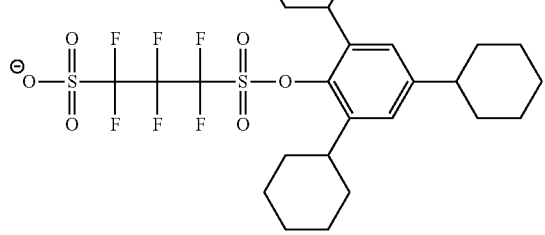

-continued
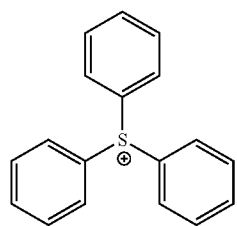
(z2)
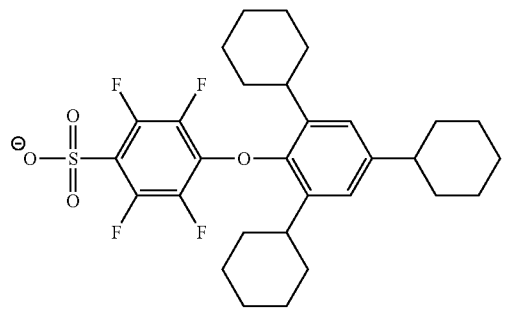
(z3)
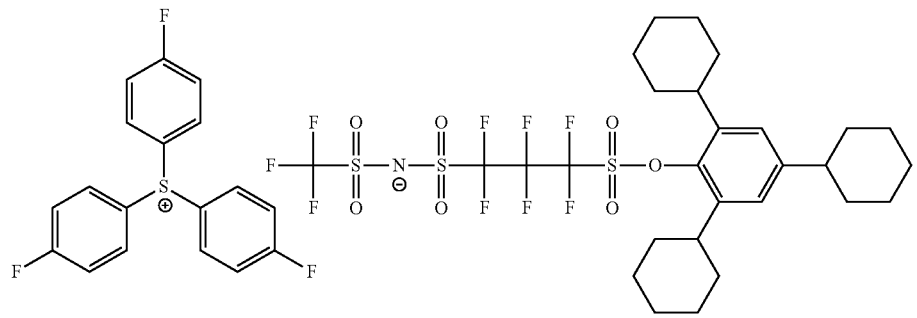
(z4)
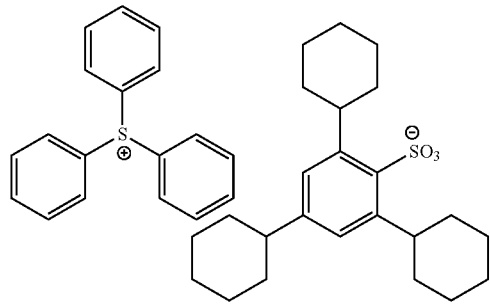
(z5)
(z6)
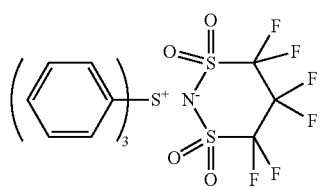
(z7)
(z8)
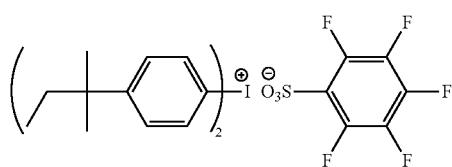
(z9)
(z10)
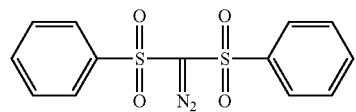

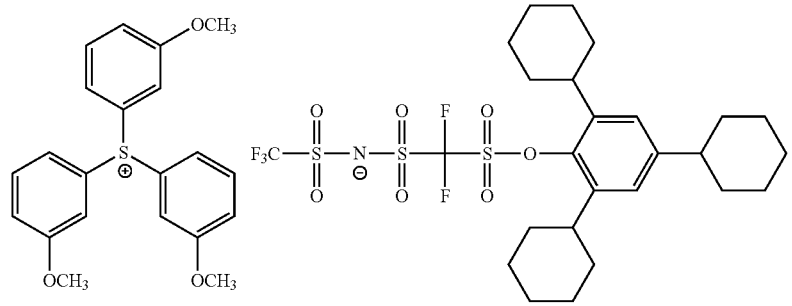
(z11)
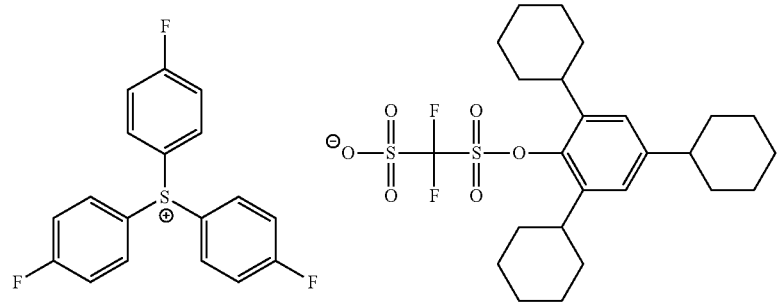
(z12)
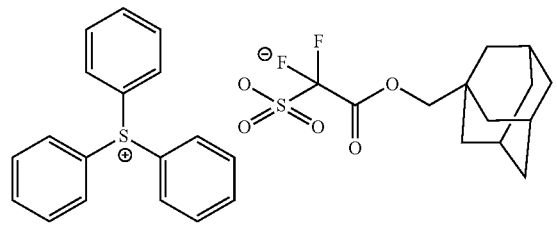
(z13)
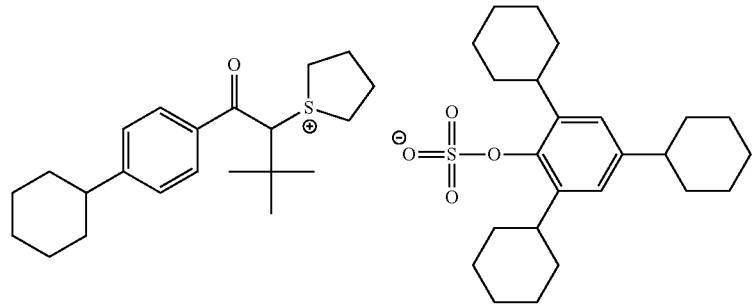
(z14)
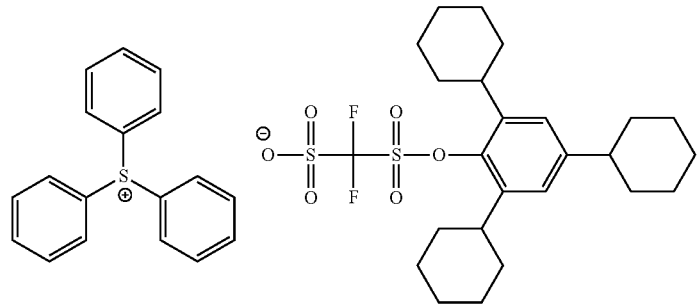
(z15)

(z16)
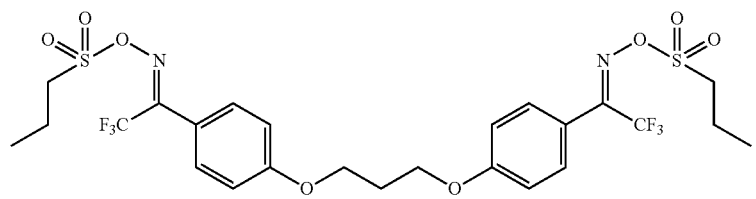
(z17)
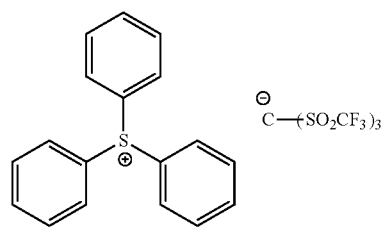
(z18)
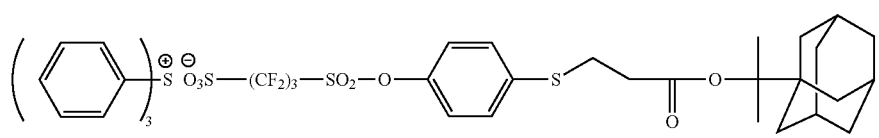
(z19)
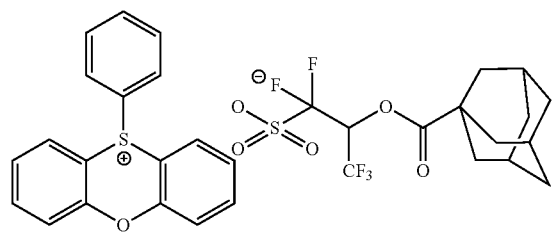
(z20)
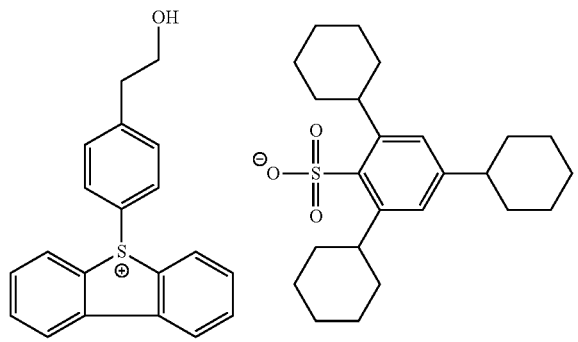
(z21)
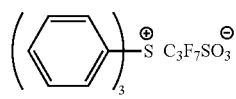
(z22)
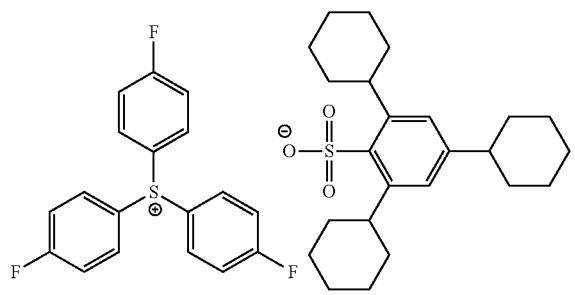
(z23)
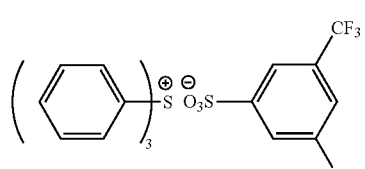
(z24)
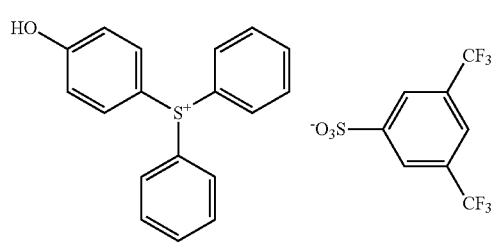

-continued
(z25) 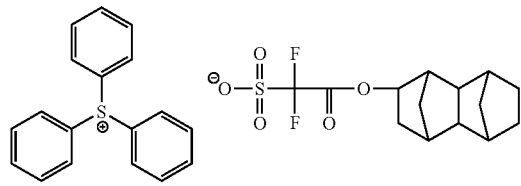
(z26) 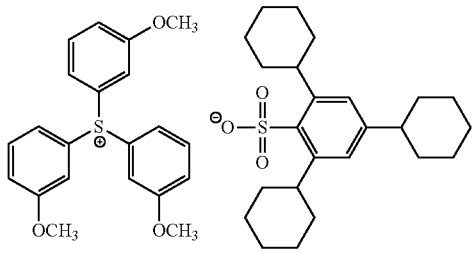
(z27) 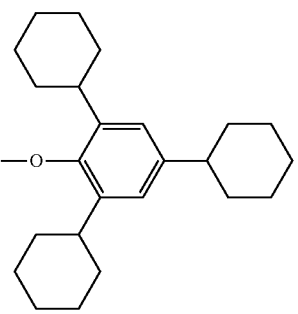
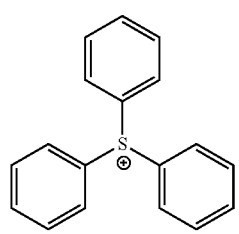
(z28) 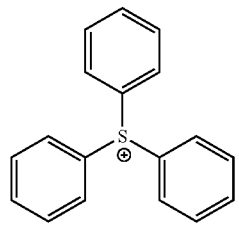
(z29) 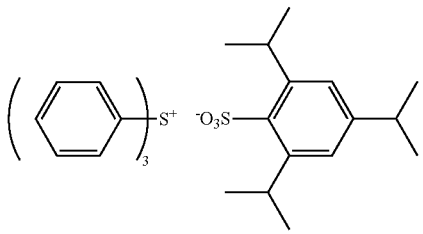
(z30) 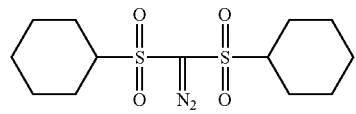
(z31) 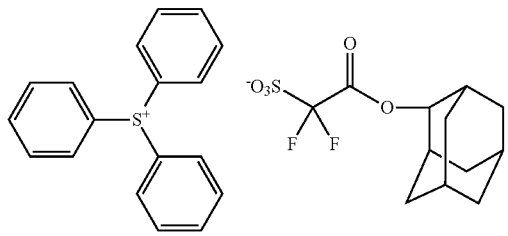
(z32) 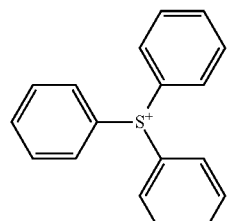 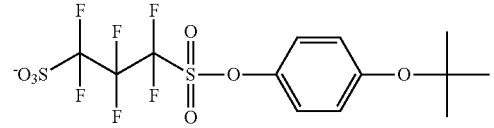
(z33) 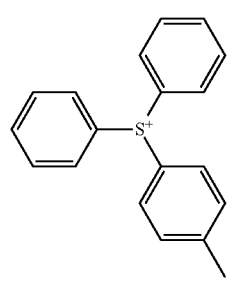 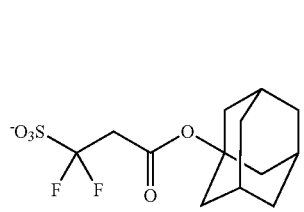

(z34) 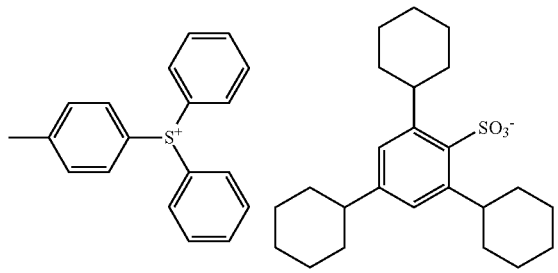

(z35) 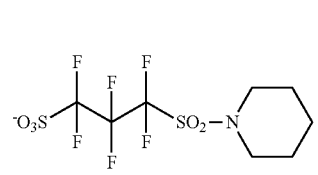

(z36) 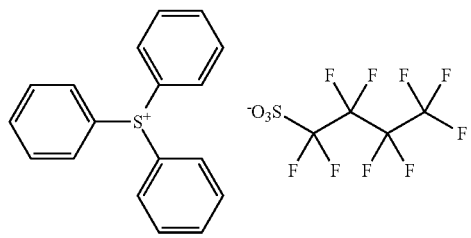

(z37) 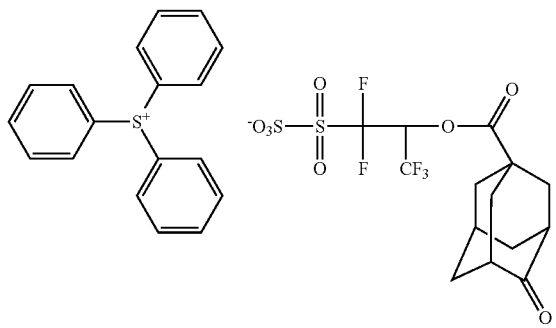

The photoacid generators may be used singly or in combination of two or more kinds thereof.

A content of the photoacid generator (in a case where the photoacid generators are present in a plural number, a total content thereof) in the composition of the embodiment of the present invention is preferably 0.1% to 50.0% by mass, more preferably 5.0% to 40.0% by mass, and still more preferably 5.0% to 35.0% by mass, with respect to a total solid content of the composition.

<Acid Diffusion Control Agent>

The composition of the embodiment of the present invention preferably includes an acid diffusion control agent. The acid diffusion control agent acts as a quencher that suppresses a reaction of the acid-decomposable resin in the unexposed portion by excessive generated acids by trapping the acids generated from a photoacid generator and the like upon exposure. For example, a basic compound (DA), a compound (DB) whose basicity is reduced or lost upon irradiation with actinic rays or radiation, or the like can be used as the acid diffusion control agent.

As the basic compound (DA), compounds having structures represented by Formulae (A) to (E) are preferable.

(A) 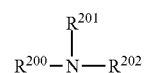

(B) 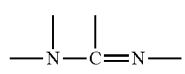

(C) 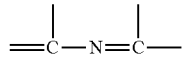

(D) 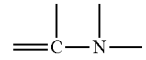

-continued (E) 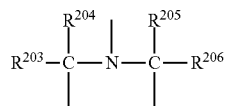

In General Formulae (A) and (E), $R^{200}$, $R^{201}$, and $R^{202}$ each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). $R^{201}$ and $R^{202}$ may be bonded to each other to form a ring.

In General Formula (E), $R^{203}$, $R^{204}$, $R^{205}$, and $R^{206}$ each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

Examples of the compound having an imidazole structure include imidazole, 2,4,5-triphenylimidazole, and benzimidazole.

Examples of the compound having a diazabicyclo structure include 1,8-diazabicyclo [5,4,0]undec-7-ene.

Examples of the compound having an onium hydroxide structure include triarylsulfonium hydroxide, phenacylsulfonium hydroxide, and sulfonium hydroxide having a 2-oxoalkyl group (specifically triphenylsulfonium hydroxide, tris(t-butylphenyl)sulfonium hydroxide, bis(t-butylphenyl) iodonium hydroxide, phenacylthiophenium hydroxide, and 2-oxopropylthiophenium hydroxide).

The compound having an onium carboxylate structure is a compound formed by carboxylation of an anionic moiety of a compound having an onium hydroxide structure, and examples thereof include acetate, adamantane-1-carboxylate, and perfluoroalkyl carboxylate.

Examples of the compound having a trialkylamine structure include tri(n-butyl)amine and tri(n-octyl)amine.

Examples of the compound having an aniline structure or a pyridine structure include 2,6-diisopropylaniline, N,N-dimethylaniline, N,N-dibutylaniline, and N,N-dihexylaniline.

Examples of the alkylamine derivative having a hydroxyl group and/or an ether bond include ethanolamine, diethanolamine, triethanolamine, and tris(methoxyethoxyethyl)amine.

Examples of the aniline derivative having a hydroxyl group and/or an ether bond include N,N-bis(hydroxyethyl) aniline.

Moreover, a superorganic base can also be used as the basic compound (DA).

Examples of the superorganic base include guanidine bases such as tetramethylguanidine and polyguanidine (including guanidine and guanidine derivatives such as substituted forms thereof and polyguanides), amidine-based and guanidine-based polynitrogen polyheterocyclic compounds and polymer-carrying strong bases thereof, typified by diazabicyclononene (DBN), diazabicycloundecene (DBU), triazabicyclodecene (TBD), N-methyl-triazabicyclodecene (MTBD), and the like, phosphazene-based (Schweisinger) bases, and proazaphosphatran (Verkade) bases.

Moreover, as the basic compound (DA), an amine compound and an ammonium salt compound can also be used.

Examples of the amine compound include primary, secondary, and tertiary amine compounds, and the amine compound is preferably an amine compound in which at least one or more alkyl groups (preferably having 1 to 20 carbon atoms) are bonded to nitrogen atoms, and more preferably the tertiary amine compound among those.

Furthermore, in a case where the amine compound is the secondary or tertiary amine compound, examples of a group bonded to the nitrogen atom in the amine compound include, in addition to the above-described alkyl groups, a cycloalkyl group (preferably having 3 to 20 carbon atoms) and an aryl group (preferably having 6 to 12 carbon atoms).

In addition, the amine compound preferably includes an oxyalkylene group. The number of the oxyalkylene groups contained in the amine compounds within the molecule is preferably 1 or more, more preferably 3 to 9, and still more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and the oxyethylene group is more preferable.

Examples of the ammonium salt compound include primary, secondary, tertiary, and quaternary ammonium salt compounds, and an ammonium salt compound in which one or more alkyl groups are bonded to a nitrogen atom is preferable.

Furthermore, in a case where the ammonium salt compound is a secondary, tertiary, or quaternary ammonium salt compound, examples of a group which is bonded to a nitrogen atom in the ammonium salt compound include, in addition to the above-described alkyl groups, a cycloalkyl group (preferably having 3 to 20 carbon atoms) and an aryl group (preferably having 6 to 12 carbon atoms).

In addition, the ammonium salt compound preferably includes an oxyalkylene group. The number of the oxyalkylene groups contained in the amine compounds within the molecule is preferably 1 or more, more preferably 3 to 9, and still more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and the oxyethylene group is more preferable.

Examples of the anion of the ammonium salt compound include a halogen atom, a sulfonate, a borate, and a phosphate, and among these, the halogen atom or the sulfonate is preferable.

As the halogen atom, a chlorine atom, a bromine atom, or an iodine atom is preferable.

As the sulfonate, an organic sulfonate having 1 to 20 carbon atoms is preferable, and preferred specific examples thereof include alkyl sulfonate and aryl sulfonate, having 1 to 20 carbon atoms. The alkyl group of the alkyl sulfonate may have a substituent, and examples of the substituent include a fluorine atom, a chlorine atom, a bromine atom, an alkoxy group, an acyl group, and an aromatic ring group. Examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. In addition, examples of the aryl group of the aryl sulfonate include a benzene ring group, a naphthalene ring group, and an anthracene ring group. As the substituent which can be contained in the benzene ring group, the naphthalene ring group, and the anthracene ring group, a linear or branched alkyl group having 1 to 6 carbon atoms (which may be linear or branched) or a cycloalkyl group having 3 to 6 carbon atoms is preferable. Specific examples of the alkyl group and the cycloalkyl group include a methyl group, an ethyl group, an n-propyl group, an isopropyl group, an n-butyl group, an i-butyl group, a t-butyl group, an n-hexyl group, and a cyclohexyl group.

The alkyl group and the cycloalkyl group may have another substituent, and examples of such another substituent include an alkoxy group having 1 to 6 carbon atoms, a halogen atom, a cyano group, a nitro group, an acyl group, and an acyloxy group.

Moreover, as the basic compound (DA), an amine compound having a phenoxy group and an ammonium salt compound having a phenoxy group can also be used.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of a substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group. The substitution position of the substituent may be any of 2- to 6-positions. The number of the substituents may be any one of 1 to 5.

The amine compound having a phenoxy group and the ammonium salt compound having a phenoxy group each preferably have at least one oxyalkylene group between the phenoxy group and the nitrogen atom. The number of the oxyalkylene groups contained in the amine compounds within the molecule is preferably 1 or more, more preferably 3 to 9, and still more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

The amine compound having a phenoxy group can be obtained by heating a mixture of a primary or secondary amine having a phenoxy group and a haloalkyl ether to perform a reaction, then adding an aqueous solution of a strong base (for example, sodium hydroxide, potassium hydroxide, and tetraalkylammonium) to a reaction system, and extracting the reaction product with an organic solvent (for example, ethyl acetate and chloroform). Alternatively, the amine compound having a phenoxy group can also be obtained by heating a mixture of a primary or secondary amine and a haloalkyl ether having a phenoxy group at the terminal to perform a reaction, then adding an aqueous solution of a strong base to the reaction system, and extracting the reaction product with an organic solvent.

The compound (DB) whose basicity is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to α-conjugation. The nitrogen atom having an unshared electron pair not contributing to α-conjugation is, for example, a nitrogen atom having a partial structure represented by the following general formula.

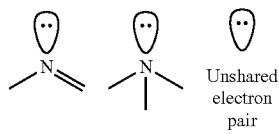

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

With regard to specific examples of the compound (DB), reference can be made to those described in paragraphs [0421] to [0428] of JP2014-041328A or paragraphs [0108] to [0116] of JP2014-134686A, the contents of which are incorporated herein by reference.

Specific examples of the basic compound (DA) and the compound (DB) are shown below, but the present invention is not limited.

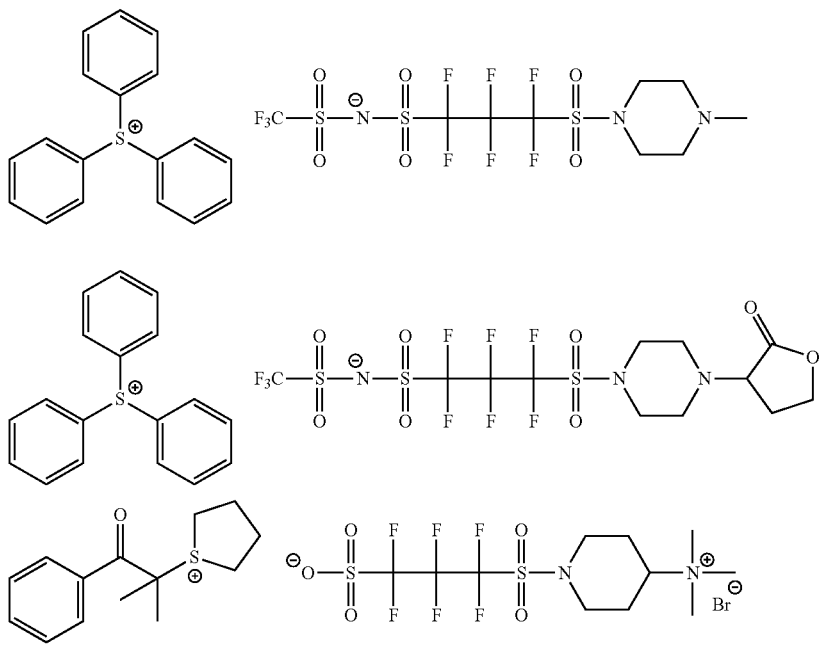

-continued
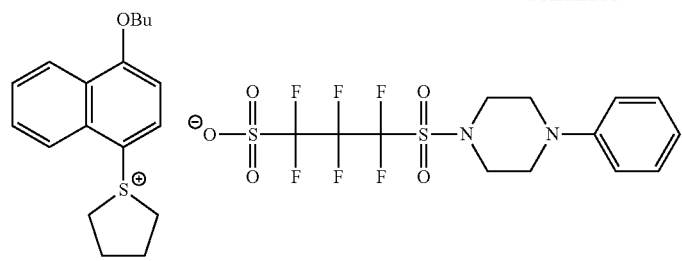
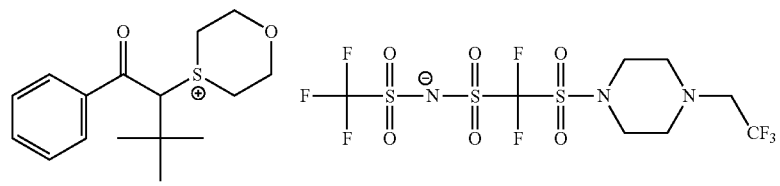
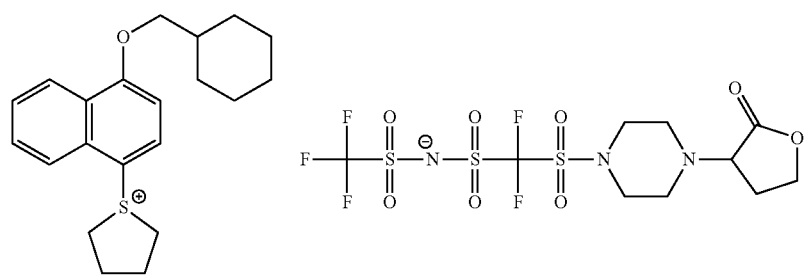
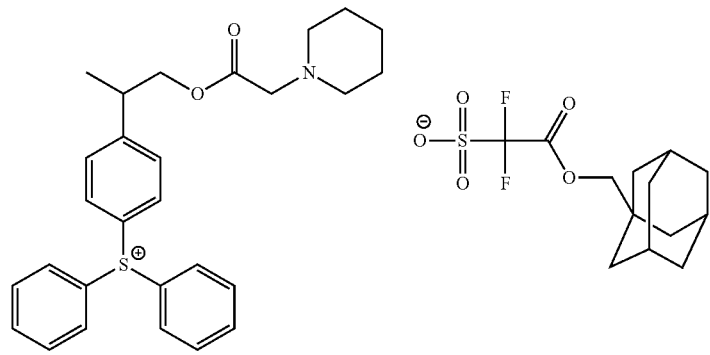
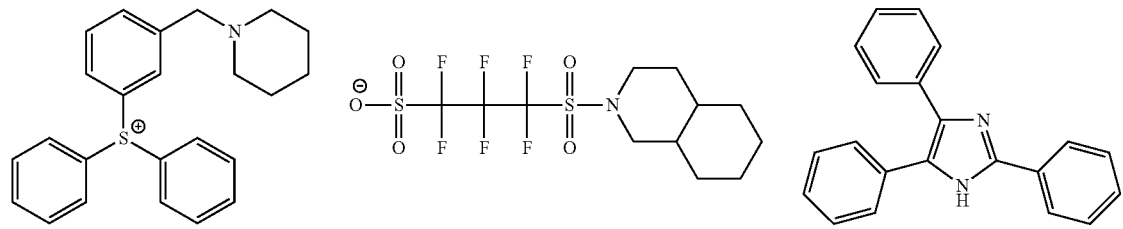
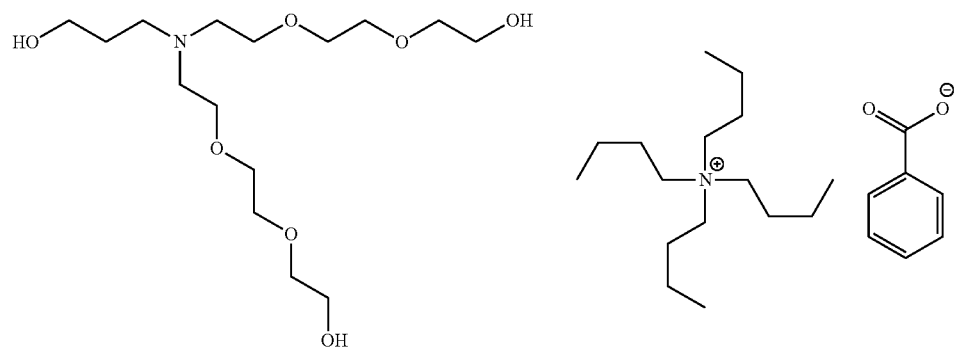

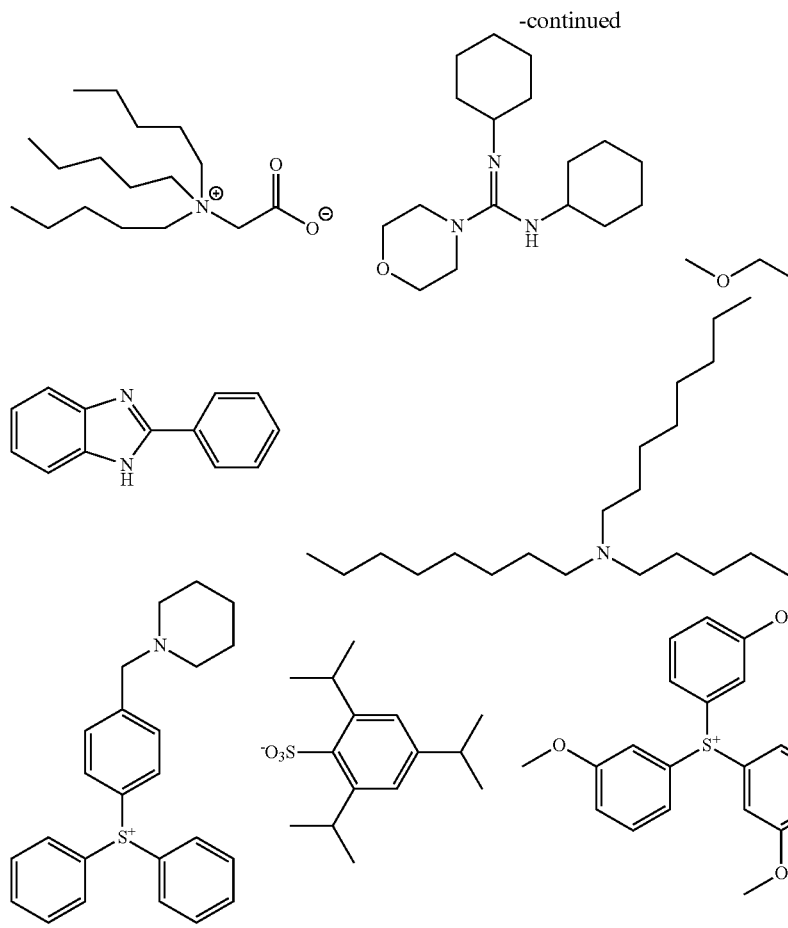

The acid diffusion control agents may be used singly or in combination of two or more kinds thereof.

A content of the acid diffusion control agent (in a case where the acid diffusion control agents are present in a plural number, a total content thereof) in the composition of the embodiment of the present invention is preferably 0.001% to 10% by mass, and more preferably 0.01% to 7.0% by mass, with respect to the total solid content of the composition.

Moreover, as the acid diffusion control agent, for example, the compounds (amine compounds, amido group-containing compounds, urea compounds, nitrogen-containing heterocyclic compounds, and the like) described in paragraphs [0140] to [0144] of JP2013-011833A can also be used.

<Surfactant>

The composition of the embodiment of the present invention may include a surfactant. By incorporating the surfactant into the composition, it is possible to provide a resist pattern having improved adhesiveness and less development defects with good sensitivity and resolution in a case where an exposure light source at a wavelength of 250 nm or less, and particularly 220 nm or less is used.

As the surfactant, fluorine-based and/or silicon-based surfactants are preferable.

Examples of the fluorine-based and/or silicon-based surfactants include the surfactants described in paragraph [0276] of the specification of US2008/0248425A. In addition, EFTOP EF301 and EF303 (manufactured by Shin-Akita Chemical Co., Ltd.); FLUORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.), TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); KH-20 (manufactured by Asahi Kasei Co., Ltd.); or FTX-204G, 208G, 218G, 230G, 204D, 208D, 212D, 218D, and 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoroaliphatic compound manufactured using a telomerization method (also referred to as a telomer method) or an oligomerization method (also referred to as an oligomer method). Specifically, a polymer including a fluoroaliphatic group derived from fluoroaliphatic compound may be used as the surfactant. This fluoroaliphatic compound can be synthesized, for example, by the method described in JP2002-090991A.

In addition, a surfactant other than the fluorine-based surfactant and/or the silicon-based surfactants described in paragraph [0280] of the specification of US2008/0248425A may be used.

These surfactants may be used singly or in combination of two or more kinds thereof.

A content of the surfactant in the composition of the embodiment of the present invention is preferably 0.0001% to 2.0% by mass, and more preferably 0.0005% to 1.0% by mass, with respect to the total solid content of the composition.

<Hydrophobic Resin>

The composition of the embodiment of the present invention may include a hydrophobic resin. Further, the hydrophobic resin is a resin which is different from the resin (X).

In a case where the composition of the embodiment of the present invention includes the hydrophobic resin, it is possible to control the static/dynamic contact angle on a surface of an actinic ray-sensitive or radiation-sensitive film. Thus, it is possible to improve development characteristics, suppress generation of out gas, improve immersion liquid tracking properties upon liquid immersion exposure, and reduce liquid immersion defects, for example.

It is preferable that the hydrophobic resin is designed to be unevenly distributed on a surface of a resist film, but unlike the surfactant, the hydrophobic resin does not necessarily have a hydrophilic group in a molecule thereof and does not necessarily contribute to homogeneous mixing of polar/non-polar materials.

The hydrophobic resin is preferably a resin having a repeating unit having at least one selected from a "fluorine atom", a "silicon atom", or a "$CH_3$ partial structure which is contained in a side chain portion of a resin" from the viewpoint of uneven distribution on a film surface layer, and more preferably has two or more types.

In a case where the hydrophobic resin includes a fluorine atom and/or a silicon atom, the fluorine atom and/or the silicon atom described above in the hydrophobic resin may be included in the main chain of a resin or may be included in a side chain.

In a case where the hydrophobic resin includes a fluorine atom, it is preferably a resin which has an alkyl group having a fluorine atom, a cycloalkyl group having a fluorine atom, or an aryl group having a fluorine atom as a partial structure having a fluorine atom.

The hydrophobic resin preferably has at least one group selected from the following (x) to (z) groups:

(x) an acid group, (y) a group whose solubility in an alkali developer increases through decomposition by the action of an alkali developer (hereinafter also referred to as a polarity converting group), and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol), the sulfonimido group, or the bis(alkylcarbonyl)methylene group is preferable.

Examples of the group (y) whose solubility in an alkali developer increases through decomposition by the action of the alkali developer include a lactone group, a carboxylic ester group (—COO—), an acid anhydride group (—C(O)OC(O)—), an acid imido group (—NHCONH—), a carboxylic thioester group (—COS—), a carbonate ester group (—OC(O)O—), a sulfuric ester group (—$OSO_2O$—), and a sulfonic ester group (—$SO_2O$—), and the lactone group or the carboxylic ester group (—COO—) is preferable.

The repeating unit including such the group is, for example, a repeating unit in which the group is directly bonded to the main chain of a resin, and examples thereof include a repeating unit with an acrylic ester or a methacrylic ester. In this repeating unit, such the group may be bonded to the main chain of the resin via a linking group. Alternatively, this repeating unit may also be incorporated into a terminal of the resin by using a polymerization initiator or a chain transfer agent having such the group during polymerization.

Examples of the repeating unit having a lactone group include the same ones as those of the repeating unit having a lactone structure described earlier in the section of the resin (X).

The content of the repeating unit having the group (y) whose solubility in an alkali developer increases through decomposition by the action of the alkali developer is preferably 1% to 100% by mole, more preferably 3% to 98% by mole, and still more preferably 5% to 95% by mole, with respect to all the repeating units in the hydrophobic resin.

Examples of the repeating unit having the group (z) that decomposes by the action of an acid in the hydrophobic resin include the same ones as the repeating units having an acid-decomposable group exemplified in the resin (X). The repeating unit having the group (z) that decomposes by the action of an acid may have at least any one of a fluorine atom or a silicon atom. A content of the repeating unit having a group (z) that decomposes by the action of an acid is preferably 1% to 80% by mole, more preferably 10% to 80% by mole, and still more preferably 20% to 60% by mole, with respect to all the repeating units in the hydrophobic resin.

The hydrophobic resin may further have a repeating unit which is different from the above-mentioned repeating units.

A content of the repeating unit including a fluorine atom is preferably 10% to 100% by mole, and more preferably 30% to 100% by mole, with respect to all the repeating units in the hydrophobic resin. Further, the content of the repeating units including a silicon atom is preferably 10% to 100% by mole, and more preferably 20% to 100% by mole, with respect to all the repeating units in the hydrophobic resin.

On the other hand, in a case where the hydrophobic resin includes a $CH_3$ partial structure in the side chain portion thereof, it is also preferable that the hydrophobic resin has a form not having substantially any one of a fluorine atom and a silicon atom. Further, it is preferable that the hydrophobic resin is substantially constituted with only repeating units which are constituted with only atoms selected from a carbon atom, an oxygen atom, a hydrogen atom, a nitrogen atom, and a sulfur atom.

The weight-average molecular weight of the hydrophobic resin in terms of standard polystyrene is preferably 1,000 to 100,000, and more preferably 1,000 to 50,000.

A total content of the residual monomers and/or oligomer components included in the hydrophobic resin is preferably 0.01% to 5% by mass, and more preferably 0.01% to 3% by mass. Further, the dispersity (Mw/Mn) is preferably in the range of 1 to 5, and more preferably in the range of 1 to 3.

As the hydrophobic resin, known resins can be appropriately selected and used singly or as a mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin (E). Further, the repeating units disclosed in paragraphs [0177] to [0258] of the specification of US2016/0237190A1 are also preferable as a repeating unit constituting the hydrophobic resin (E).
Preferred examples of a monomer corresponding to the repeating unit constituting the hydrophobic resin are shown below.
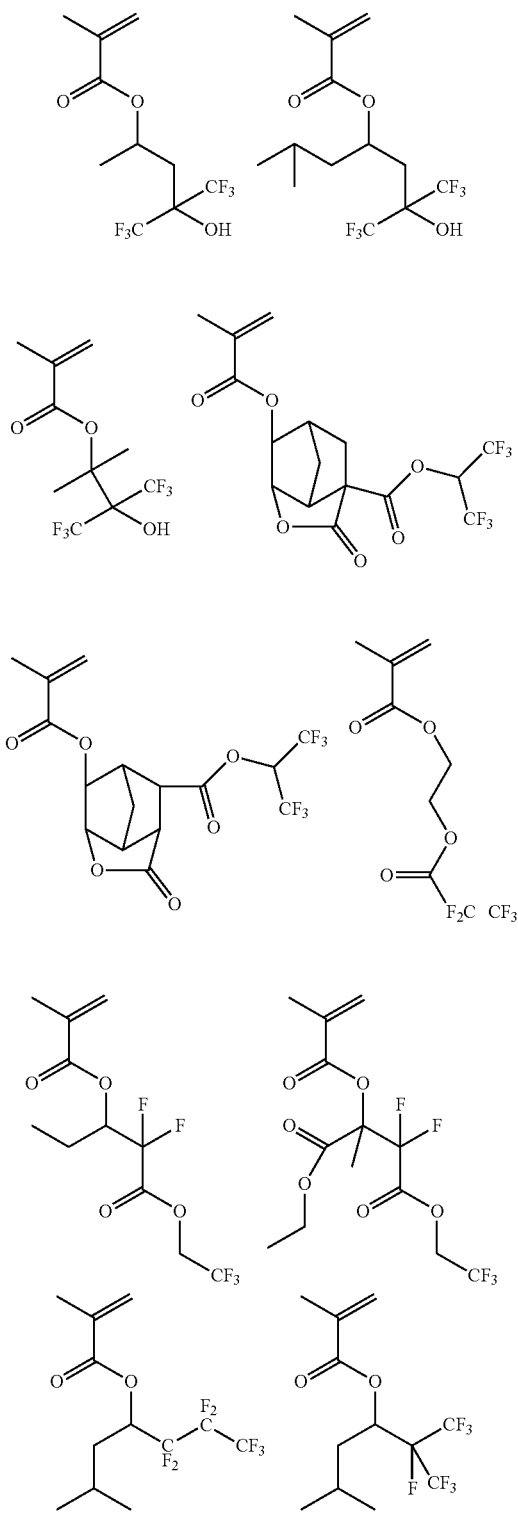
-continued
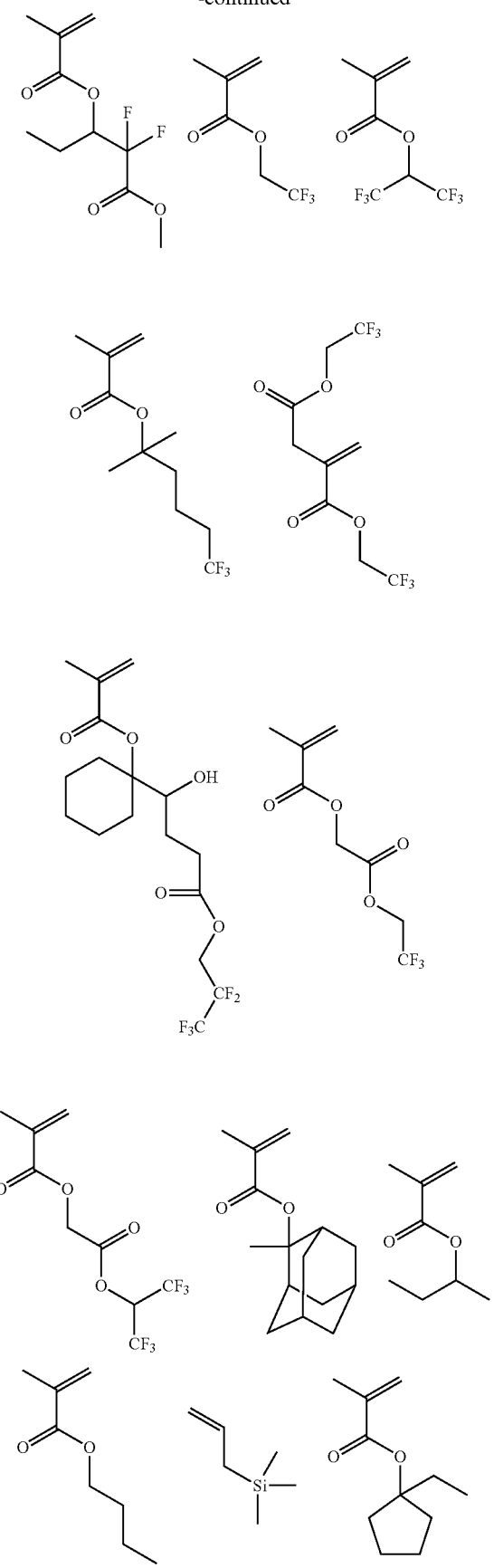

-continued

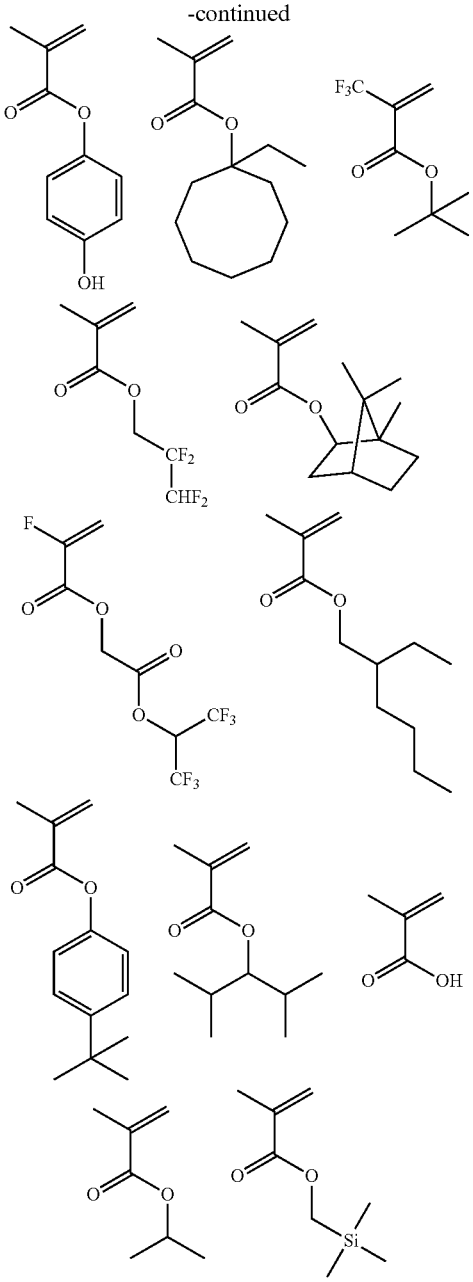

The hydrophobic resin may be used singly or in combination of two or more kinds thereof.

It is preferable to use a mixture of two or more kinds of hydrophobic resins having different levels of surface energy from the viewpoint of satisfying both the immersion liquid tracking properties and the development characteristics upon liquid immersion exposure.

A content of the hydrophobic resin in the composition (in a case where the hydrophobic resins are present in a plural number, a total content thereof) is preferably 0.01% to 10.0% by mass, and more preferably 0.05% to 8.0% by mass, with respect to the total solid content in the composition.

<Solvent>

The composition of the embodiment of the present invention may include a solvent.

The solvent preferably includes at least any one of the following component (M1) or the following component (M2), and among these, the solvent more preferably includes the following component (M1).

In a case where the solvent includes the following component (M1), it is preferable that the solvent consists of substantially only the component (M1) or is a mixed solvent including at least the component (M1) and the component (M2).

Hereinafter, the component (M1) and the component (M2) will be shown.

Component (M1): Propylene glycol monoalkyl ether carboxylate

Component (M2): A solvent selected from the following component (M2-1) or a solvent selected from the following component (M2-2)

Component (M2-1): Propylene glycol monoalkyl ether, lactic ester, acetic ester, butyl butyrate, alkoxy propionic ester, chained ketone, cyclic ketone, lactone, or alkylene carbonate Component (M2-2): Another solvent having a flash point (also referred to as fp) of 37° C. or higher.

In a case where the solvent and the above-described resin (X) are used in combination, the coating property of the composition is improved and a pattern having a less number of development defects can be obtained. Although a reason therefor is not necessarily clear, it is considered that the solvent has a good balance among the solubility, the boiling point, and the viscosity of the above-described resin (X), and therefore, unevenness in the film thickness of a resist film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and the propylene glycol monomethyl ether acetate (PGMEA) is more preferable.

As the component (M2-1), the following ones are preferable.

As the propylene glycol monoalkyl ether, propylene glycol monomethyl ether (PGME) or propylene glycol monoethyl ether is preferable.

As the lactic ester, ethyl lactate, butyl lactate, or propyl lactate is preferable.

As the acetic ester, methyl acetate, ethyl acetate, butyl acetate, isobutyl acetate, propyl acetate, isoamyl acetate, methyl formate, ethyl formate, butyl formate, propyl formate, or 3-methoxybutyl formate is preferable.

As the alkoxy propionic ester, methyl 3-methoxypropionate (MMP), or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, g-butyrolactone is preferable.

As the alkylene carbonate, propylene carbonate is preferable.

As the component (M2-1), propylene glycol monomethyl ether (PGME), ethyl lactate, ethyl 3-ethoxypropionate, methyl amyl ketone, cyclohexanone, butyl acetate, pentyl acetate, g-butyrolactone, or propylene carbonate is more preferable.

Specific examples of the component (M2-2) include propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), and propylene carbonate (fp: 132° C.). Among those, propylene glycol monoethyl ether, ethyl lactate, pentyl acetate, or cyclohexanone is preferable, and propylene glycol monoethyl ether or ethyl lactate is more preferable.

In addition, the "flash point" herein means the value described in a reagent catalog of Tokyo Chemical Industry Co., Ltd. or Sigma-Aldrich Co. LLC.

The mixing ratio (mass ratio: M1/M2) of the component (M1) to the component (M2) is preferably 100/0 to 15/85, more preferably in the range of 100/0 to 40/60, and still more preferably in the range of 100/0 to 60/40, from the viewpoint that the number of development defects is further decreased.

Moreover, the solvent may include solvents other than the component (M1) and the component (M2). In this case, the content of the solvents other than the components (M1) and (M2) is preferably 5% to 30% by mass with respect to the total mass of the solvent.

Examples of such other solvents include ester-based solvents having 7 or more carbon atoms (preferably 7 to 14 carbon atoms, more preferably 7 to 12 carbon atoms, and still more preferably 7 to 10 carbon atoms) and 2 or less heteroatoms. Furthermore, the ester-based solvents having 7 or more carbon atoms and 2 or less heteroatoms do not include solvents corresponding to the above-described component (M2).

As the ester-based solvents having 7 or more carbon atoms and 2 or less heteroatoms, amyl acetate, 2-methylbutyl acetate, 1-methylbutyl acetate, hexyl acetate, pentyl propionate, hexyl propionate, butyl propionate, isobutyl isobutyrate, heptyl propionate, butyl butanoate, or the like is preferable, and isoamyl acetate is more preferable.

<Other Additives>

The composition of the embodiment of the present invention may further include a dissolution inhibiting compound (a compound whose solubility in an organic developer decreases through decomposition by the action of an acid, with a molecular weight thereof being preferably 3,000 or less), a dye, a plasticizer, a light sensitizer, a light absorber, and/or a compound that accelerates dissolution in a developer (for example, a phenol compound having a molecular weight of 1,000 or less, or an alicyclic or aliphatic compound including a carboxyl group).

<Preparation Method>

The concentration of the solid content in the composition of the embodiment of the present invention is preferably 0.5% to 30% by mass, more preferably 1.0% to 20.0% by mass, and still more preferably 1.0% to 10.0% by mass, from the viewpoint that the coating property is more excellent. The concentration of the solid content is a mass percentage of other resist components excluding the solvent with respect to the total mass of the composition.

In addition, the film thickness of a resist film (an actinic ray-sensitive or radiation-sensitive film) formed of the composition of the embodiment of the present invention is generally 200 nm or less, and more preferably 100 nm or less, from the viewpoint of improving resolving power. For example, it is preferable that the film thickness of a resist film thus formed is 90 nm or less in order to resolve a 1:1 line-and-space pattern with a line width of 20 nm or less. In a case where the film thickness is 90 nm or less, more excellent resolution performance is obtained due to suppressed pattern collapse upon application of a developing step which will be described later.

In a case of EUV exposure or exposure with electron beams, the film thickness range is preferably 15 to 60 nm. Such a film thickness can be obtained by setting to the concentration of the solid content in the composition to an appropriate range to provide the composition with a suitable viscosity and improve the coating property or the film forming property.

The composition of the embodiment of the present invention is used by dissolving the components in a predetermined organic solvent, and preferably the mixed solvent, and filtering the solution through a filter and applying it onto a predetermined support (substrate). The pore size of a filter for use in filtration through the filter is preferably pore size of 0.1 μm or less, more preferably 0.05 μm or less, and still more preferably 0.03 μm or less. The filter is preferably a polytetrafluoroethylene-made, polyethylene-made, or nylon-made filter. In the filtration through a filter as shown in the specification of JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration through a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Pattern Forming Method]

The present invention also relates to a pattern forming method using the actinic ray-sensitive or radiation-sensitive resin composition. Hereinafter, the pattern forming method of the embodiment of the present invention will be described. In addition, the resist film of the embodiment of the present invention will also be described, together with the pattern forming method.

The pattern forming method of the embodiment of the present invention includes:

(i) a step of forming a resist film (actinic ray-sensitive or radiation-sensitive film) on a support with the above-described actinic ray-sensitive or radiation-sensitive resin composition (resist film forming step), (ii) a step of exposing the resist film (irradiating actinic rays or radiation) (exposing step), and (iii) a step of developing the exposed resist film with a developer (developing step).

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the film forming step (i), the exposing step (ii), and the developing step (iii) described above can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-described acid diffusion control agent.

The film thickness of the protective film is preferably 10 to 200 nm, more preferably 20 to 100 nm, and still more preferably 40 to 80 nm.

The support is not particularly limited, and a substrate which is generally used in a step of manufacturing a semiconductor such as an IC, and a process for manufacturing a circuit board for a liquid crystal, a thermal head, or the like, and other lithographic processes of photofabrication can be used. Specific examples of the support include an inorganic substrate such as silicon, $SiO_2$, and SiN.

For any of the prebaking step (iv) and the post-exposure baking step (v), the baking temperature is preferably 80° C. to 150° C., more preferably 80° C. to 140° C., and still more preferably 80° C. to 130° C.

For any of the prebaking step (iv) and the post-exposure baking step (v), the baking time is preferably 30 to 1,000 seconds, more preferably 60 to 800 seconds, and still more preferably 60 to 600 seconds.

The baking may be performed using a unit included in an exposure apparatus and a development device, or may also be performed using a hot plate or the like.

A light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, the KrF excimer laser, the ArF excimer laser, EUV, or the electron beams are preferable, and EUV or the electron beams are more preferable.

In the developing step (iii), the developer may be either an alkali developer or a developer including an organic solvent (hereinafter also referred to as an organic developer).

As an alkali component included in the alkali developer, a quaternary ammonium salt typified by tetramethylammonium hydroxide is usually used. In addition, an aqueous alkali solution including an alkali component such as an inorganic alkali, primary to tertiary amines, alcohol amines, and cyclic amines can also be used.

Furthermore, the alkali developer may include an appropriate amount of alcohols and/or a surfactant. The alkali concentration of the alkali developer is usually 0.1% to 20% by mass. The pH of the alkali developer is usually 10 to 15.

A time period for performing development the using the alkali developer is usually 10 to 300 seconds.

The alkali concentration, the pH, and the development time using the alkali developer can be appropriately adjusted depending on a pattern formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-described acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the resist pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the solvents.

The moisture content in the rinsing liquid is preferably 10% by mass or less, more preferably 5% by mass or less, and still more preferably 3% by mass or less. By setting the moisture content to 10% by mass or less, good development characteristics are obtained.

The rinsing liquid may include an appropriate amount of a surfactant.

In the rinsing step, the substrate that has been subjected to development using an organic developer is subjected to a washing treatment using a rinsing liquid including an organic solvent. A method for the washing treatment method is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (postbaking). The developer and the rinsing liquid remaining between and inside the patterns are removed by the baking step. In the baking step after the rinsing step, the baking temperature is usually 40° C. to 160° C., and preferably 70° C. to 95° C., and the baking time is typically 10 seconds to 3 minutes, and preferably 30 to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metal components, isomers, and residual monomers. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in the specification of JP2016-206500A.

In addition, as a method for reducing the impurities such as metals included in the various materials, metal content selects the less material as a raw material constituting the various materials, performing filtering using a filter of the raw material constituting the various materials, equipment the inner and a method such as performing distillation under conditions suppressing as much as possible equal to contamination is lined with TEFLON (registered trademark). Preferred conditions in the filtering using a filter to be performed on the raw material constituting the various materials are similar to the above-described conditions.

In order to prevent impurities from being incorporated, it is preferable that various materials are stored in the container described in the specification of US2015/0227049A, the specification of JP2015-123351A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

[Resin]

The present invention also relates to a resin which can be used in the composition described above.

The resin is a resin whose polarity increases by the action of an acid and includes the above-mentioned repeating unit represented by General Formula (B-1), in which a content of the repeating unit represented by General Formula (B-1) is 5% to 70% by mass with respect to all the repeating units in the resin.

The resin corresponds to the above-mentioned resin (X). Suitable aspects of the resin (X) are also the same as mentioned above.

EXAMPLES

Hereinbelow, the present invention will be described in more detail with reference to Examples. The materials, the amounts of materials used, the proportions, the treatment details, the treatment procedure, and the like shown in the Examples below may be modified as appropriate as long as the modifications do not depart from the spirit of the present invention. Therefore, the scope of the present invention should not be construed as being limited to the Examples shown below.

[Resin]

The respective repeating units in resins P-1 to P-42 shown in Table 1 are shown below.

Furthermore, in the respective repeating units shown below, MA-9, MA-10, MA-12 to MA-19, MB-9, MB-10, MC-2, and MC-5 each correspond to the repeating unit represented by General Formula (B-1).

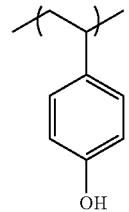

MA-1

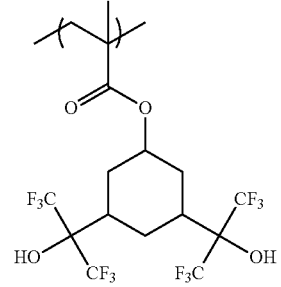

MA-2

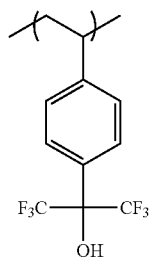

MA-3

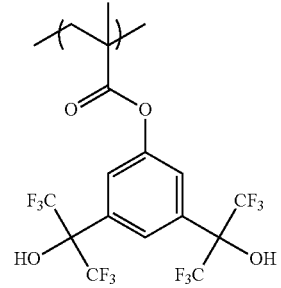

MA-4

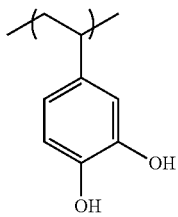

MA-5

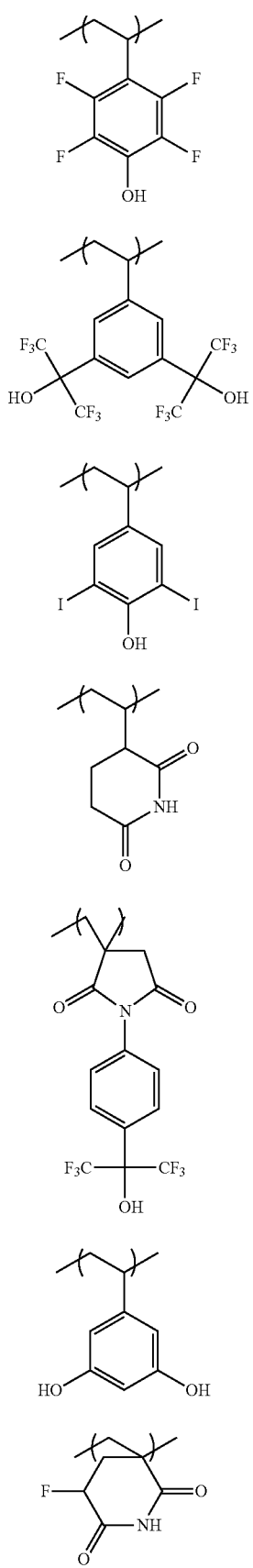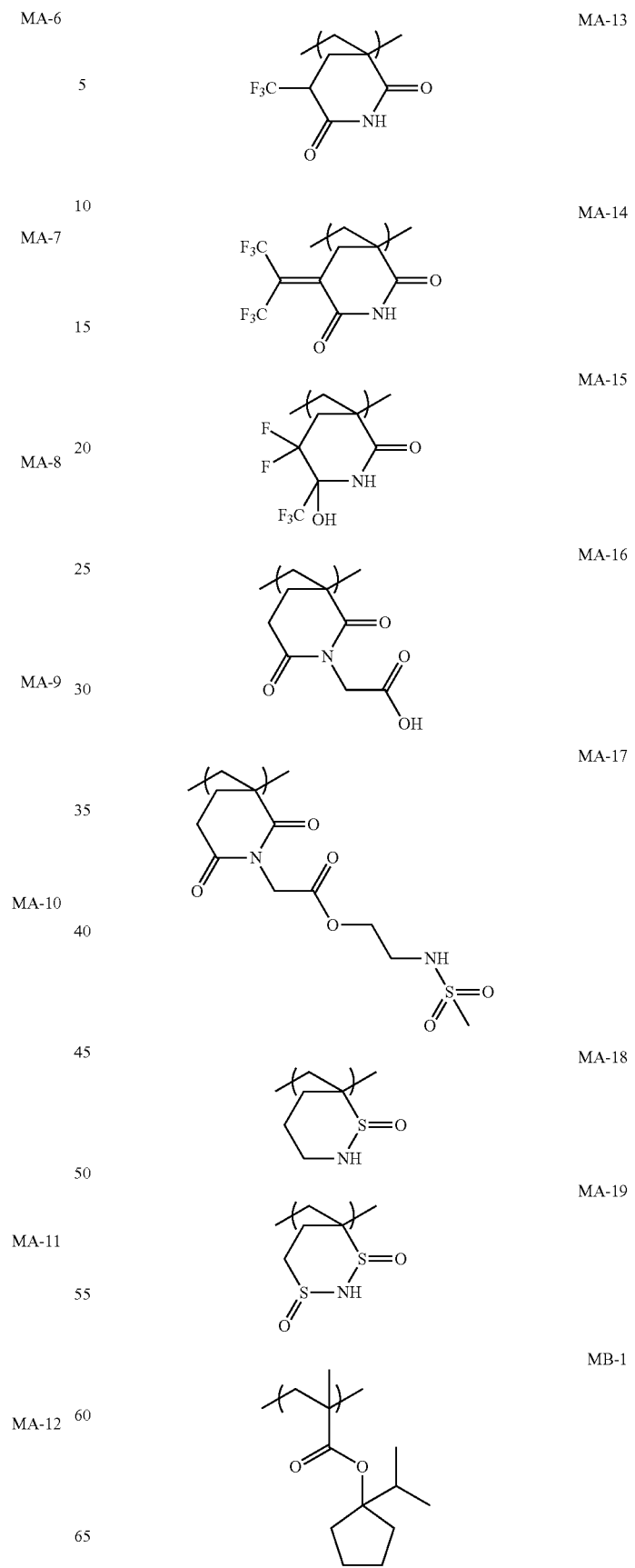

MB-2 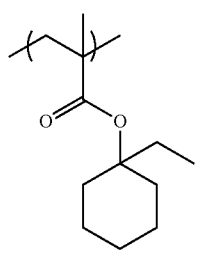
MB-3 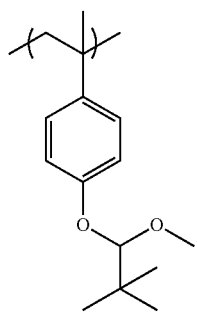
MB-4 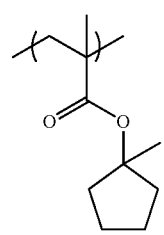
MB-5 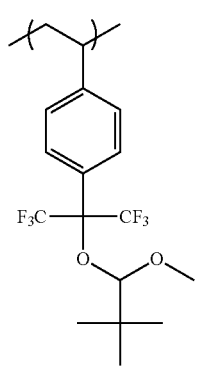
MB-6 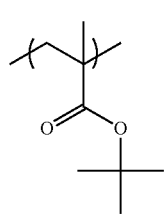
MB-7 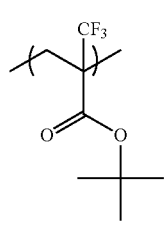
MB-8 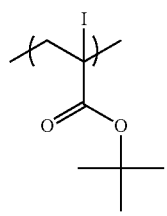
MB-9 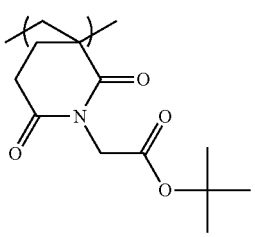
MB-10 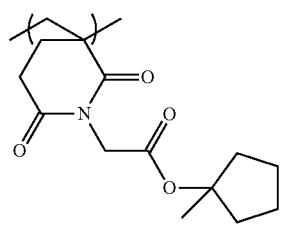
MB-11 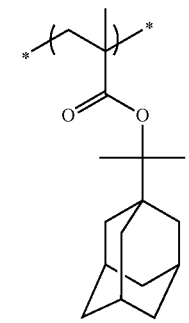
MC-1 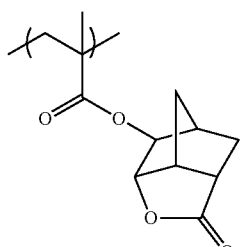
MC-2 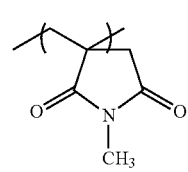

MC-3

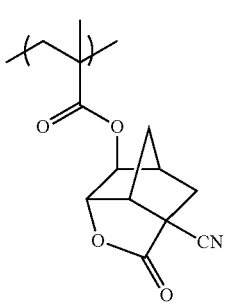

MC-4

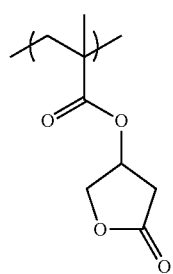

MC-5

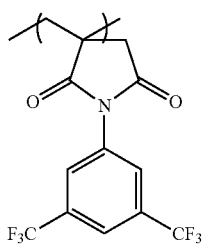

Synthesis Examples: Raw Material Monomers of Repeating Unit Represented by General Formula (B-1)

Among the repeating units, synthesis examples for monomers as a raw material of the repeating unit represented by General Formula (B-1) are shown. Further, among the above-mentioned repeating units represented by MA-9, MA-10, MA-12 to MA-19, MB-9, MB-10, MC-2, and MC-5, synthesis examples for monomers as a raw material for MA-9, MC-5, MC-2, MA-10, and MB-9 are shown below as an example. Monomers which serve as a raw material for other repeating units can also be synthesized according to the following Synthesis Examples.

Synthesis Example 1: Synthesis of Monomer MA-9

Under a nitrogen stream, 2-methyleneglutaronitrile (14.5 g, manufactured by Tokyo Kasei Co., Ltd.), acetic acid (60 mL), concentrated sulfuric acid (16.8 g), and dibutylhydroxytoluene (BHT, 0.075 g) as a polymerization inhibitor were placed in a three-necked flask and the mixture was stirred. Next, 3 mL of water and 12 mL of acetic acid were added to the three-necked flask, and the mixture was heated with stirring at 75° C. for 7 hours. The obtained reaction solution was added dropwise to an aqueous sodium hydroxide solution (3 g/120 mL) and prepared into a solution at a pH of 5 using an aqueous sodium hydroxide solution and sodium bicarbonate water. Next, 300 mL of ethyl acetate was added to the obtained solution to perform a liquid separation operation, and after performing washing with water, the organic layer was subjected to a dehydration treatment with sodium sulfate. Sodium sulfate was filtered through a filter and ethyl acetate was evaporated under reduced pressure. In order to remove acetic acid from the system, 200 mL of toluene was added to the residue and the mixture was concentrated under reduced pressure. Diisopropyl ether was added to the obtained concentrate to precipitate crystals. The precipitated white crystals were filtered and dried to obtain MA-9 (5.1 g).

Synthesis Example 2: Synthesis of Monomer MC-5

Under a nitrogen stream, 3,5-bis(trifluoromethyl)aniline (manufactured by Tokyo Kasei Co., Ltd., 100 g) and tetrahydrofuran (THF, 320 mL) were placed in a three-necked flask and the mixture was stirred. Next, itaconic acid (51.2 g) was added portionwise into the three-necked flask, and stirring was continued for 2 hours. After the obtained reaction solution was concentrated under reduced pressure, hexane was added to the obtained concentrate and the mixture was filtered through a filter. The filtrate was concentrated under reduced pressure, and then the obtained crystals were washed with hexane to obtain MC-5a (30.0 g).

MC-5a (20 g), sodium acetate (1.3 g), and acetic anhydride (12.9 g) were placed in a three-necked flask and the mixture was allowed to undergo a reaction at 85° C. for 1 hour with stirring. Next, the obtained reaction solution was cooled to room temperature, water (80 mL) and ethyl acetate (80 mL) were added to the cooled reaction solution to perform a liquid separation operation, thereby extracting an organic layer. The extracted organic layer was washed with sodium bicarbonate water and saturated saline three times each, and the washed organic layer was dried over magnesium sulfate. After performing filtration through a filter, the organic layer was concentrated under reduced pressure and purified with a silica gel column (ethyl acetate/hexane). According to the procedure, 5.5 g of crystals (MC-5) were obtained.

Synthesis Example 3: Synthesis of Monomer MC-2

MC-2 was obtained by the same operation as in Synthesis Example 2 above, except that 3,5-bis(trifluoromethyl)aniline was changed to methylamine (manufactured by Tokyo Kasei Co., Ltd., a 2-mol/L THF solution).

Synthesis Example 4: Synthesis of Monomer MA-10

MC-10 was obtained by the same operation as in Synthesis Example 2 above, except that 3,5-bis(trifluoromethyl)aniline was changed to 4-(hexafluoro-2-hydroxyisopropyl)aniline (manufactured by Tokyo Kasei Co., Ltd., manufactured by Fluorochem Ltd.).

Synthesis Example 5: Synthesis of Monomer MB-9

The monomer MA-9 (5.0 g) obtained in Synthesis Example 1, tert-butyl bromoacetate (7.8 g), potassium carbonate (6.9 g), and acetone (75 mL) were placed in a three-necked flask and the mixture was stirred at room temperature. After continuing stirring for 5 hours, ethyl acetate and water were added to the reaction solution to perform a liquid separation operation. The extracted organic layer was dried over magnesium sulfate. After filtration through a filter, the organic layer was concentrated under reduced pressure to obtain 7.2 g of crystals (MB-9).

The resins P-1 to P-42 shown in Table 1 were synthesized using the monomers. A method for synthesizing the resin P-1 is shown below as an example.

Synthesis Example P: Synthesis of Resin P-1

15.2 g, 11.5 g, 7.6 g, and 3.8 g of monomers in the order from the left side, corresponding to the respective repeating units (MA-2/MB-6/MC-5/MC-3) of the resin P-1, and a polymerization initiator V-601 (manufactured by Wako Pure Chemicals Industries, Ltd.) (1.72 g) were dissolved in cyclohexanone (54.6 g). A solution thus obtained was taken as a monomer solution.

The monomer solution was added dropwise to a reaction vessel in which cyclohexanone (23.4 g) had been placed under a nitrogen gas atmosphere for 4 hours. Further, the temperature inside the reaction vessel was adjusted to 85° C. during dropwise addition of the monomer solution. Subsequently, the obtained reaction solution was further stirred at 85° C. for 2 hours in the reaction vessel and then left to be cooled until the temperature reached room temperature.

The reaction solution after being left to be cooled was added dropwise to a mixed liquid of methanol and water (methanol/water=5/5 (mass ratio)) over 20 minutes, and the precipitated powder was collected by filtration. The obtained powder was dried to obtain the resin P-1 (19.8 g).

The compositional ratio (mass ratio) of the repeating units determined by a nuclear magnetic resonance (NMR) method was 40/30/20/10. In addition, the weight-average molecular weight of the resin P-1 as measured by gel permeation chromatography (GPC) (carrier: THF (tetrahydrofuran)) was 6,500 in terms of standard polystyrene and the dispersity (Mw/Mn) was 1.6.

Synthesis Example: Synthesis of Resins P-2 to P-42

The other resins were synthesized by the same procedure as for the resin P-1 or by the procedure in the related art.

The repeating units, the compositional ratios (mass ratios), the weight-average molecular weights (Mw), and the dispersities (Mw/Mn) of the respective resins are shown in Table 1. The compositional ratios correspond to the respective repeating units in the order from the left side.

TABLE 1

| Resin | Compositional ratio (mass ratio) | Weight-average molecular weight (Mw) | Dispersity (Mw/Mn) | Content (% by mass) of fluorine atom or iodine atom |
|---|---|---|---|---|
| P-1 | MA-2/MB-6/MC-5/MC-3 = 40/30/20/10 | 6,500 | 1.6 | 22% |
| P-2 | MA-2/MB-3/MC-2/MC-3 = 40/20/20/20 | 5,000 | 1.5 | 18% |
| P-3 | MA-2/MB-3/MC-5/MC-3 = 40/20/20/20 | 5,500 | 1.4 | 25% |
| P-4 | MA-2/MB-4/MC-2 = 40/40/20 | 5,000 | 1.5 | 18% |
| P-5 | MA-10/MB-6/MC-3 = 40/30/30 | 5,300 | 1.5 | 13% |
| P-6 | MA-3/MB-4/MC-2 = 50/30/20 | 6,000 | 1.6 | 21% |
| P-7 | MA-5/MB-4/MC-5 = 40/40/20 | 5,500 | 1.4 | 7% |
| P-8 | MA-4/MB-6/MC-5 = 35/45/20 | 6,000 | 1.6 | 23% |
| P-9 | MA-6/MB-1/MC-2 = 30/50/20 | 7,000 | 1.5 | 12% |
| P-10 | MA-7/MB-5/MC-5 = 50/40/10 | 28,500 | 1.4 | 42% |
| P-11 | MA-8/MB-2/MC-5 = 30/40/30 | 5,500 | 1.5 | 31% |
| P-12 | MA-9/MB-6/MC-5 = 50/40/10 | 5,800 | 1.7 | 4% |
| P-13 | MA-9/MB-4/MC-5 = 40/40/20 | 6,000 | 1.5 | 7% |
| P-14 | MA-10/MB-6/MC-1 = 50/40/10 | 5,000 | 1.6 | 16% |
| P-15 | MA-10/MB-4/MC-5 = 30/50/20 | 5,500 | 1.6 | 17% |
| P-16 | MA-1/MB-7/MC-2 = 40/50/10 | 6,000 | 1.7 | 15% |
| P-17 | MA-3/MB-8/MC-2 = 40/50/10 | 5,000 | 1.6 | 42% |
| P-18 | MA-2/MB-6/MC-5/MC-4 = 40/30/20/10 | 6,500 | 1.6 | 25% |
| P-19 | MA-2/MB-6/MC-5 = 40/40/20 | 6,000 | 1.6 | 25% |
| P-20 | MA-2/MB-6/MC-5 = 40/40/20 | 4,000 | 1.6 | 25% |
| P-21 | MA-1/MB-6/MC-2 = 40/40/20 | 5,500 | 1.7 | 0 |
| P-22 | MA-2/MB-3 = 60/40 | 5,500 | 1.6 | 27% |
| P-23 | MA-1/MB-3 = 55/45 | 5,300 | 1.6 | 0 |
| P-24 | MA-2/MB-3/MC-2 = 15/10/75 | 6,500 | 1.7 | 7% |
| P-25 | MA-2/MB-6/MC-5 = 45/52/3 | 5,000 | 1.8 | 22% |
| P-26 | MA-9/MB-1/MC-4 = 40/30/30 | 6,000 | 1.6 | — |
| P-27 | MA-2/MA-9/MB-6/MC-2 = 30/10/40/20 | 6,500 | 1.7 | — |
| P-28 | MA-2/MB-6/MC-5 = 40/40/20 | 3,000 | 1.6 | 25% |
| P-29 | MA-7/MB-5/MC-5 = 50/40/10 | 21,000 | 1.4 | 42% |
| P-30 | MA-2/MB-6/MC-5 = 35/30/35 | 5,700 | 1.6 | 28% |
| P-31 | MA-11/MB-4/MC-5 = 40/40/20 | 5,300 | 1.5 | 7% |
| P-32 | MA-12/MB-6/MC-5 = 50/40/10 | 5,800 | 1.7 | 10% |
| P-33 | MA-13/MB-6/MC-5 = 50/40/10 | 6,000 | 1.8 | 18% |
| P-34 | MA-14/MB-6/MC-5 = 50/40/10 | 5,500 | 1.6 | 24% |
| P-35 | MA-15/MB-6/MC-5 = 50/40/10 | 6,000 | 1.7 | 24% |
| P-36 | MA-2/MB-9/MC-3 = 40/40/20 | 5,700 | 1.7 | 18% |
| P-37 | MA-2/MB-10/MC-3 = 40/40/20 | 5,500 | 1.7 | 18% |
| P-38 | MA-16/MB-6/MC-5 = 50/40/10 | 6,000 | 1.8 | 4% |
| P-39 | MA-17/MB-6/MC-5 = 50/40/10 | 5,400 | 1.7 | 4% |
| P-40 | MA-9/MB-11/MC-5 = 50/40/10 | 5,500 | 1.7 | 4% |
| P-41 | MA-18/MB-6/MC-5 = 50/40/10 | 6,200 | 1.8 | 4% |
| P-42 | MA-19/MB-6/MC-5 = 50/40/10 | 6,100 | 1.9 | 4% |

[Photoacid Generator]
The structures of the photoacid generators shown in Table 2 are shown below. In addition, the cationic moieties and the anionic moieties of the photoacid generators are each individually shown below.
(Cationic Moiety of Photoacid Generator)
PC-1
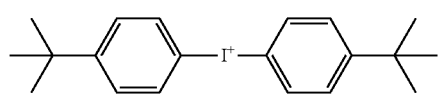
PC-2
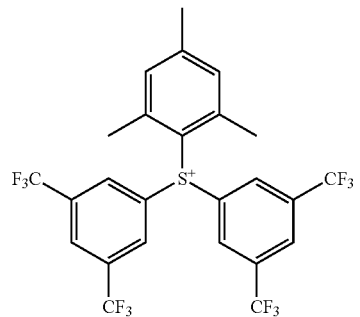
PC-3
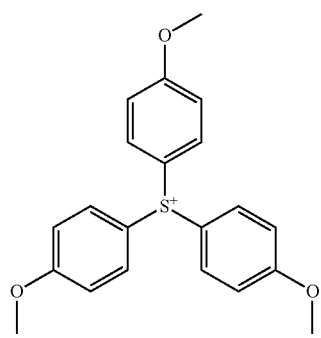
PC-4
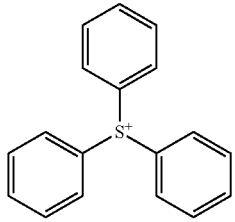
PC-5
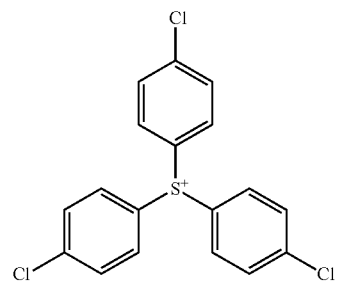
PC-6
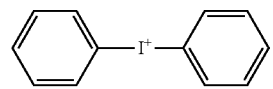
PC-7
PC-8
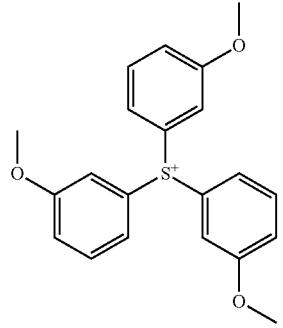
(Anionic Moiety of Photoacid Generator)
PA-1
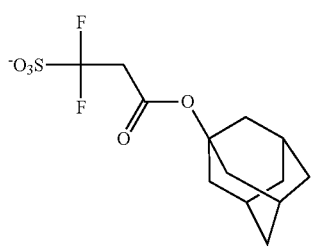
PA-2
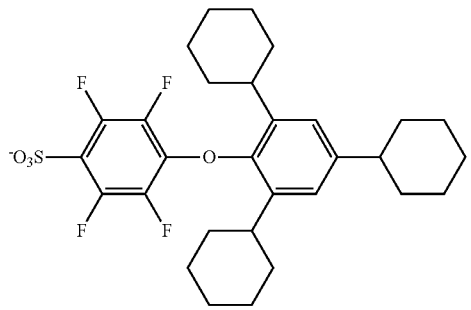
PA-3
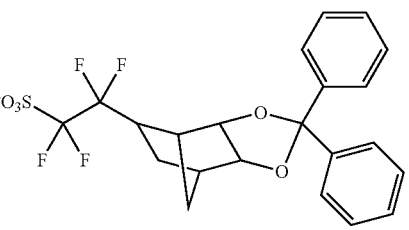
PA-4
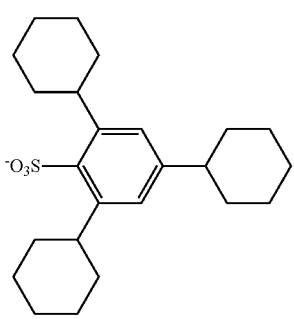

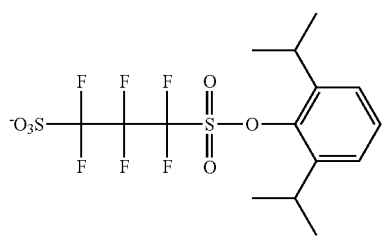

PA-5

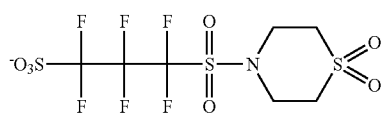

PA-6

[Acid Diffusion Control Agent]

The structures of the acid diffusion control agents shown in Table 2 are shown below.

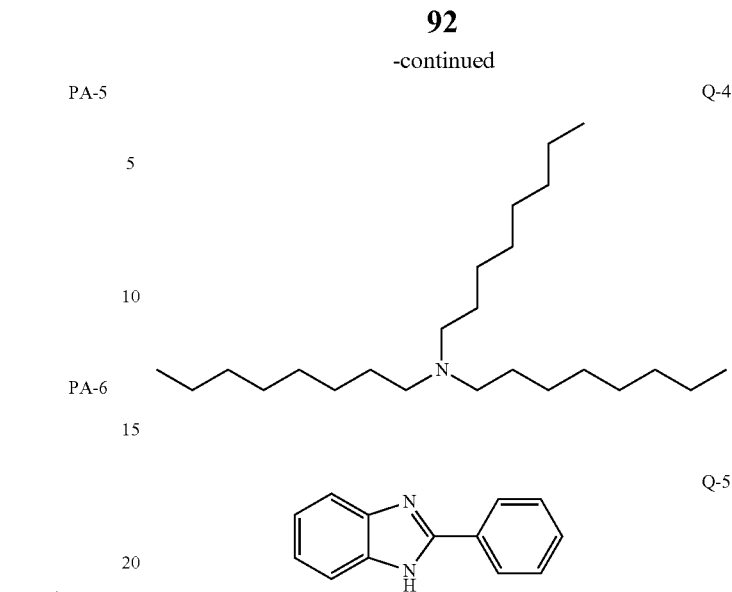

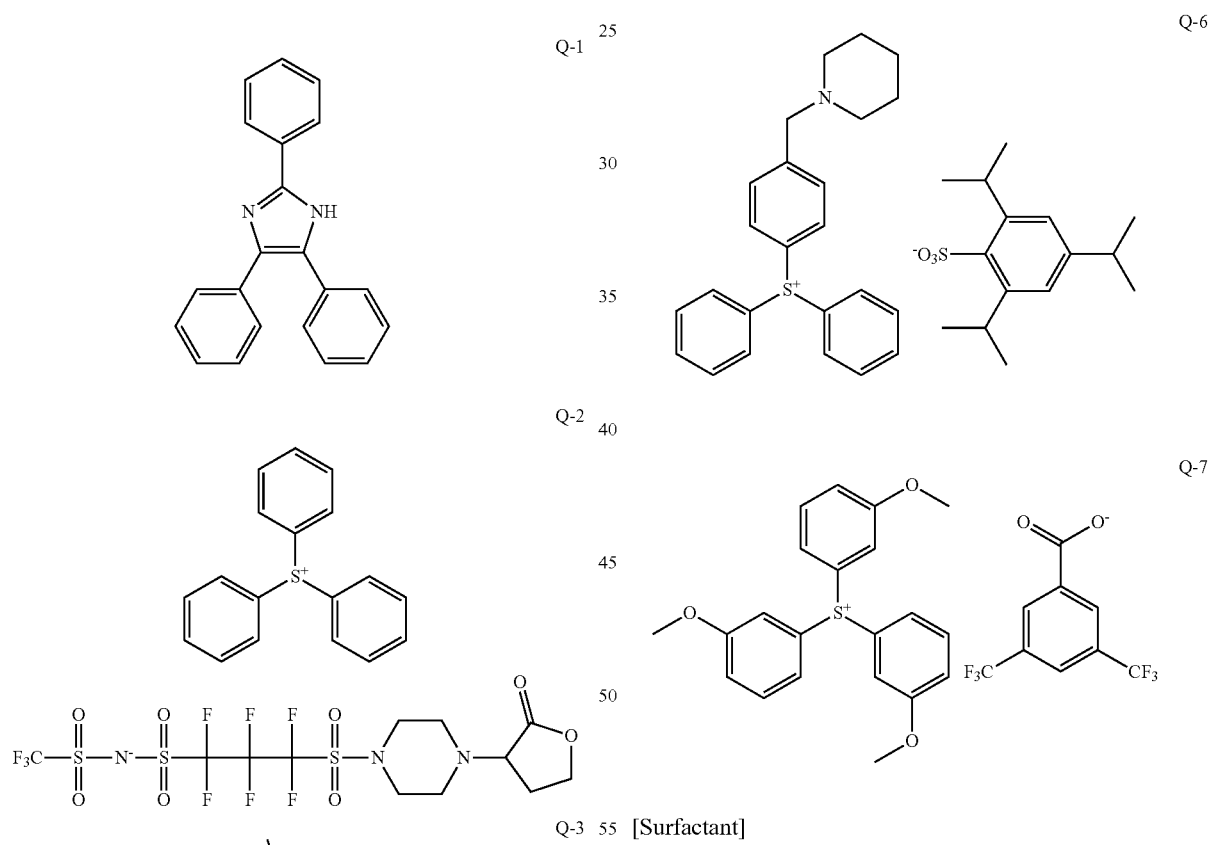

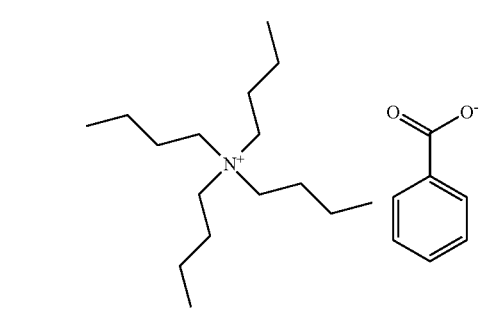

[Surfactant]

The surfactants shown in Table 2 are shown below.

W-1: MEGAFACE F176 (manufactured by DIC Corporation; fluorine-based)

W-2: MEGAFACE R08 (manufactured by DIC Corporation; fluorine- and silicon-based)

[Added Polymer]

The structures of the added polymers shown in Table 2 are shown below. In addition, the numerical values in the following formulae represent % by mole of the respective repeating units.

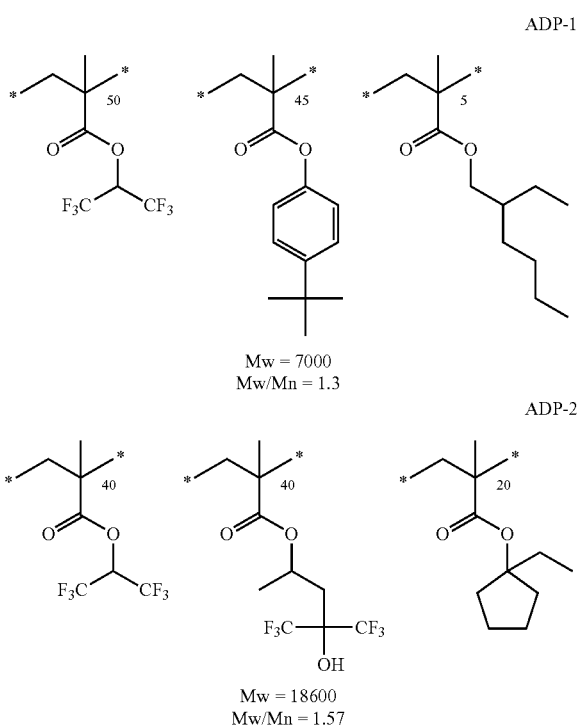

[Solvent]

The solvents shown in Table 2 are shown below.

SL-1: Propylene glycol monomethyl ether acetate (PGMEA)

SL-2: Propylene glycol monomethyl ether (PGME)

SL-3: Ethyl lactate

SL-4: γ-Butyrolactone

[Preparation of Resist Composition]

<Preparation of Actinic Ray-Sensitive or Radiation-Sensitive Resin Composition>

The components shown in Table 2 were mixed to reach the concentration of the solid content and the composition shown in Table 2. Then, the obtained mixed liquid was filtered through a polyethylene filter having a pore size of 0.03 μm to prepare an actinic ray-sensitive or radiation-sensitive resin composition (hereinafter also referred to as a "resist composition"). In addition, in the resist composition, the solid content means all the components excluding the solvent. The obtained resist composition was used in Examples and Comparative Examples.

Moreover, the contents (mass %) o the respective components described in the following columns of "Resin", "Photoacid generator", "Acid diffusion control agent", "Surfactant", and "Added polymer" represent the ratios of the respective components with respect to the total solid content.

TABLE 2

| Resist composition | Resin Type | Resin Content (% by mass) | Photoacid generator Cationic moiety | Photoacid generator Anionic moiety | Photoacid generator Content (% by mass) | Acid diffusion control agent Type | Acid diffusion control agent Content (% by mass) | Surfactant (content: % by mass) | Added polymer (content: % by mass) | Solvent (mass ratio) | Concentration of solid content (% by mass) |
|---|---|---|---|---|---|---|---|---|---|---|---|
| R1 | P-1 | 79.2 | PC-1 | PA-1 | 20.0 | Q-1 | 0.8 | — | — | SL-1/SL-2 = 80/20 | 1.5 |
| R2 | P-2 | 79.2 | PC-1 | PA-1 | 20.0 | Q-1 | 0.8 | — | — | SL-1/SL-2 = 80/20 | 1.6 |
| R3 | P-3 | 79.2 | PC-1 | PA-1 | 20.0 | Q-1 | 0.8 | — | — | SL-1/SL-2 = 80/20 | 1.3 |
| R4 | p-4 | 79.2 | PC-1 | PA-1 | 20.0 | Q-1 | 0.8 | — | — | SL-1/SL-2 = 80/20 | 1.2 |
| R5 | P-5 | 79.2 | PC-1 | PA-1 | 20.0 | Q-1 | 0.8 | — | — | SL-1/SL-2 = 80/20 | 1.4 |
| R6 | P-6 | 79.2 | PC-1 | PA-1 | 20.0 | Q-1 | 0.8 | — | — | SL-1/SL-2 = 80/20 | 1.4 |
| R7 | P-7 | 79.2 | PC-1 | PA-1 | 20.0 | Q-1 | 0.8 | — | — | SL-1/SL-2 = 80/20 | 1.5 |
| R8 | P-8 | 79.2 | PC-1 | PA-1 | 20.0 | Q-1 | 0.8 | — | — | SL-1/SL-2 = 80/20 | 1.7 |
| R9 | P-9 | 79.2 | PC-1 | PA-1 | 20.0 | Q-1 | 0.8 | — | — | SL-1/SL-2 = 80/20 | 2.1 |
| R10 | P-10 | 79.2 | PC-1 | PA-1 | 20.0 | Q-1 | 0.8 | — | — | SL-1/SL-2 = 80/20 | 1.5 |
| R11 | P-11 | 79.2 | PC-1 | PA-1 | 20.0 | Q-1 | 0.8 | — | — | SL-1/SL-2 = 80/20 | 1.5 |
| R12 | P-12 | 79.2 | PC-1 | PA-1 | 20.0 | Q-1 | 0.8 | — | — | SL-1/SL-2 = 80/20 | 1.6 |
| R13 | P-13 | 79.2 | PC-1 | PA-1 | 20.0 | Q-1 | 0.8 | — | — | SL-1/SL-2 = 80/20 | 1.9 |
| R14 | P-13 | 79.2 | PC-1 | PA-1 | 20.0 | Q-1 | 0.8 | — | — | SL-1/SL-2 = 80/20 | 1.5 |
| R15 | P-15 | 79.2 | PC-1 | PA-1 | 20.0 | Q-1 | 0.8 | — | — | SL-1/SL-2 = 80/20 | 1.6 |
| R16 | P-16 | 79.2 | PC-1 | PA-1 | 20.0 | Q-1 | 0.8 | — | — | SL-1/SL-2 = 80/20 | 1.7 |
| R17 | P-17 | 79.2 | PC-1 | PA-1 | 20.0 | Q-1 | 0.8 | — | — | SL-1/SL-2 = 80/20 | 1.5 |
| R18 | P-18 | 79.2 | PC-1 | PA-1 | 20.0 | Q-1 | 0.8 | — | — | SL-1/SL-2 = 80/20 | 1.5 |
| R19 | P-19 | 79.2 | PC-1 | PA-1 | 20.0 | Q-1 | 0.8 | — | — | SL-1/SL-2 = 80/20 | 1.6 |
| R20 | P-20 | 79.2 | PC-1 | PA-1 | 20.0 | Q-1 | 0.8 | — | — | SL-1/SL-2 = 80/20 | 1.4 |
| R21 | P-21 | 79.2 | PC-1 | PA-1 | 20.0 | Q-1 | 0.8 | — | — | SL-1/SL-2 = 80/20 | 1.8 |
| R22 | P-19 | 78.0 | PC-4 | PA-3 | 21.0 | Q-3 | 1.0 | — | — | SL-1/SL-2 = 80/20 | 1.7 |
| R23 | P-1 | 82.6 | PC-2 | PA-3 | 15.0 | Q-1 | 2.4 | — | — | SL-1/SL-4 = 90/10 | 1.6 |
| R24 | P-1 | 76.0 | PC-2 | PA-2 | 18.0 | Q-7 | 6.0 | — | — | SL-3/SL-4 = 95/5 | 2.0 |
| R25 | P-21 | 74.0 | PC-8 | PA-3 | 23.0 | Q-7 | 3.0 | — | — | SL-1/SL-2 = 80/20 | 1.8 |
| R26 | P-20 | 78.9 | PC-3 | PA-4 | 17.0 | Q-3 | 4.1 | — | — | SL-1/SL-2 = 70/30 | 1.7 |
| R27 | P-20 | 82.6 | PC-5 | PA-2 | 15.0 | Q-2 | 2.4 | — | — | SL-1/SL-2 = 80/20 | 1.5 |
| R28 | P-20 | 80.0 | PC-6 | PA-3 | 16.5 | Q-1 | 3.5 | — | — | SL-1/SL-2 = 80/20 | 1.6 |
| R29 | P-20 | 79.8 | PC-7 | PA-2 | 18.3 | Q-2 | 1.9 | — | — | SL-1/SL-2 = 80/20 | 2.5 |
| R30 | P-20 | 93.5 | PC-4 | PA-5 | 6.0 | Q-4 | 0.5 | — | — | SL-1/SL-3 = 80/20 | 2.1 |
| R31 | P-20 | 82.6 | PC-4 | PA-6 | 15.0 | Q-1 | 2.4 | — | — | SL-1/SL-2 = 80/20 | 1.7 |
| R32 | P-20 | 82.6 | PC-2 | PA-3 | 15.0 | Q-5 | 2.4 | — | — | SL-1/SL-2 = 80/20 | 1.9 |
| R33 | P-20 | 82.6 | PC-3 | PA-4 | 15.0 | Q-6 | 2.4 | — | — | SL-1/SL-2 = 80/20 | 1.8 |
| R34 | P-12 | 78.6 | PC-3 | PA-4 | 17.0 | Q-3 | 4.1 | W-1 (0.3) | — | SL-3 = 100 | 2.1 |

TABLE 2-continued

| Resist composition | Resin Type | Resin Content (% by mass) | Photoacid generator Cationic moiety | Photoacid generator Anionic moiety | Content (% by mass) | Acid diffusion control agent Type | Acid diffusion control agent Content (% by mass) | Surfactant (content: % by mass) | Added polymer (content: % by mass) | Solvent (mass ratio) | Concentration of solid content (% by mass) |
|---|---|---|---|---|---|---|---|---|---|---|---|
| R35 | P-12 | 78.4 | PC-3 | PA-4 | 17.0 | Q-3 | 4.1 | W-2 (0.5) | — | SL-1/SL-3 = 80/20 | 1.9 |
| R36 | P-4 | 74.7 | PC-2 | PA-2 | 22.0 | Q-2 | 2.0 | W-1 (0.3) | ADP-1 (1.0) | SL-1/SL-2 = 80/20 | 1.8 |
| R37 | P-26 | 79.2 | PC-1 | PA-1 | 19.0 | Q-1 | 0.8 | — | ADP-1 (1.0) | SL-1/SL-2 = 80/20 | 1.7 |
| R38 | P-27 | 74.7 | PC-1 | PA-1 | 22.0 | Q-2 | 2.0 | W-1 (0.3) | ADP-2 (1.0) | SL-1/SL-3 = 80/20 | 2.2 |
| R39 | P-22 | 79.2 | PC-1 | PA-1 | 20.0 | Q-1 | 0.8 | — | — | SL-1/SL-2 = 80/20 | 2.0 |
| R40 | P-23 | 79.2 | PC-1 | PA-1 | 20.0 | Q-1 | 0.8 | — | — | SL-1/SL-2 = 80/20 | 1.8 |
| R41 | P-24 | 79.2 | PC-1 | PA-1 | 20.0 | Q-1 | 0.8 | — | — | SL-1/SL-2 = 80/20 | 1.7 |
| R42 | P-25 | 76.0 | PC-2 | PA-2 | 18.0 | Q-2 | 6.0 | — | — | SL-1/SL-2 = 80/20 | 1.8 |
| R43 | P-23 | 74.7 | PC-2 | PA-2 | 22.0 | Q-2 | 2.0 | W-1 (0.3) | ADP-1 (1.0) | SL-1/SL-2 = 80/20 | 1.9 |
| R44 | P-28 | 78.9 | PC-3 | PA-4 | 17.0 | Q-3 | 4.1 | — | — | SL-1/SL-2 = 70/30 | 1.7 |
| R45 | P-29 | 79.2 | PC-1 | PA-1 | 20.0 | Q-1 | 0.8 | — | — | SL-1/SL-2 = 80/20 | 1.5 |
| R46 | P-30 | 79.2 | PC-1 | PA-1 | 20.0 | Q-1 | 0.8 | — | — | SL-1/SL-2 = 80/20 | 1.6 |
| R47 | P-31 | 79.2 | PC-8 | PA-4 | 20.0 | Q-7 | 0.8 | — | — | SL-1/SL-2 = 80/20 | 1.5 |
| R48 | P-32 | 79.2 | PC-8 | PA-4 | 20.0 | Q-7 | 0.8 | — | — | SL-1/SL-2 = 80/20 | 1.5 |
| R49 | P-33 | 79.2 | PC-4 | PA-4 | 20.0 | Q-7 | 0.8 | — | — | SL-1/SL-2 = 80/20 | 1.5 |
| R50 | P-34 | 79.2 | PC-3 | PA-4 | 20.0 | Q-7 | 0.8 | — | — | SL-1/SL-2 = 80/20 | 1.5 |
| R51 | P-35 | 79.2 | PC-8 | PA-4 | 20.0 | Q-7 | 0.8 | — | — | SL-1/SL-2 = 80/20 | 1.5 |
| R52 | P-36 | 79.2 | PC-3 | PA-3 | 20.0 | Q-7 | 0.8 | — | — | SL-1/SL-2 = 80/20 | 1.5 |
| R53 | P-37 | 79.2 | PC-8 | PA-3 | 20.0 | Q-7 | 0.8 | — | — | SL-1/SL-2 = 80/20 | 1.5 |
| R54 | P-38 | 79.2 | PC-8 | PA-4 | 20.0 | Q-7 | 0.8 | — | — | SL-1/SL-2 = 80/20 | 1.5 |
| R55 | P-39 | 79.2 | PC-8 | PA-4 | 20.0 | Q-7 | 0.8 | — | — | SL-1/SL-2 = 80/20 | 1.5 |
| R56 | P-40 | 79.2 | PC-8 | PA-4 | 20.0 | Q-7 | 0.8 | — | — | SL-1/SL-2 = 80/20 | 1.5 |
| R57 | P-41 | 79.2 | PC-8 | PA-2 | 20.0 | Q-7 | 0.8 | — | — | SL-1/SL-2 = 80/20 | 1.5 |
| R58 | P-42 | 79.2 | PC-8 | PA-2 | 20.0 | Q-7 | 0.8 | — | — | SL-1/SL-2 = 80/20 | 1.5 |

[Pattern Formation and Evaluation]

The developers and the rinsing liquids shown in Tables 3 and 4 are shown below.

<Developer and Rinsing Liquid>

D-1: A 3.00%-by-mass aqueous solution of tetramethylammonium hydroxide

D-2: A 2.38%-by-mass aqueous solution of tetramethylammonium hydroxide

D-3: A 1.50%-by-mass aqueous solution of tetramethylammonium hydroxide

D-4: A 1.00%-by-mass aqueous solution of tetramethylammonium hydroxide

D-5: A 0.80%-by-mass aqueous solution of tetramethylammonium hydroxide

D-6: Pure water

D-7: FIRM Extreme 10 (manufactured by AZEM)

E-1: Butyl acetate

E-2: 2-Heptanone

E-3: Diisobutyl ketone

E-4: Isoamyl acetate

E-5: Dibutyl ether

E-6: Undecane

Pattern Formation and Evaluation 1 (Examples 1 to 54 and Comparative Examples 1 to 4)

(EUV Exposure)

The composition described in Table 3 was applied onto a silicon wafer (12 inches), and the coating film was heated under the pre-exposure heating (PB) condition described in (Resist Coating Condition) to obtain a resist film having a film thickness described in Table 3, thereby obtaining a silicon wafer having the resist film.

The silicon wafer having the obtained resist film was subjected to pattern irradiation using an EUV exposure apparatus (manufactured by Exitech Ltd., Micro Exposure Tool, NA 0.3, Quadrupole, outer sigma: 0.68, and inner sigma: 0.36). Further, a mask with a line size=20 nm and a line:space=1:1 was used as a reticle.

Thereafter, the silicon wafer was post-exposure baked (PEB) under the condition shown in Table 3, then puddle-developed for 30 seconds with the developer shown in Table 3, and puddle-rinsed with the rinsing liquid shown in Table 3, and then the silicon wafer was rotated at a rotation speed of 4,000 rpm for 30 seconds and further baked at 90° C. for 60 seconds to obtain a line-and-space pattern with a pitch of 40 nm and a line width of 20 nm (space width of 20 nm).

(Various Evaluations)

Evaluations shown below were performed on the formed resist pattern. The results are summarized in Table 3.

<<Sensitivity>>

While changing an exposure dose, the line width of the line-and-space pattern was measured, and an exposure dose at which the line width reached 20 nm was determined and defined as a sensitivity (mJ/cm$^2$). A smaller value thereof indicates that the resist exhibits a higher sensitivity and has better performance.

<<LER>>

While the line-and-space resist pattern resolved at the optimal exposure dose in the evaluation of the sensitivity was observed from a top of the pattern with a critical dimension scanning electron microscope (SEM (CG-4100 manufactured by Hitachi High Technologies Corporation)), a distance from the center of the pattern to an edge was measured at any points and a measurement deviation thereof was evaluated as 3σ. A smaller value thereof indicates better performance.

<<Collapse Suppressing Ability (Pattern Collapse Suppressing Ability)>>

The line width of the line-and-space pattern was measured while changing the exposure dose. At this time, a minimum line width in which the pattern was resolved without a collapse over 10 μm square was defined as a collapse line width. A smaller value thereof indicates that a margin of pattern collapse is wider and the performance is better.

Moreover, in Table 3, the resist pattern formed from the resist composition of Comparative Example 3 was deteriorated in the resolution, and the LER evaluation and the collapse suppression evaluation could not be performed.

As shown in Table 3 above, it was confirmed that in a case where the compositions of Examples are used, a pattern thus formed has excellent LER and collapse suppressing performance in the evaluation of EUV exposure.

TABLE 3

| | Resist coating condition | | | | | | Evaluation results | | |
|---|---|---|---|---|---|---|---|---|---|
| | Composition | Film thickness (nm) | PB | PEB PEB | Developer Type | Rinsing liquid Type | Sensitivity (mJ/cm$^2$) | LER (nm) | Collapse suppressing ability (nm) |
| Example 1 | R1 | 30 | 100° C./60 sec | 120° C./60 sec | D-2 | D-6 | 27.4 | 3.0 | 16 |
| Example 2 | R2 | 35 | 100° C./60 sec | 120° C./60 sec | D-2 | D-6 | 34 | 3.1 | 17 |
| Example 3 | R3 | 25 | 100° C./60 sec | 120° C./60 sec | D-1 | D-6 | 29.8 | 2.8 | 15 |
| Example 4 | R4 | 30 | 100° C./60 sec | 120° C./60 sec | D-2 | D-7 | 33.5 | 2.8 | 16 |
| Example 5 | R5 | 35 | 100° C./60 sec | 120° C./60 sec | D-4 | D-6 | 37.4 | 2.9 | 16 |
| Example 6 | R6 | 30 | 100° C./60 sec | 120° C./60 sec | D-2 | D-6 | 32.5 | 3.0 | 16 |
| Example 7 | R7 | 35 | 100° C./60 sec | 120° C./60 sec | D-3 | D-7 | 40.4 | 3.2 | 17 |
| Example 8 | R8 | 30 | 100° C./60 sec | 120° C./60 sec | D-1 | D-6 | 29.1 | 3.2 | 18 |
| Example 9 | R9 | 35 | 100° C./60 sec | 120° C./60 sec | D-2 | D-6 | 35.1 | 2.8 | 15 |
| Example 10 | R10 | 35 | 100° C./60 sec | 120° C./60 sec | D-2 | D-6 | 25.3 | 3.4 | 16 |
| Example 11 | R11 | 30 | 100° C./60 sec | 120° C./60 sec | D-2 | D-6 | 26.2 | 2.9 | 16 |
| Example 12 | R12 | 35 | 100° C./60 sec | 120° C./60 sec | D-3 | D-6 | 40.2 | 2.9 | 15 |
| Example 13 | R13 | 30 | 100° C./60 sec | 120° C./60 sec | D-2 | D-7 | 39.3 | 2.8 | 15 |
| Example 14 | R14 | 30 | 100° C./60 sec | 120° C./60 sec | D-5 | D-6 | 34.2 | 3.0 | 17 |
| Example 15 | R15 | 30 | 100° C./60 sec | 120° C./60 sec | D-2 | D-6 | 34.5 | 3.3 | 20 |
| Example 16 | R16 | 35 | 100° C./60 sec | 120° C./60 sec | D-2 | D-6 | 37.1 | 3.0 | 18 |
| Example 17 | R17 | 30 | 100° C./60 sec | 120° C./60 sec | D-2 | D-6 | 30.4 | 3.1 | 18 |
| Example 18 | R18 | 35 | 120° C./60 sec | 120° C./60 sec | D-2 | D-6 | 32.1 | 2.8 | 14 |
| Example 19 | R19 | 30 | 120° C./60 sec | 105° C./SO sec | D-2 | D-6 | 32.5 | 2.9 | 15 |
| Example 20 | R20 | 30 | 100° C./60 sec | 105° C./50 sec | D-2 | D-6 | 31.7 | 2.9 | 17 |
| Example 21 | R21 | 35 | 100° C./60 sec | 105° C./50 sec | D-2 | D-6 | 47.5 | 3.0 | 17 |
| Example 22 | R22 | 35 | 100° C./60 sec | 120° C./60 sec | D-2 | D-6 | 27.7 | 2.9 | 17 |
| Example 23 | R23 | 35 | 100° C./60 sec | 120° C./60 sec | D-2 | D-7 | 28.2 | 3.1 | 18 |
| Example 24 | R24 | 35 | 100° C./60 sec | 120° C./60 sec | D-2 | D-6 | 29.0 | 3.0 | 17 |
| Example 25 | R25 | 35 | 100° C./60 sec | 120° C./60 sec | D-2 | D-6 | 48.1 | 3.3 | 21 |
| Example 26 | R26 | 35 | 100° C./60 sec | 120° C./60 sec | D-2 | D-6 | 30 | 3.0 | 20 |
| Example 27 | R27 | 35 | 100° C./60 sec | 120° C./60 sec | D-2 | D-6 | 26.2 | 3.1 | 19 |
| Example 28 | R28 | 35 | 100° C./60 sec | 120° C./60 sec | D-2 | D-6 | 25.4 | 3.0 | 18 |
| Example 29 | R29 | 35 | 100° C./60 sec | 120° C./60 sec | D-2 | D-6 | 27.2 | 3.1 | 19 |
| Example 30 | R30 | 35 | 100° C./60 sec | 120° C./60 sec | D-2 | D-6 | 26.5 | 3.3 | 21 |
| Example 31 | R31 | 35 | 100° C./60 sec | 120° C./60 sec | D-2 | D-7 | 27.6 | 3.1 | 18 |
| Example 32 | R32 | 35 | 100° C./60 sec | 120° C./60 sec | D-2 | D-6 | 29.2 | 2.8 | 16 |
| Example 33 | R33 | 35 | 100° C./60 sec | 120° C./60 sec | D-2 | D-6 | 28.9 | 2.9 | 17 |
| Example 34 | R34 | 35 | 100° C./60 sec | 120° C./60 sec | D-2 | D-6 | 39.3 | 2.9 | 18 |
| Example 35 | R35 | 35 | 100° C./60 sec | 120° C./60 sec | D-2 | D-6 | 38.7 | 3.2 | 19 |
| Example 36 | R44 | 35 | 100° C./60 sec | 120° C./60 sec | D-2 | D-6 | 30 | 3.0 | 23 |
| Example 37 | R45 | 35 | 100° C./60 sec | 120° C./60 sec | D-2 | D-6 | 25.3 | 3.1 | 16 |
| Example 38 | R46 | 30 | 120° C./60 sec | 105° C./60 sec | D-2 | D-6 | 32.8 | 3.2 | 15 |
| Example 39 | R47 | 35 | 100° C./60 sec | 120° C./60 sec | D-2 | D-6 | 39.6 | 3.1 | 19 |
| Example 40 | R48 | 30 | 100° C./60 sec | 120° C./60 sec | D-1 | D-6 | 37.1 | 2.8 | 15 |
| Example 41 | R49 | 30 | 100° C./60 sec | 120° C./60 sec | D-2 | D-6 | 35.2 | 2.9 | 16 |
| Example 42 | R50 | 30 | 100° C./60 sec | 120° C./60 sec | D-4 | D-6 | 29.2 | 2.9 | 16 |
| Example 43 | R51 | 30 | 100° C./60 sec | 120° C./60 sec | D-2 | D-6 | 28.7 | 2.9 | IS |
| Example 44 | R52 | 35 | 100° C./60 sec | 120° C./60 sec | D-3 | D-7 | 35.8 | 3.0 | 17 |
| Example 45 | R53 | 30 | 100° C./60 sec | 120° C./60 sec | D-1 | D-6 | 29.1 | 3.2 | 18 |
| Example 46 | R54 | 30 | 100° C./60 sec | 120° C./60 sec | D-1 | D-6 | 39.8 | 3.1 | 17 |
| Example 47 | R55 | 30 | 100° C./60 sec | 120° C./60 sec | D-1 | D-6 | 40.3 | 3.0 | 18 |
| Example 48 | R56 | 30 | 100° C./60 sec | 120° C./SO sec | D-1 | D-6 | 39.4 | 3.2 | 18 |
| Example 49 | R12 | 35 | 100° C./60 sec | 120° C./60 sec | E-1 | E-5 | 39.2 | 2.9 | 19 |
| Example 50 | R12 | 35 | 100° C./60 sec | 120° C./60 sec | E-2 | — | 39.7 | 3.0 | 20 |
| Example 51 | R12 | 35 | 100° C./60 sec | 120° C./60 sec | E-3 | — | 40.0 | 3.0 | 18 |
| Example 52 | R12 | 35 | 100° C./60 sec | 120° C./60 sec | E-4 | E-6 | 39.3 | 2.9 | 18 |
| Example 53 | R57 | 30 | 100° C./60 sec | 120° C./60 sec | D-1 | D-6 | 40.0 | 3.3 | 20 |
| Example 54 | R58 | 30 | 100° C./60 sec | 120° C./60 sec | D-1 | D-6 | 40.5 | 3.2 | 20 |
| Comparative Example 1 | R39 | 30 | 100° C./60 sec | 120° C./60 sec | D-2 | D-6 | 29.8 | 3.5 | 26 |
| Comparative Example 2 | R40 | 30 | 100° C./60 sec | 120° C./60 sec | D-2 | D-6 | 48.1 | 3.6 | 29 |
| Comparative Example 3 | R41 | 35 | 100° C./60 sec | 120° C./60 sec | D-2 | D-6 | Not analyzed | — | — |
| Comparative Example 4 | R42 | 35 | 100° C./60 sec | 120° C./60 sec | D-2 | D-6 | 28.7 | 3.6 | 28 |

Furthermore, from the comparison of Examples 21 and 25 vs. other Examples, it was confirmed that in a case where the resin includes a fluorine atom or an iodine atom, the sensitivity is excellent.

Moreover, from the comparison of Example 2 vs. Example 3, it was confirmed that in a case where the repeating unit represented by General Formula (B-1) includes a fluorine atom or an iodine atom, the sensitivity of a resist film thus formed is more excellent, and the LER and the collapse suppressing performance of a pattern thus formed are more excellent.

In addition, from the comparison of Example 10 vs. Example 37, it was confirmed that in a case where the weight-average molecular weight of the resin is 25,000 or less, the LER of a pattern thus formed is more excellent.

Furthermore, from the comparison of Example 20 vs. Example 36, it was confirmed that in a case where the weight-average molecular weight of the resin is 3,500 or more, the collapse suppressing performance of a pattern thus formed is more excellent.

factured by ASML, XT1700i, NA 1.20, Dipole, outer sigma 0.900, inner sigma 0.700, Y deflection). Further, a 6% halftone mask with a line size=50 nm and a line:space=1:1 was used as a reticle. In addition, ultrapure water was used as an immersion liquid.

Thereafter, the silicon wafer was post-exposure baked (PEB) under the condition shown in Table 4, then puddle-developed for 30 seconds with the developer shown in Table 4, and puddle-rinsed with the rinsing liquid shown in Table 4, and then the silicon wafer was rotated at a rotation speed of 4,000 rpm for 30 seconds and further baked at 90° C. for 60 seconds to obtain a line-and-space pattern with a pitch of 100 nm and a space width of 50 nm (line width of 50 nm).

(Various Evaluations)

Various evaluations of the LER and the collapse suppressing performance were performed on the resist patterns thus formed by the methods described above. The results are summarized in Table 4.

TABLE 4

| | Resist coating condition | | | | | | Evaluation results | |
|---|---|---|---|---|---|---|---|---|
| | Composition | Film thickness (nm) | PB | PEB PEB | Developer Type | Rinsing liquid Type | LER (nm) | Collapse suppressing ability (nm) |
| Example 55 | R36 | 90 | 120° C./60 sec | 105° C./60 sec | D-1 | D-6 | 3.2 | 63 |
| Example 56 | R37 | 90 | 120° C./60 sec | 120° C./60 sec | D-1 | D-6 | 3.3 | 65 |
| Example 57 | R38 | 90 | 120° C./60 sec | 120° C./60 sec | D-1 | D-6 | 3.3 | 65 |
| Example 58 | R37 | 90 | 120° C./60 sec | 120° C./60 sec | E-1 | E-6 | 3.1 | 62 |
| Comparative Example 5 | R43 | 90 | 120° C./60 sec | 120° C./60 sec | D-1 | D-6 | 3.8 | 70 |

Moreover, from the comparison of Example 19 vs. Example 38, it was confirmed that in a case where the resin is in the above-mentioned Aspect (W2) and the content of the repeating unit represented by General Formula (B-1) is 30% by mass or less with respect to all the repeating units in the resin, the LER of a pattern thus formed is more excellent.

As shown in Examples 1 to 48, 53, and 54, it was confirmed that in a case where the compositions of Examples are used, a pattern thus formed has excellent LER and collapse suppressing performance in a positive tone pattern forming method. In addition, the same effects could also be obtained in the negative tone pattern forming methods as shown in Examples 49 to 52.

<Pattern Formation and Evaluation 2 (Examples 55 to 58 and Comparative Example 5)>

(ArF Liquid Immersion Exposure)

A composition for forming an organic antireflection film ARC29SR (manufactured by Nissan Chemical Industries, Ltd.) was applied onto a silicon wafer and the coating film was baked at 205° C. for 60 seconds. As a result, an antireflection film having a film thickness of 90 nm was formed on the silicon wafer.

The composition described in Table 4 was applied onto the formed antireflection film, and the coating film was heated under the pre-exposure heating (PB) condition described in (Resist coating condition) to form a resist film having a film thickness described in Table 4, thereby forming a silicon wafer having a laminated film.

The obtained resist film was subjected to pattern exposure using an ArF excimer laser liquid immersion scanner (manu- As shown in Table 4 above, it was confirmed that in a case where the compositions of Examples are used, the patterns thus formed have excellent LER and collapse suppressing performance in the ArF exposure evaluation.

As shown in Examples 55 to 57, it was confirmed that in a case where the compositions of Examples are used, a pattern formed by a positive tone pattern forming method has excellent LER and collapse suppressing performance. In addition, as shown in Example 58, the same effects could be obtained as well by a negative tone pattern forming method.

What is claimed is:

1. An actinic ray-sensitive or radiation-sensitive resin composition comprising:

a compound that generates an acid upon irradiation with actinic rays or radiation; and a resin whose polarity increases by the action of an acid, wherein the resin includes a repeating unit represented by General Formula (B-1), a content of the repeating unit represented by General Formula (B-1) is 5% to 70% by mass with respect to all the repeating units in the resin, the repeating unit represented by General Formula (B-1) includes a repeating unit represented by General Formula (B-4), and a content of a halogen atom selected from a fluorine atom or an iodine atom in the resin is 20% by mass or more,

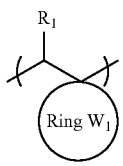
(B-1)

in General Formula (B-1), R$_1$ represents a hydrogen atom or an organic group, the Ring W1 represents a ring which includes at least one carbon atom and one nitrogen atom, and may have a substituent,

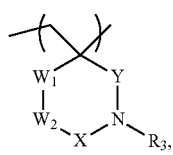
(B-4)

in General Formula (B-4), X and Y each independently represent a divalent linking group selected from the group consisting of —CO—, —SO—, and —SO$_2$, R$_3$ represents a hydrogen atom or an organic group, W$_1$ and W$_2$ each independently represent —C(R$_7$)(R$_{10}$)— or a group represented by General Formula (B-5), and R$_7$, R$_8$, R$_9$, and R$_{10}$ each independently represent a hydrogen atom or a substituent

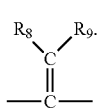
(B-5)

2. The actinic ray-sensitive or radiation-sensitive resin composition according to claim 1,
wherein the resin does not substantially include a repeating unit including a lactone structure but includes a repeating unit having an acid-decomposable group and the repeating unit represented by General Formula (B-1), and
the content of the repeating unit represented by General Formula (B-1) is 30% by mass or less with respect to all the repeating units in the resin.

3. The actinic ray-sensitive or radiation-sensitive resin composition according to claim 2,
wherein the resin has a weight-average molecular weight of 3,500 to 25,000.

4. A resist film formed from the actinic ray-sensitive or radiation-sensitive resin composition according to claim 2.

5. A pattern forming method comprising:
a resist film forming step of forming a resist film using the actinic ray-sensitive or radiation-sensitive resin composition according to claim 2;
an exposing step of exposing the resist film; and
a developing step of developing the exposed resist film using a developer.

6. The actinic ray-sensitive or radiation-sensitive resin composition according to claim 1,
wherein the resin has a weight-average molecular weight of 3,500 to 25,000.

7. A resist film formed from the actinic ray-sensitive or radiation-sensitive resin composition according to claim 1.

8. A pattern forming method comprising:
a resist film forming step of forming a resist film using the actinic ray-sensitive or radiation-sensitive resin composition according to claim 1;
an exposing step of exposing the resist film; and
a developing step of developing the exposed resist film using a developer.

9. A method for manufacturing an electronic device, comprising the pattern forming method according to claim 8.

10. A resin whose polarity increases by the action of an acid,
wherein the resin includes a repeating unit represented by General Formula (B-1) and a repeating unit having an acid-decomposable group and being different from the repeating unit represented by General Formula (B-1),
a content of the repeating unit represented by General Formula (B-1) is 5% to 70% by mass with respect to all the repeating units in the resin,
the repeating unit represented by General Formula (B-1) includes a repeating unit represented by General Formula (B-4), and
a content of a halogen atom selected from a fluorine atom or an iodine atom in the resin is 20% by mass or more,

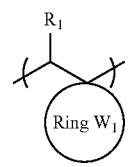
(B-1)

in General Formula (B-1), R$_1$ represents a hydrogen atom or an organic group, the Ring W1 represents a ring which includes at least one carbon atom and one nitrogen atom, and may have a substituent,

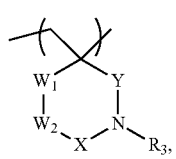
(B-4)

in General Formula (B-4), X and Y each independently represent a divalent linking group selected from the group consisting of —CO—, —SO—, and —SO$_2$, R$_3$ represents a hydrogen atom or an organic group, W$_1$ and W$_2$ each independently represent —C(R$_7$)(R$_{10}$)— or a group represented by General Formula (B-5), and R$_7$, R$_8$, R$_9$, and R$_{10}$ each independently represent a hydrogen atom or a substituent

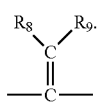
(B-5)

11. The resin according to claim 10,
wherein the resin does not substantially include a repeating unit including a lactone structure but includes a repeating unit having the acid-decomposable group and the repeating unit represented by General Formula (B-1), and the content of the repeating unit represented by General Formula (B-1) is 30% by mass or less with respect to all the repeating units in the resin.

12. The resin according to claim 10,
wherein the resin has a weight-average molecular weight of 3,500 to 25,000.

\* \* \* \* \*